(12) United States Patent
Masunaga et al.

(10) Patent No.: US 9,740,098 B2
(45) Date of Patent: Aug. 22, 2017

(54) CHEMICALLY AMPLIFIED NEGATIVE RESIST COMPOSITION USING NOVEL ONIUM SALT AND RESIST PATTERN FORMING PROCESS

(71) Applicant: Shin-Etsu Chemical Co., Ltd., Tokyo (JP)

(72) Inventors: Keiichi Masunaga, Joetsu (JP); Satoshi Watanabe, Joetsu (JP); Masaaki Kotake, Joetsu (JP); Daisuke Domon, Joetsu (JP); Takayuki Fujiwara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/094,348

(22) Filed: Apr. 8, 2016

(65) Prior Publication Data

US 2016/0299428 A1    Oct. 13, 2016

(30) Foreign Application Priority Data

Apr. 13, 2015  (JP) ................ 2015-081879

(51) Int. Cl.
| | | |
|---|---|---|
| *G03F 7/038* | (2006.01) | |
| *G03F 7/004* | (2006.01) | |
| *G03F 7/09* | (2006.01) | |
| *G03F 7/30* | (2006.01) | |
| *G03F 7/32* | (2006.01) | |
| *G03F 7/20* | (2006.01) | |
| *G03F 1/20* | (2012.01) | |
| *G03F 1/22* | (2012.01) | |

(52) U.S. Cl.
CPC .............. *G03F 7/0045* (2013.01); *G03F 1/20* (2013.01); *G03F 1/22* (2013.01); *G03F 7/0046* (2013.01); *G03F 7/0382* (2013.01); *G03F 7/09* (2013.01); *G03F 7/2059* (2013.01); *G03F 7/30* (2013.01); *G03F 7/322* (2013.01)

(58) Field of Classification Search
None
See application file for complete search history.

(56) References Cited

U.S. PATENT DOCUMENTS

| | | |
|---|---|---|
| 6,479,210 B2 | 11/2002 | Kinoshita et al. |
| 6,485,883 B2 | 11/2002 | Kodama et al. |
| 6,492,091 B2 | 12/2002 | Kodama et al. |
| 7,214,467 B2 | 5/2007 | Kanna et al. |
| 7,923,199 B2 | 4/2011 | Wada |
| 8,846,291 B2 | 9/2014 | Utsumi et al. |
| 2006/0166133 A1 | 7/2006 | Koitabashi et al. |
| 2008/0241751 A1 | 10/2008 | Takeda et al. |
| 2010/0136477 A1 | 6/2010 | Ng et al. |
| 2011/0212390 A1 | 9/2011 | Masunaga et al. |
| 2016/0131972 A1* | 5/2016 | Fukushima ........... G03F 7/0045 430/270.1 |
| 2016/0259242 A1* | 9/2016 | Ohashi ............... G03F 7/0045 |
| 2016/0299431 A1* | 10/2016 | Adachi ................ G03F 7/0382 |

FOREIGN PATENT DOCUMENTS

| | | |
|---|---|---|
| EP | 1 684 118 A1 | 7/2006 |
| EP | 1 975 711 A1 | 10/2008 |
| EP | 2 626 743 A1 | 8/2013 |
| JP | 11-327143 A | 11/1999 |
| JP | 2006-201532 A | 8/2006 |
| JP | 2006-208781 A | 8/2006 |
| JP | 2006-215180 A | 8/2006 |
| JP | 3955384 B2 | 8/2007 |
| JP | 4116340 B2 | 7/2008 |
| JP | 2008-249762 A | 10/2008 |
| JP | 4226803 B2 | 2/2009 |
| JP | 4231622 B2 | 3/2009 |
| JP | 2012-123189 A | 6/2012 |
| TW | 201142503 A | 12/2011 |
| TW | 201405249 A | 2/2014 |

OTHER PUBLICATIONS

Office Action dated Nov. 22, 2016, issued in counterpart Taiwanese application No. 105111281 4 pages.
Extended European Search Report dated Feb. 28, 2017, issued in counterpart European Patent Application No. 16163471.2. (8 Pages).

* cited by examiner

*Primary Examiner* — Sin Lee
(74) *Attorney, Agent, or Firm* — Westerman, Hattori, Daniels & Adrian, LLP

(57) ABSTRACT

A chemically amplified negative resist composition is defined as comprising (A) an onium salt having an anion moiety which is a nitrogen-containing carboxylate of fused ring structure, (B) a base resin, and (C) a crosslinker. The resist composition is effective for controlling acid diffusion during the exposure step, exhibits a very high resolution during pattern formation, and forms a pattern with minimal LER.

13 Claims, 1 Drawing Sheet

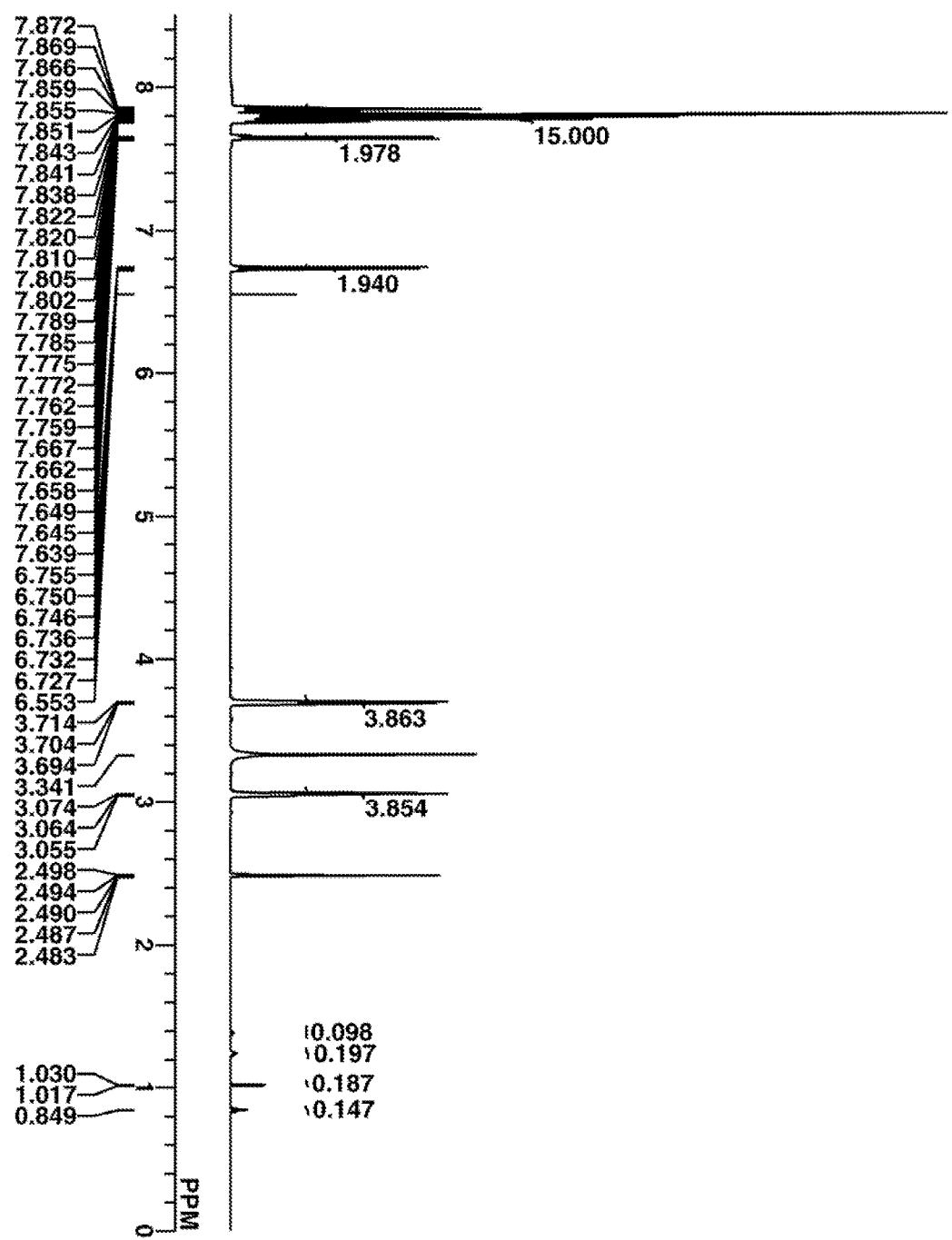

CHEMICALLY AMPLIFIED NEGATIVE RESIST COMPOSITION USING NOVEL ONIUM SALT AND RESIST PATTERN FORMING PROCESS

CROSS-REFERENCE TO RELATED APPLICATION

This non-provisional application claims priority under 35 U.S.C. §119(a) on Patent Application No. 2015-081879 filed in Japan on Apr. 13, 2015, the entire contents of which are hereby incorporated by reference.

TECHNICAL FIELD

This invention relates to a chemically amplified negative resist composition for use in the processing of semiconductor substrates and photomask blanks, and a process for forming a resist pattern.

BACKGROUND ART

To meet the recent demand for higher integration in integrated circuits, pattern formation to a finer feature size is required. Acid-catalyzed chemically amplified resist compositions are most often used in forming resist patterns with a feature size of 0.2 µm or less. High-energy radiation such as UV, deep-UV or EB is used as the light source for exposure of these resist compositions. In particular, while EB lithography is utilized as the ultra-fine microfabrication technique, it is also indispensable in processing a photomask blank to form a photomask for use in semiconductor device fabrication.

Polymers comprising a major proportion of aromatic structure having an acidic side chain, for example, polyhydroxystyrene have been widely used in resist materials for the KrF excimer laser lithography. These polymers are not used in resist materials for the ArF excimer laser lithography since they exhibit strong absorption at a wavelength of around 200 nm. These polymers, however, are expected to form useful resist materials for the EB and EUV lithography for forming patterns of finer size than the processing limit of ArF excimer laser because they offer high etching resistance.

Resist compositions for photolithography include positive ones in which exposed areas are dissolved away and negative ones in which exposed areas are left as a pattern. A suitable composition is selected among them depending on the desired resist pattern. In general, the chemically amplified negative resist composition comprises a polymer which is normally soluble in an aqueous alkaline developer, an acid generator which is decomposed to generate an acid upon exposure to light, and a crosslinker which causes the polymer to crosslink in the presence of the acid serving as a catalyst, thus rendering the polymer insoluble in the developer (sometimes, the crosslinker is incorporated in the polymer). Typically a basic compound is added for controlling the diffusion of the acid generated upon light exposure.

A number of negative resist compositions of the type comprising a polymer which is soluble in an aqueous alkaline developer and includes phenolic units as the alkali-soluble units were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the short wavelength (e.g., EB or EUV) lithography capable of forming finer size patterns. Exemplary compositions are described in JP-A 2006-201532, JP-A 2006-215180, and JP-A 2008-249762.

Improvements were made in the control of resist sensitivity and pattern profile by properly selecting and combining components used in resist compositions and adjusting processing conditions. One outstanding problem is the diffusion of acid that has a material impact on the resolution of a chemically amplified resist composition.

An acid diffusion regulator is, in fact, essential for controlling acid diffusion and improving the performance, especially resolution of a resist composition. Studies have been made on the acid diffusion regulator while amines and weak acid onium salts have been generally used. The weak acid onium salts are exemplified in several patent documents. JP 3955384 describes that the addition of triphenylsulfonium acetate ensures to form a satisfactory resist pattern without T-top profile, a difference in line width between isolated and grouped patterns, and standing waves. JP-A H11-327143 reports improvements in sensitivity, resolution and exposure margin by the addition of sulfonic acid ammonium salts or carboxylic acid ammonium salts. Also, JP 4231622 describes that a resist composition for KrF or EB lithography comprising a PAG capable of generating a fluorinated carboxylic acid is improved in resolution and process latitude such as exposure margin and depth of focus. Further, JP 4116340 describes that a resist composition for $F_2$ laser lithography comprising a PAG capable of generating a fluorinated carboxylic acid is improved in line edge roughness (LER) and solves the footing problem. While these four patent documents refer to the KrF, EB and $F_2$ lithography, JP 4226803 describes a positive photosensitive composition for ArF excimer laser lithography comprising a carboxylic acid onium salt. These systems are based on the mechanism that a salt exchange occurs between a weak acid onium salt and a strong acid (sulfonic acid) generated by another PAG upon exposure, to form a weak acid and a strong acid onium salt. That is, the strong acid (sulfonic acid) having high acidity is replaced by a weak acid (carboxylic acid), thereby suppressing acid-catalyzed decomposition reaction of acid labile group and reducing or controlling the distance of acid diffusion. The onium salt apparently functions as an acid diffusion regulator.

However, when a resist composition comprising the foregoing carboxylic acid onium salt or fluorocarboxylic acid onium salt is used in patterning, a problem of LER arises. It would be desirable to have an acid diffusion regulator capable of minimizing LER.

CITATION LIST

Patent Document 1: JP-A 2006-201532 (US 20060166133, EP 1684118)
Patent Document 2: JP-A 2006-215180
Patent Document 3: JP-A 2008-249762 (US 20080241751, EP 1975711)
Patent Document 4: JP 3955384 (U.S. Pat. No. 6,479,210)
Patent Document 5: JP-A H11-327143
Patent Document 6: JP 4231622 (U.S. Pat. No. 6,485,883)
Patent Document 7: JP 4116340 (U.S. Pat. No. 7,214,467)
Patent Document 8: JP 4226803 (U.S. Pat. No. 6,492,091)
Patent Document 9: JP-A 2006-208781
Patent Document 10: JP-A 2012-123189

DISCLOSURE OF INVENTION

An object of the invention is to provide a chemically amplified negative resist composition which is processed by lithography to form a resist pattern with improved resolution and minimal LER, a photomask blank coated therewith, and a pattern forming process using the resist composition.

The inventors have found that a resist composition comprising a sulfonium salt of nitrogen-containing carboxylic acid can be processed by lithography to form a resist pattern with minimal LER.

In one aspect, the invention provides a chemically amplified negative resist composition for exposure to high-energy radiation comprising (A) an onium salt of a structure having the formula (1) or (2), (B) a resin (U-1) comprising recurring units having the formula (3), and (C) a crosslinker.

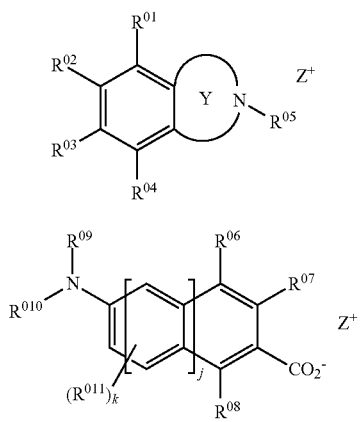
(1)

(2)

Herein $R^{01}$, $R^{02}$, $R^{03}$ and $R^{04}$ are each independently hydrogen, $-L-CO_2^-$, or a straight $C_1-C_{20}$, branched or cyclic $C_3-C_{20}$ monovalent hydrocarbon group which may be substituted with or separated by a heteroatom, or a pair of $R^{01}$ and $R^{02}$, $R^{02}$ and $R^{03}$, or $R^{03}$ and $R^{04}$ may bond together to form a ring with the carbon atoms to which they are attached; L is a single bond or a straight $C_1-C_{20}$, branched or cyclic $C_3-C_{20}$ divalent hydrocarbon group which may be substituted with or separated by a heteroatom; $R^{05}$ is hydrogen or a straight $C_1-C_{20}$, branched or cyclic $C_3-C_{20}$ monovalent hydrocarbon group which may be substituted with or separated by a heteroatom; $R^{06}$, $R^{07}$, $R^{08}$, $R^{09}$, $R^{010}$ and $R^{011}$ are each independently hydrogen or a straight $C_1-C_{20}$, branched or cyclic $C_3-C_{20}$ monovalent hydrocarbon group which may be substituted with or separated by a heteroatom, or a pair of $R^{06}$ and $R^{07}$ may bond together to form a ring with the carbon atoms to which they are attached, a pair of $R^{08}$ and $R^{011}$ may bond together to form a ring with the carbon atoms to which they are attached and any intervening carbon atoms, or a pair of $R^{09}$ and $R^{010}$ may bond together to form a ring with the nitrogen atom; j is 0 or 1, k is a number in the range: $0 \le k \le 1$ when j=0, or $0 \le k \le 3$ when j=1. $Z^+$ is a sulfonium cation of the formula (a) or an iodonium cation of the formula (b):

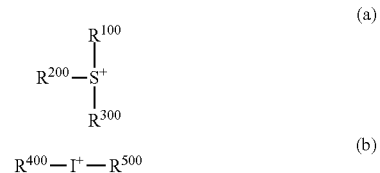

wherein $R^{100}$, $R^{200}$, and $R^{300}$ are each independently a straight $C_1-C_{20}$, branched or cyclic $C_3-C_{20}$ monovalent hydrocarbon group which may be substituted with or separated by a heteroatom, or any two or more of $R^{100}$, $R^{200}$, and $R^{300}$ may bond together to form a ring with the sulfur atom, $R^{400}$ and $R^{500}$ are each independently a straight $C_1-C_{20}$, branched or cyclic $C_3-C_{20}$ monovalent hydrocarbon group which may be substituted with or separated by a heteroatom. The partial structure represented by the formula:

is a cyclic structure having the intervening nitrogen atom in which a hydrogen atom bonded to a cyclic structure-forming carbon atom may be replaced by a straight $C_1-C_{20}$, branched or cyclic $C_3-C_{20}$ monovalent hydrocarbon group or $-L-CO_2^-$, or in which a cyclic structure-forming carbon atom may be replaced by sulfur, oxygen or nitrogen. It is noted that one substituent: $-L-CO_2^-$ is essentially included in formula (1).

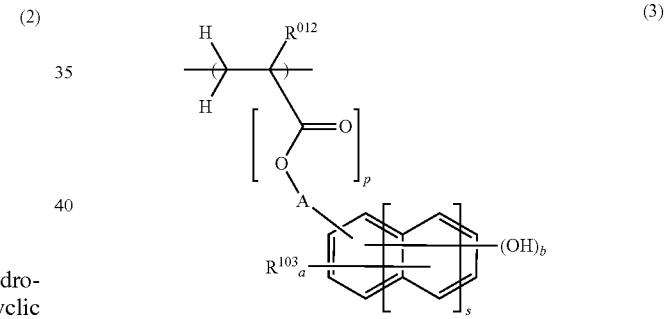
(3)

Herein A is a single bond or a $C_1-C_{10}$ alkylene group which may contain an ether bond at an intermediate of its chain, $R^{012}$ is hydrogen, fluorine, methyl or trifluoromethyl, $R^{013}$ is hydrogen, halogen, an optionally halo-substituted, straight, branched or cyclic $C_2-C_8$ acyloxy group, an optionally halo-substituted, straight, branched or cyclic $C_1-C_6$ alkyl group, or an optionally halo-substituted, straight, branched or cyclic $C_1-C_6$ alkoxy group, b is an integer of 1 to 5, s is an integer of 0 to 2, a is an integer equal to or less than (5+2s−b), and p is 0 or 1.

By virtue of the onium salt of formula (1) or (2), the resist composition is effective for controlling acid diffusion upon exposure for pattern formation. When a resist film is made of the composition and processed by lithography, resolution is improved and a pattern with reduced LER is obtainable. The resin (U-1) comprising recurring units of formula (3) is able to improve the adhesion of a resist film to any underlying substrate and to control the solubility of a resist film in alkaline developer.

For the purpose of improving etch resistance, preferably the resin (U-1) may further comprise recurring units of at least one type selected from units having the formulae (5), (6), and (7).

(5)

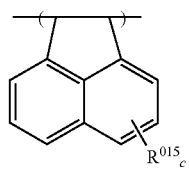

(6)

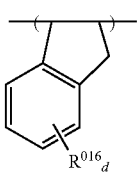

(7)

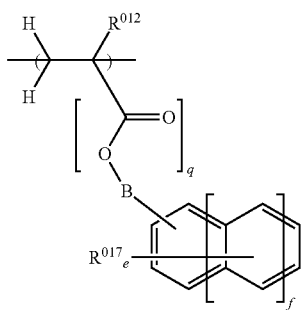

Herein B is a single bond or a $C_1$-$C_{10}$ alkylene group which may contain an ether bond at an intermediate of its chain; $R^{012}$ is hydrogen, fluorine, methyl or trifluoromethyl; $R^{015}$ and $R^{016}$ are each independently hydrogen, an optionally halo-substituted $C_1$-$C_6$ alkyl group or primary or secondary alkoxy group, or an optionally halo-substituted $C_2$-$C_7$ alkylcarbonyloxy group; $R^{017}$ is hydrogen, a straight, branched or cyclic $C_1$-$C_{20}$ alkyl, alkoxy or acyloxy group, $C_2$-$C_{20}$ alkoxyalkyl group, $C_2$-$C_{20}$ alkylthioalkyl group, halogen, nitro, cyano, sulfinyl, or sulfonyl group; c and d each are an integer of 0 to 4, e is an integer of 0 to 5, f is an integer of 0 to 2, and q is 0 or 1.

In another aspect, the invention provides a chemically amplified negative resist composition for exposure to high-energy radiation comprising (A) an onium salt of a structure having the formula (1) or (2), and (B) a resin (U-2) comprising recurring units having the formulae (3) and (4).

Preferably, a crosslinker is not added to this resist composition.

(3)

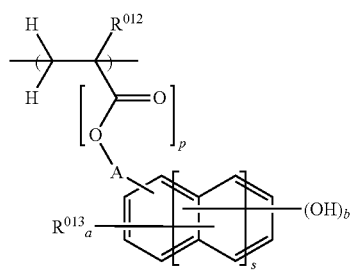

(4)

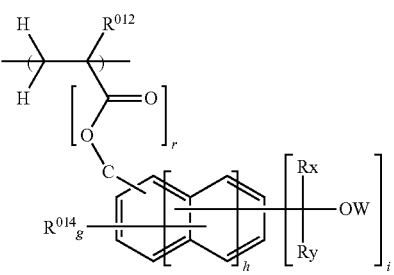

In formula (3), A is a single bond or a $C_1$-$C_{10}$ alkylene group which may contain an ether bond at an intermediate of its chain; $R^{012}$ is hydrogen, fluorine, methyl or trifluoromethyl; $R^{013}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group; b is an integer of 1 to 5, s is an integer of 0 to 2, a is an integer equal to or less than (5+2s−b), and p is 0 or 1.

In formula (4), C is a single bond or a $C_1$-$C_{10}$ alkylene group which may contain an ethereal oxygen atom at an intermediate of its chain; $R^{012}$ is hydrogen, fluorine, methyl or trifluoromethyl; $R^{014}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_8$ alkoxy group; W is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group; Rx and Ry are each independently hydrogen, a $C_1$-$C_{15}$ alkyl group which may be substituted with hydroxy or alkoxy, or an optionally substituted monovalent aromatic group, Rx and Ry may bond together to form a ring with the carbon atom to which they are attached, excluding that Rx and Ry are hydrogen at the same time; i is an integer of 1 to 3, h is an integer of 0 to 2, g is an integer equal to or less than (5+2h−i), and r is 0 or 1.

By virtue of the onium salt of formula (1) or (2), the resist composition is effective for controlling acid diffusion upon exposure for pattern formation. When a resist film is made of the composition and processed by lithography, resolution is improved and a pattern with reduced LER is obtainable. The recurring units of formula (3) are able to improve the adhesion of a resist film to any underlying substrate and to control the solubility of a resist film in alkaline developer, and the recurring units of formula (4) serve to promote negative tone reaction, achieving an improvement in resolution. The negative resist composition comprising resin (U-2) is characterized in that negative working reaction takes place in the absence of a crosslinker.

For the purpose of improving etch resistance, preferably the resin (U-2) may further comprise recurring units of at least one type selected from units having the formulae (5), (6), and (7) as defined above.

The resin (U-2) may further comprise other recurring units, preferably recurring units of at least one type selected from units having the formulae (a1), (a2), and (a3), because advantages are available including more effective control of acid diffusion, better resolution, and formation of a pattern with further reduced LER.

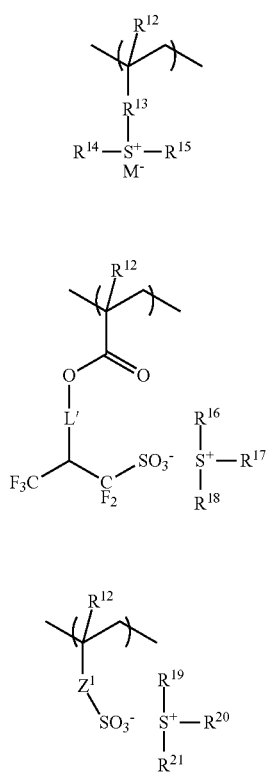

(a1)

(a2)

(a3)

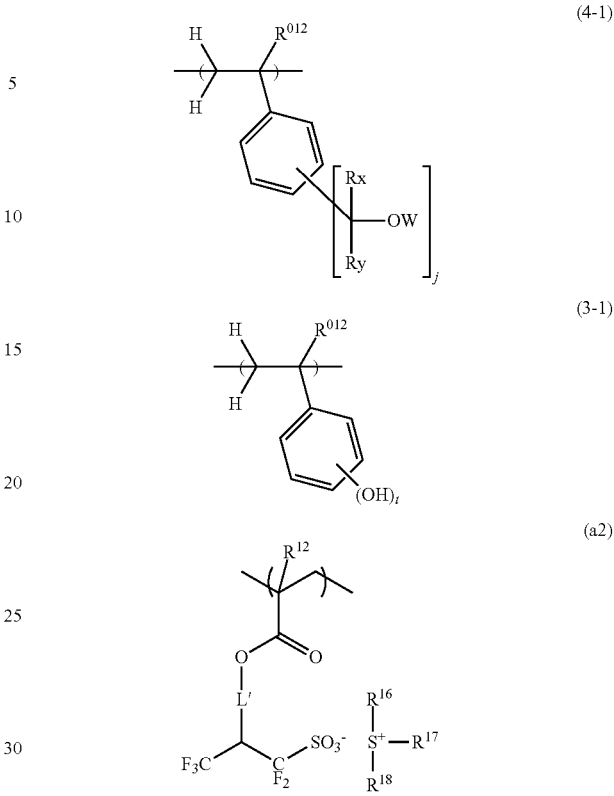

(4-1)

(3-1)

(a2)

Herein $R^{12}$ is each independently hydrogen or methyl; $R^{13}$ is a single bond, phenylene group, —O—$R^{22}$—, or —C(=O)—$Z^2$—$R^{22}$—, wherein $Z^2$ is oxygen or NH, and $R^{22}$ is a straight, branched or cyclic $C_1$-$C_6$ alkylene, alkenylene or phenylene group which may contain a carbonyl (—CO—), ester (—COO—), ether (—O—) or hydroxyl moiety; L' is a single bond or —$Z^3$—C(=O)—O—, wherein $Z^3$ is a straight, branched or cyclic $C_1$-$C_{20}$ divalent hydrocarbon group which may be substituted with a heteroatom; $Z^1$ is a single bond, methylene, ethylene, phenylene, fluorinated phenylene, —O—$R^{23}$—, or —C(=O)—Z—$R^{23}$—, wherein $Z^4$ is oxygen or NH, and $R^{23}$ is a straight, branched or cyclic $C_1$-$C_6$ alkylene, alkenylene or phenylene group which may contain a carbonyl, ester, ether or hydroxyl moiety; $M^-$ is a non-nucleophilic counter ion; $R^{14}$, $R^{15}$, $R^{16}$, $R^{17}$, $R^{18}$, $R^{19}$, $R^{20}$, and $R^{21}$ are each independently a straight $C_1$-$C_{20}$, branched or cyclic $C_3$-$C_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene, or $R^{14}$ and $R^{15}$ may bond together to form a ring with the sulfur atom, or any two or more of $R^{16}$, $R^{17}$, and $R^{18}$ or any two or more of $R^{19}$, $R^{20}$ and $R^{21}$ may bond together to form a ring with the sulfur atom.

In a preferred embodiment, the resin as component (B) comprises recurring units having the formulae (4-1), (3-1), and (a2).

Herein $R^{012}$ is independently hydrogen, fluorine, methyl or trifluoromethyl; W is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group; Rx and Ry are each independently hydrogen or a $C_1$-$C_{15}$ alkyl group which may be substituted with hydroxy or alkoxy, Rx and Ry may bond together to form a ring with the carbon atom to which they are attached, excluding that Rx and Ry are hydrogen at the same time; $R^{12}$ is hydrogen or methyl; L' is a single bond or —$Z^3$—C(=O)—O—, wherein $Z^3$ is a straight, branched or cyclic $C_1$-$C_{20}$ divalent hydrocarbon group which may be substituted with a heteroatom; $R^{16}$, $R^{17}$ and $R^{18}$ are each independently a straight $C_1$-$C_{20}$, branched or cyclic $C_3$-$C_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene, or any two or more of $R^{16}$, $R^{17}$ and $R^{18}$ may bond together to form a ring with the sulfur atom; j is an integer of 1 to 3, and t is an integer of 1 to 3.

In a preferred embodiment, the resist composition further comprises (D) a polymer comprising recurring units having the formula (8) and fluorine-containing recurring units of at least one type selected from the formulae (9), (10), (11) and (12), for the main purpose of suppressing unnecessary negative working.

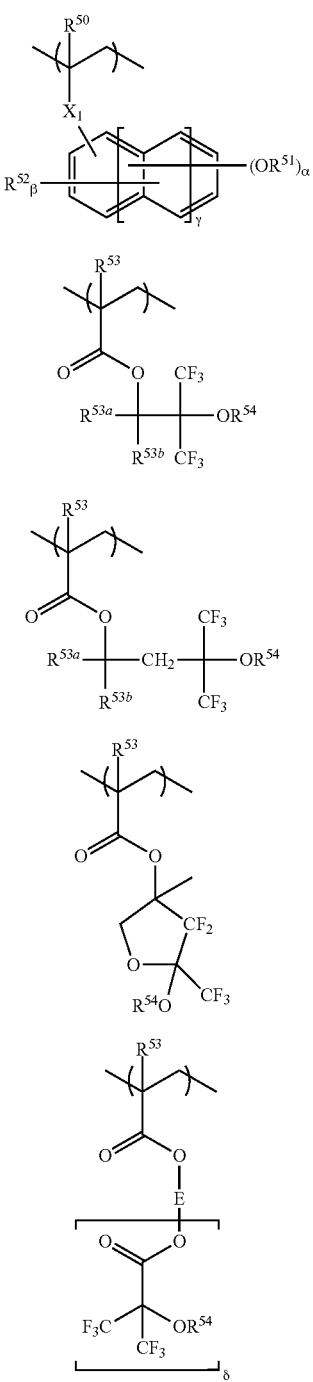

(8)
(9)
(10)
(11)
(12)

Herein $R^{50}$ is hydrogen or methyl; $R^{51}$ is hydrogen or a straight or branched $C_1$-$C_5$ monovalent hydrocarbon group which may be separated by a heteroatom; $R^{52}$ is a straight or branched $C_1$-$C_5$ monovalent hydrocarbon group which may be separated by a heteroatom. $R^{53}$ is each independently hydrogen, fluorine, methyl or trifluoromethyl; $R^{53a}$ and $R^{53b}$ are each independently hydrogen or a straight, branched or cyclic $C_1$-$C_{10}$ alkyl group; $R^{54}$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^{54}$, an ether bond (—O—) or carbonyl moiety (—C(=O)—) may intervene in a carbon-carbon bond; α is an integer of 1 to 3, β is an integer satisfying 0≤β≤5+2γ−α, γ is 0 or 1, δ is an integer of 1 to 3. $X^1$ is a single bond, —C(=O)O— or —C(=O)NH—. E is a straight, branched or cyclic $C_1$-$C_{20}$ (δ+1)-valent hydrocarbon or fluorinated hydrocarbon group.

In a preferred embodiment, the resist composition may further comprise an acid generator capable of generating an acid upon exposure to high-energy radiation.

Also contemplated herein is a photomask blank coated with the chemically amplified negative resist composition defined above.

In a further aspect, the invention provides a pattern forming process comprising the steps of applying the chemically amplified negative resist composition defined above onto a processable substrate to form a resist film thereon, exposing the resist film patternwise to high-energy radiation, and developing the resist film in an alkaline developer to form a resist pattern.

Since the onium salt in the resist composition acts to effectively control acid diffusion during exposure, the pattern forming process is able to form a pattern of resist film with a reduced LER at a high resolution.

The high-energy radiation used herein is preferably EUV or EB. Then a pattern of finer feature size can be formed in the resist film.

Also preferably, the processable substrate is a photomask blank. Even on use of a processable substrate having an outermost surface layer made of a chromium or silicon-containing material which tends to adversely affect the profile of resist pattern, typically photomask blank, the pattern forming process is successful in forming a resist film which is fully adherent to the substrate and in forming a pattern with a reduced LER via exposure to high-energy radiation.

Advantageous Effects of Invention

The chemically amplified negative resist composition of the invention is effective for controlling acid diffusion during the exposure step, exhibits a very high resolution during pattern formation, and forms a pattern with minimal LER. The pattern forming process using the resist composition can form a resist pattern with minimal LER while maintaining a high resolution. The invention is best suited for a micropatterning process, typically EUV or EB lithography.

BRIEF DESCRIPTION OF DRAWINGS

FIG. 1 is a diagram showing NMR spectrum of triphenylsulfonium 4-morpholin-4-yl-benzoate in Synthesis Example 1-2.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. As used herein, B and C designate substituent groups as defined herein, contrary to the standard chemical terminology that B and C are the symbols of boron and carbon. In chemical formulae, Me stands for methyl, Ac stands for acetyl, and the broken line designates a valence bond.

The abbreviations and acronyms have the following meaning.
EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LER: line edge roughness It is understood that for some structures represented by chemical formulae, there can exist enantiomers and diastereomers because of the presence of asymmetric carbon atoms. In such a case, a single formula collectively represents all such isomers. The isomers may be used alone or in admixture.

The inventors have found that when a sulfonium salt of nitrogen-containing carboxylic acid is added to a resist composition, a pattern with minimal LER can be formed.

Briefly stated, one embodiment of the invention is a chemically amplified negative tone resist composition for high-energy radiation lithography, comprising (A) an onium salt compound of a structure having the formula (1) or (2) and (B) a resin (sometimes referred to as "base resin") adapted to turn alkali insoluble under the action of acid, comprising recurring units having the formula (3).

The onium salt compound has the formula (1) or (2).

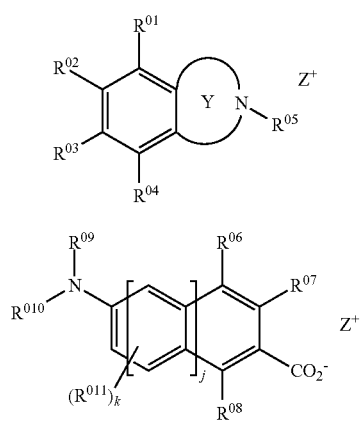

Herein $R^{01}$, $R^{02}$, $R^{03}$ and $R^{04}$ are each independently hydrogen, -L-$CO_2^-$, or a straight $C_1$-$C_{20}$, branched or cyclic $C_3$-$C_{20}$ monovalent hydrocarbon group which may be substituted with or separated by a heteroatom, or a pair of $R^{01}$ and $R^{02}$, $R^{02}$ and $R^{03}$, or $R^{03}$ and $R^{04}$ may bond together to form a ring with the carbon atoms to which they are attached. L is a single bond or a straight $C_1$-$C_{20}$, branched or cyclic $C_3$-$C_{20}$ divalent hydrocarbon group which may be substituted with or separated by a heteroatom. $R^{05}$ is hydrogen or a straight $C_1$-$C_{20}$, branched or cyclic $C_3$-$C_{20}$ monovalent hydrocarbon group which may be substituted with or separated by a heteroatom. $R^{06}$, $R^{07}$, $R^{08}$, $R^{09}$, $R^{010}$ and $R^{011}$ are each independently hydrogen or a straight $C_1$-$C_{20}$, branched or cyclic $C_3$-$C_{20}$ monovalent hydrocarbon group which may be substituted with or separated by a heteroatom, or a pair of $R^{06}$ and $R^{07}$ may bond together to form a ring with the carbon atoms to which they are attached, a pair of $R^{08}$ and $R^{011}$ may bond together to form a ring with the carbon atoms to which they are attached and any intervening carbon atoms, a pair of $R^{09}$ and $R^{010}$ may bond together to form a ring with the nitrogen atom. The subscript j is 0 or 1, and k is a number in the range: $0 \leq k \leq 1$ when j=0, or $0 \leq k \leq 3$ when j=1. $Z^+$ is a sulfonium cation of the formula (a) or an iodonium cation of the formula (b).

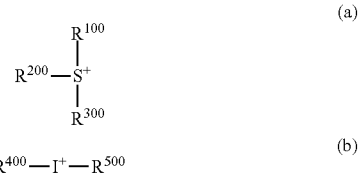

Herein $R^{100}$, $R^{200}$, and $R^{300}$ are each independently a straight $C_1$-$C_{20}$, branched or cyclic $C_3$-$C_{20}$ monovalent hydrocarbon group which may be substituted with or separated by a heteroatom, or any two or more of $R^{100}$, $R^{200}$, and $R^{300}$ may bond together to form a ring with the sulfur atom. $R^{400}$ and $R^{500}$ are each independently a straight $C_1$-$C_{20}$, branched or cyclic $C_3$-$C_{20}$ monovalent hydrocarbon group which may be substituted with or separated by a heteroatom. The partial structure represented by the formula:

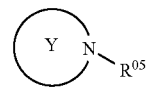

is a cyclic structure having the intervening nitrogen atom in which a hydrogen atom bonded to a cyclic structure-forming carbon atom may be replaced by a straight $C_1$-$C_{20}$, branched or cyclic $C_3$-$C_{20}$ monovalent hydrocarbon group or -L-$CO_2^-$, or in which a cyclic structure-forming carbon atom may be replaced by sulfur, oxygen or nitrogen. It is noted that one substituent: -L-$CO_2^-$ is essentially included in formula (1).

In formula (1), examples of the straight $C_1$-$C_{20}$, branched or cyclic $C_3$-$C_{20}$ monovalent hydrocarbon group represented by $R^{01}$ to $R^{05}$ include methyl, ethyl, propyl, isopropyl, n-butyl, sec-butyl, t-butyl, n-pentyl, t-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, tricyclo[5.2.1.0$^{2,6}$]decanyl, adamantyl, adamantylmethyl, phenyl, naphthyl, and anthracenyl. In these hydrocarbon groups, a hydrogen atom (or atoms) may be replaced by a heteroatom such as oxygen, sulfur, nitrogen or halogen, or a carbon atom (or atoms) may be replaced by a heteroatom such as oxygen, sulfur or nitrogen. As a result, a hydroxyl group, cyano group, carbonyl group, ether bond, thioether bond, ester bond, sulfonic acid ester bond, carbonate bond, carbamate bond, lactone ring, sultone ring, carboxylic anhydride or haloalkyl group may form or intervene.

The anion structure in formula (1) is characterized by the essential inclusion of one substituent: -L-$CO_2^-$. That is, the compound of formula (1) is a carboxylic acid onium salt.

In formula (1), examples of the straight $C_1$-$C_{20}$, branched or cyclic $C_3$-$C_{20}$ divalent hydrocarbon group (which may be substituted with or separated by a heteroatom) represented by L include straight alkane-diyl groups such as methylene, ethylene, propane-1,3-diyl, butane-1,4-diyl, pentane-1,5- diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; saturated cyclic hydrocarbon groups such as cyclopentanediyl, cyclohexanediyl, norbornanediyl, and adamantanediyl; and unsaturated cyclic hydrocarbon groups such as phenylene and naphthylene. In these hydrocarbon groups, a hydrogen atom (or atoms) may be replaced by an alkyl such as methyl, ethyl, propyl, n-butyl or t-butyl. Also in these hydrocarbon groups, a hydrogen atom (or atoms) may be replaced by a heteroatom such as oxygen, sulfur, nitrogen or halogen to form a hydroxyl group, cyano group, carbonyl group, ether bond, thioether bond, ester bond, sulfonic acid ester bond, carbonate bond, carbamate bond, lactone ring, sultone ring, carboxylic anhydride or haloalkyl group.

Examples of the anion structure in the onium salt compound having formula (1) are shown below, but not limited thereto.

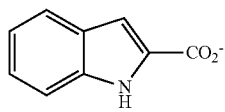
(1)-1

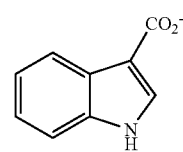
(1)-2

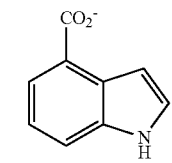
(1)-3

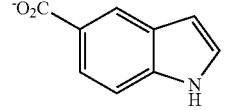
(1)-4

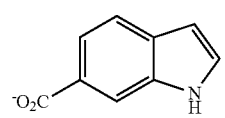
(1)-5

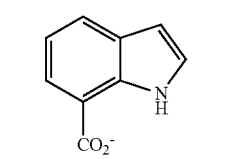
(1)-6

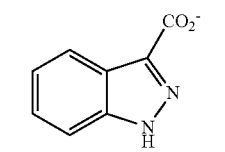
(1)-7

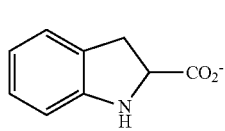
(1)-8

-continued

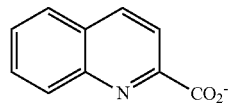
(1)-9

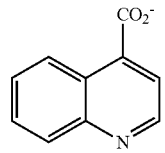
(1)-10

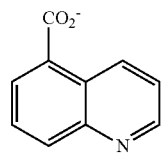
(1)-11

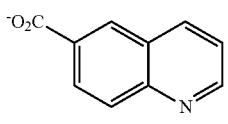
(1)-12

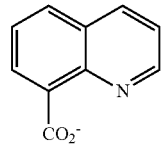
(1)-13

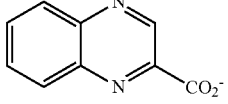
(1)-14

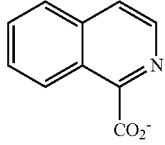
(1)-15

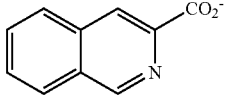
(1)-16

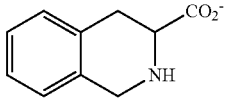
(1)-17

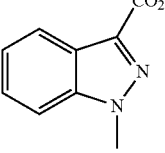
(1)-18

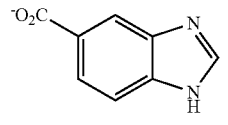
(1)-19

Of the anions having structural formulae (1)-1 to (1)-36, structures (1)-1 to (1)-28, (1)-31, and (1)-36 are especially preferred because of availability of starting carboxylic acids.

Of the illustrative anion structures, those compounds having protected nitrogen atom like (1)-36 have the advantage of ease of synthesis because of a lowering of water solubility, over the unprotected compounds. As the anion in the onium salt compound having formula (1), suitable structures having protected nitrogen atom are illustrated below, but not limited thereto.

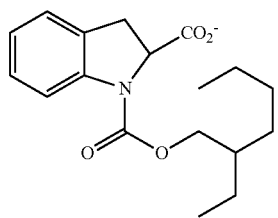
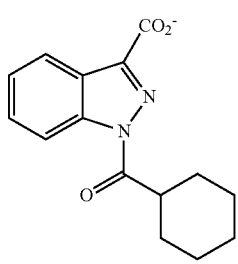
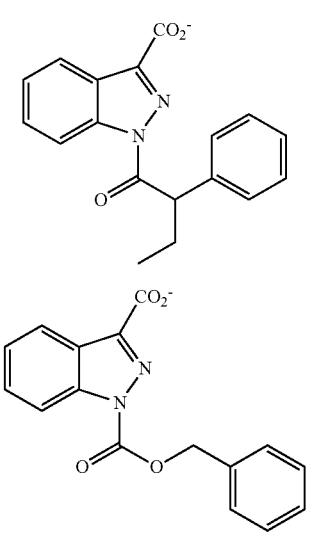
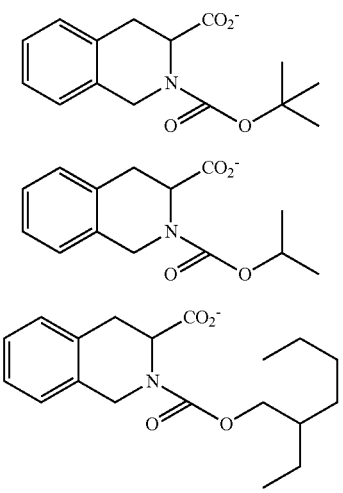

-continued

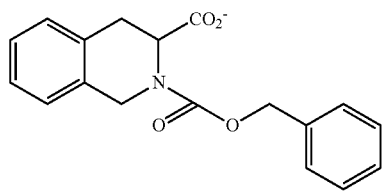
(1)-53

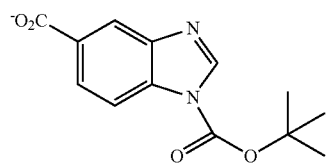
(1)-54

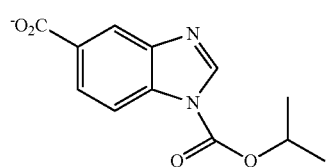
(1)-55

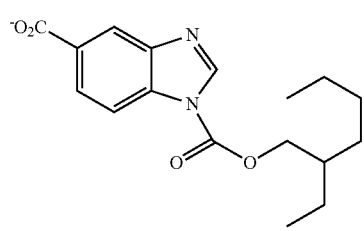
(1)-56

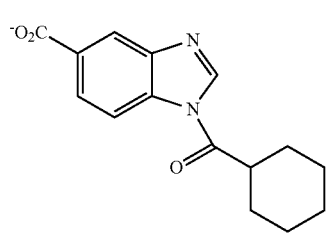
(1)-57

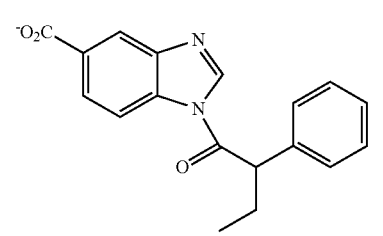
(1)-58

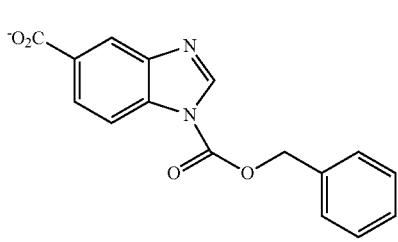
(1)-59

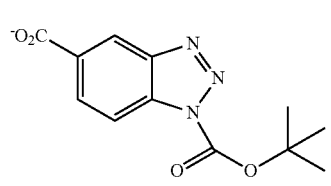
(1)-60

-continued

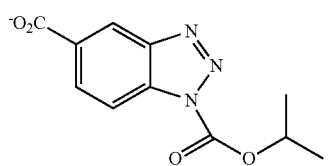
(1)-61

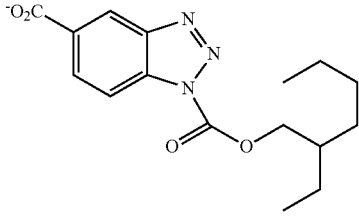
(1)-62

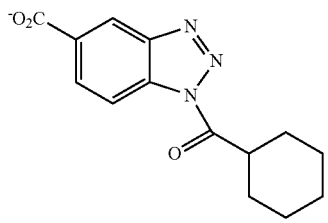
(1)-63

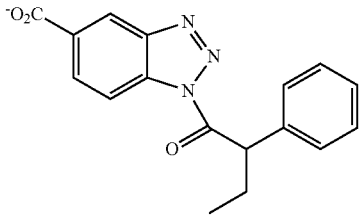
(1)-64

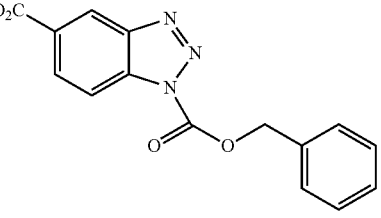
(1)-65

In formula (2), examples of the straight $C_1$-$C_{20}$, branched or cyclic $C_3$-$C_{20}$ monovalent hydrocarbon group represented by $R^{06}$ to $R^{011}$ include methyl, ethyl, propyl, isopropyl, n-butyl, sec-butyl, t-butyl, n-pentyl, t-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, tricyclo[$5.2.1.0^{2,6}$]decanyl, adamantyl, adamantylmethyl, phenyl, naphthyl, and anthracenyl. In these hydrocarbon groups, a hydrogen atom (or atoms) may be replaced by a heteroatom such as oxygen, sulfur, nitrogen or halogen, or a carbon atom (or atoms) may be replaced by a heteroatom such as oxygen, sulfur or nitrogen. As a result, a hydroxyl group, cyano group, carbonyl group, ether bond, thioether bond, ester bond, sulfonic acid ester bond, carbonate bond, carbamate bond, lactone ring, sultone ring, carboxylic anhydride or haloalkyl group may form or intervene.

In conjunction with the partial structure represented by the formula:

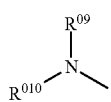
in formula (2) wherein $R^{O9}$ and $R^{O10}$ bond together to form a ring with the nitrogen atom, suitable ring structures are exemplified below.
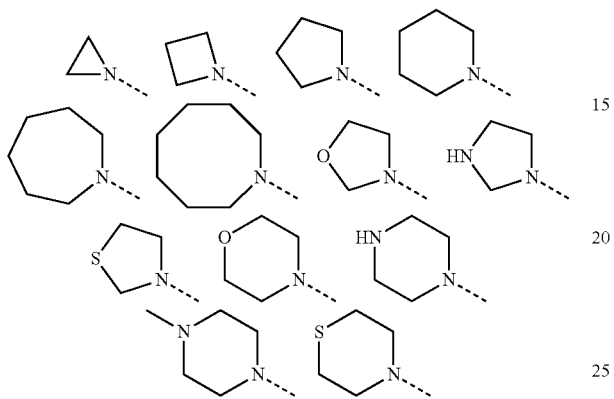
Herein, the broken line designates a valence bond to the aromatic ring in formula (2).
Examples of the anion structure in the onium salt compound having formula (2) are shown below, but not limited thereto.
(2)-1
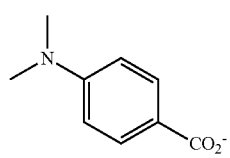
(2)-2
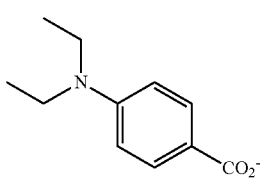
(2)-3
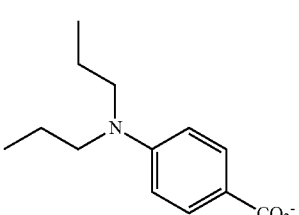
(2)-4
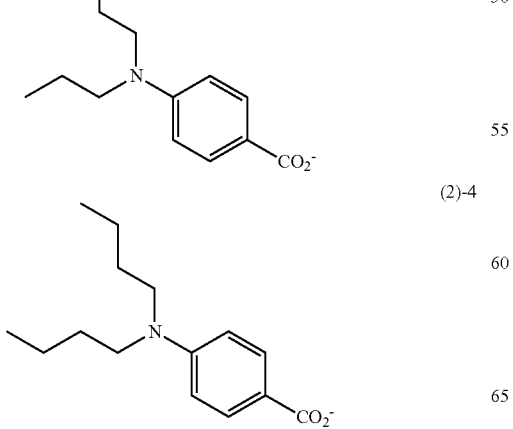
(2)-5
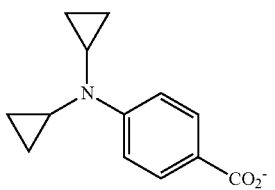
(2)-6
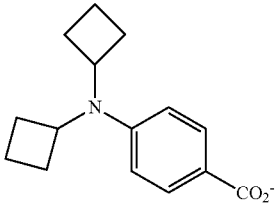
(2)-7
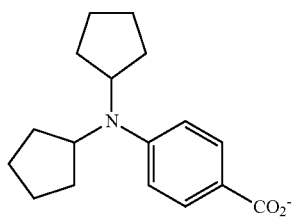
(2)-8
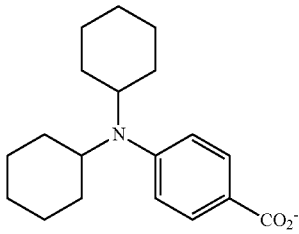
(2)-9
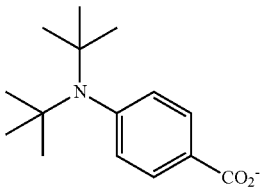
(2)-10
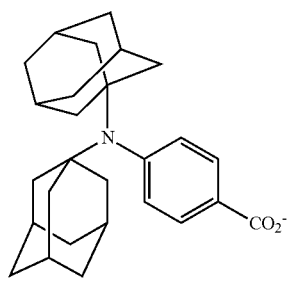
(2)-11
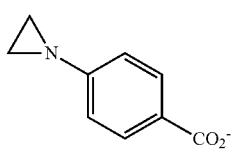

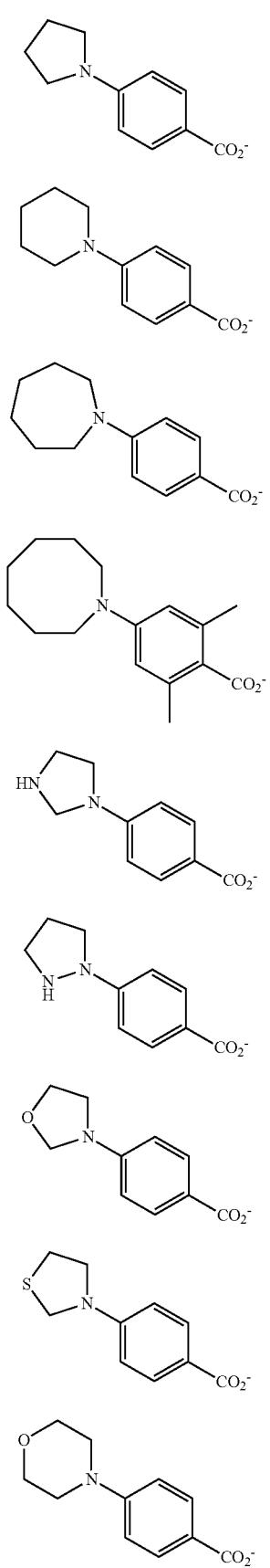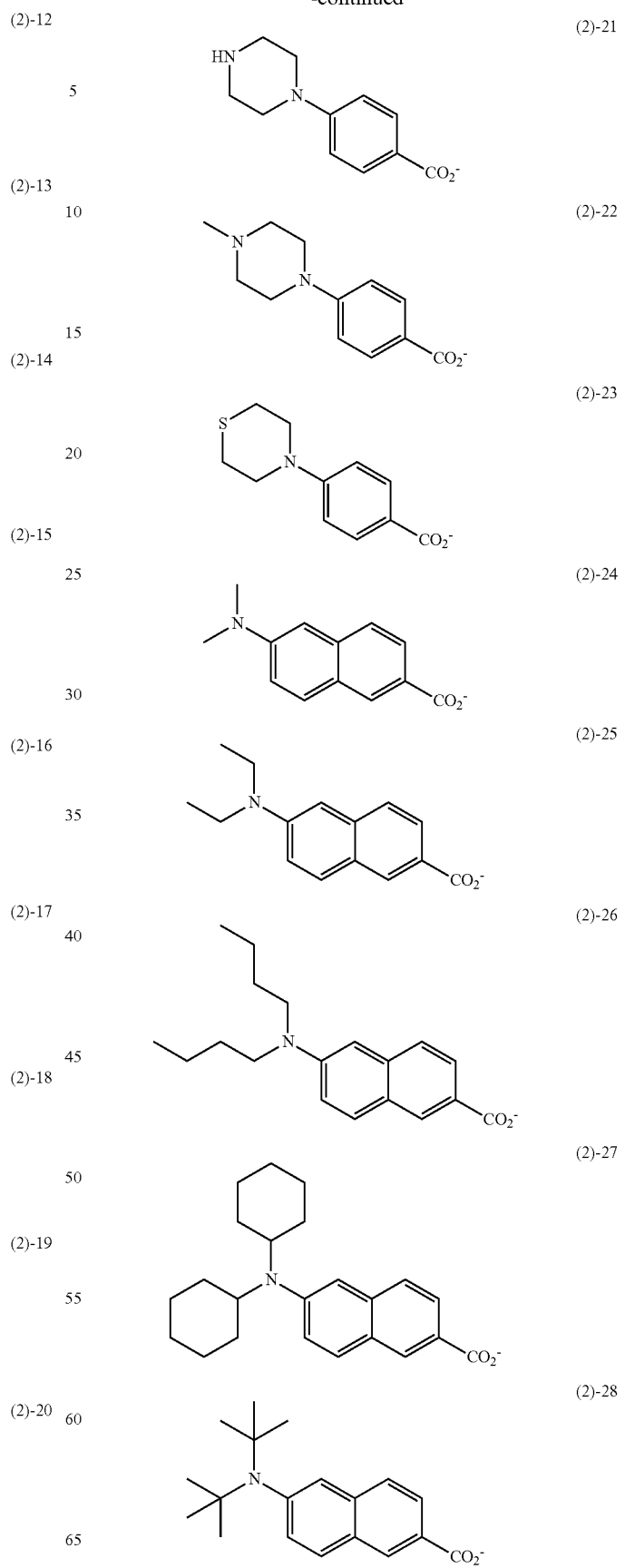

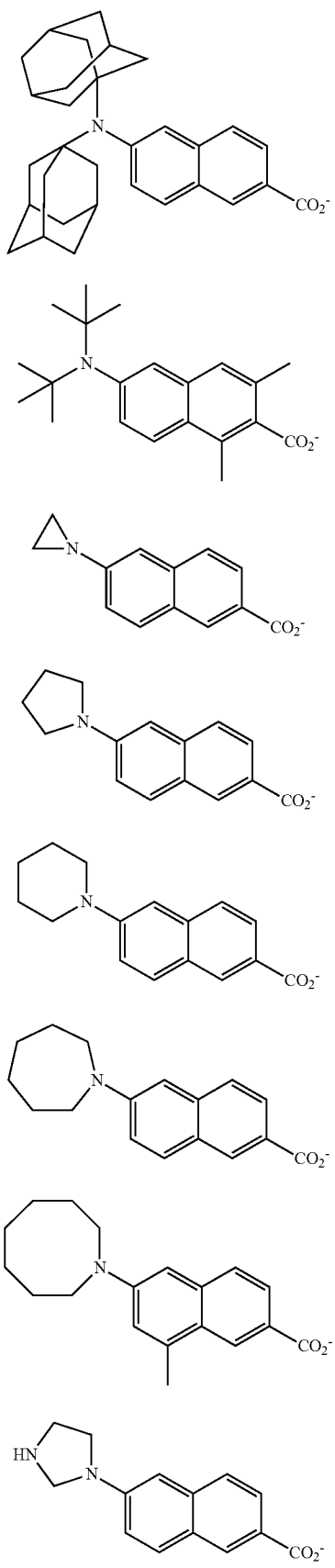
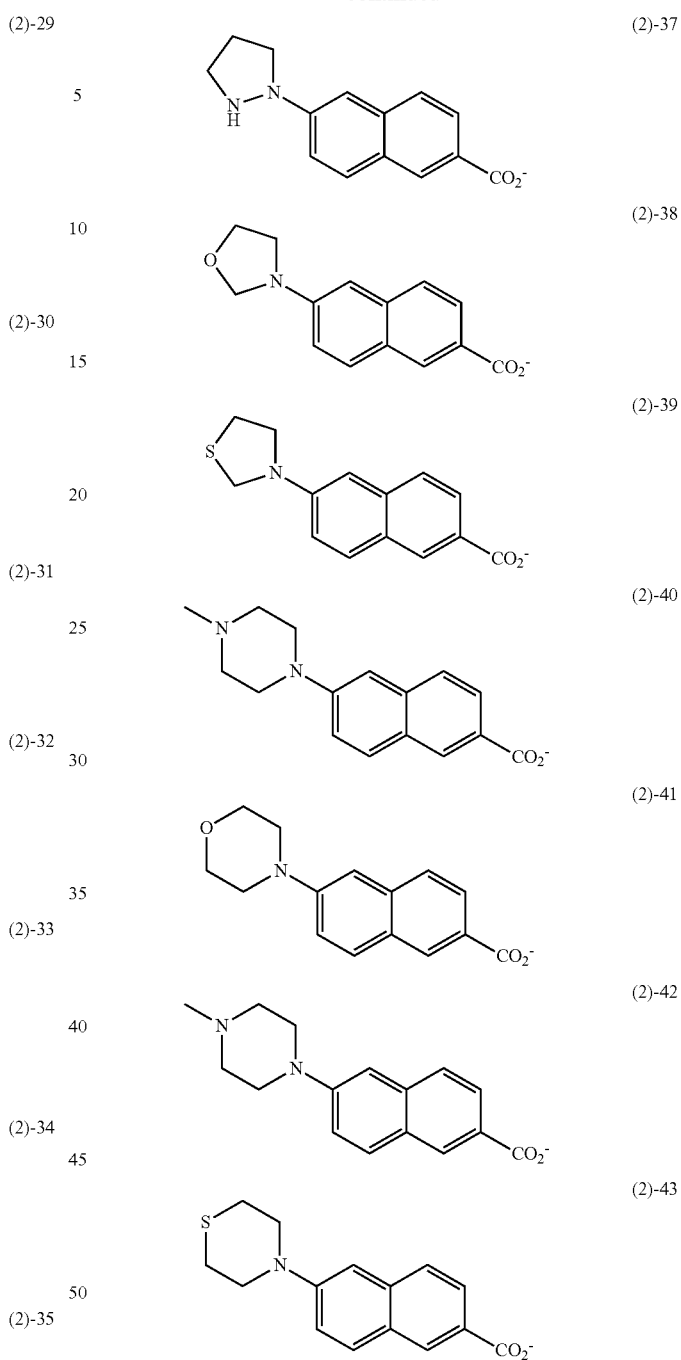

Of the anions having structural formulae (2)-1 to (2)-43, structures (2)-1 to (2)-23 are especially preferred because of availability of starting carboxylic acids and ease of synthesis.

In formula (a), $R^{100}$, $R^{200}$, and $R^{300}$ are each independently a straight $C_1$-$C_{20}$, branched or cyclic $C_3$-$C_{20}$ monovalent hydrocarbon group (which may be substituted with or separated by a heteroatom), examples of which are as exemplified for $R^{01}$ to $R^{05}$ in formula (1). When any two or more of $R^{100}$, $R^{200}$, and $R^{300}$ bond together to form a ring with the sulfur atom, suitable rings are exemplified by the following structures.

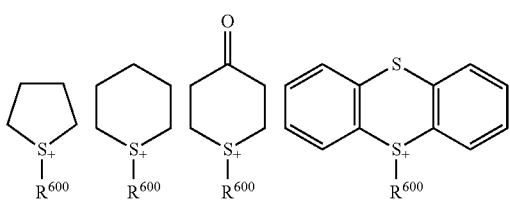
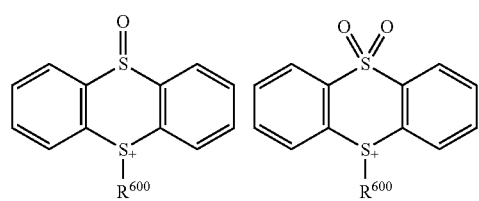
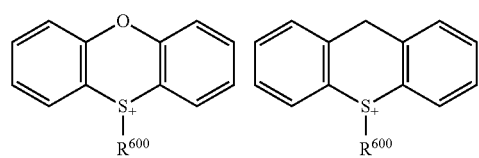
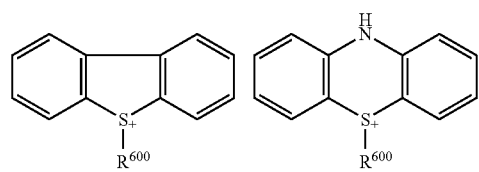
Herein, $R^{600}$ is a monovalent hydrocarbon group as defined and exemplified for $R^{100}$, $R^{200}$, and $R^{300}$.
Preferred examples of the sulfonium cation having formula (a) are shown below, but not limited thereto.
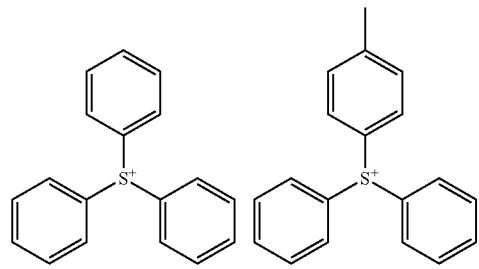
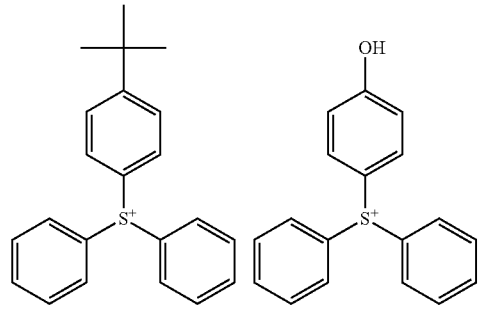
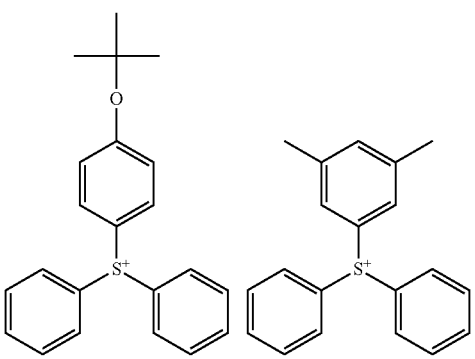
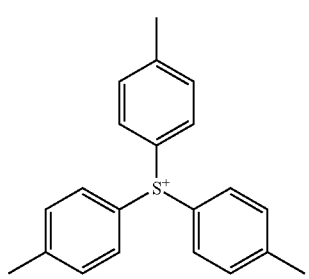
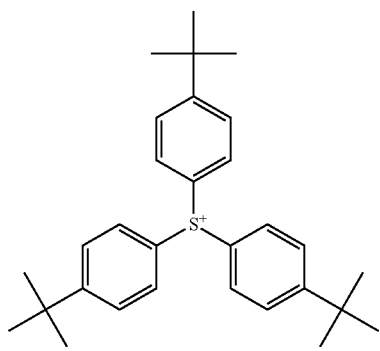
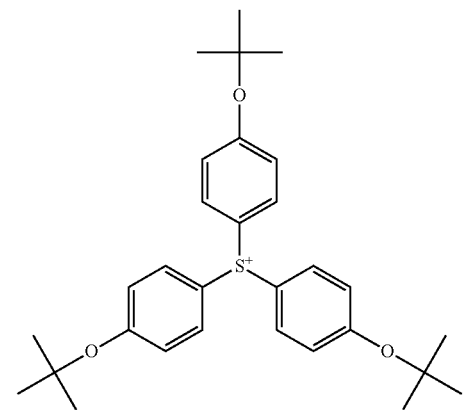
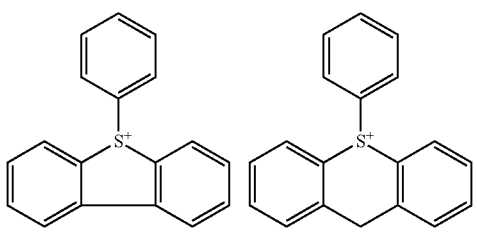

-continued

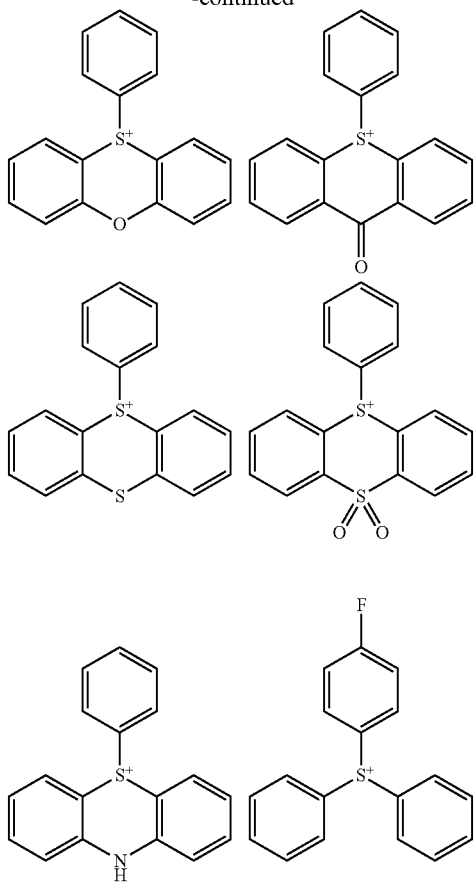

In formula (b), $R^{400}$ and $R^{500}$ are each independently a straight $C_1$-$C_{20}$, branched or cyclic $C_3$-$C_{20}$ monovalent hydrocarbon group (which may be substituted with or separated by a heteroatom), examples of which are as exemplified for $R^{01}$ to $R^{05}$ in formula (1), with aryl groups being preferred.

Preferred examples of the iodonium cation having formula (b) include bis(4-methylphenyl)iodonium, bis(4-ethylphenyl)iodonium, bis(4-t-butylphenyl)iodonium, bis(4-(1,1-dimethylpropyl)phenyl)iodonium, 4-methoxyphenylphenyliodonium, 4-t-butoxyphenylphenyliodonium, 4-acryloyloxyphenylphenyliodonium, and 4-methacryloyloxyphenylphenyliodonium. Inter alia, bis(4-t-butylphenyl)iodonium is more preferred.

Exemplary structures for the carboxylic acid sulfonium or iodonium salt include arbitrary combinations of anions with cations, both as exemplified above.

The carboxylic acid onium salt having formula (1) or (2) functions as an acid diffusion regulator. This function may be accounted for by the following mechanism. Since the acid generated from a PAG in a resist composition must have a strong acidity enough to turn the base resin alkali insoluble, a sulfonic acid fluorinated at α-position, imidic acid or methide acid is used in ArF lithography, for example. It is now assumed that the acid diffusion regulator of the invention is co-present with a PAG in a resist composition. The acid generated from the PAG undergoes ion exchange with the acid diffusion regulator and is converted back to a sulfonium or iodonium salt, and instead, the anion moiety of the acid diffusion regulator is converted to and released as carboxylic acid. Differently stated, via ion exchange, the strong acid is neutralized with the inventive carboxylic acid onium salt. That is, the inventive carboxylic acid onium salt functions as an acid diffusion regulator. Another mechanism is also contemplated that the cation of the inventive carboxylic acid onium salt is photo-decomposed to generate carboxylic acid. However, the acid generated thereby is a weak acid, not having an acidity enough to turn the base resin alkali insoluble.

In general, the acid diffusion regulator, which may be regarded as onium salt type quencher, tends to form a resist pattern with a lower LER than the amine compound quencher. It accounts for this tendency that salt exchange between strong acid and carboxylic acid onium salt is repeated infinitely. The site where strong acid is generated at the end of exposure is different from the initial site where the strong acid-generating onium salt is present. Since the cycle of acid generation (by high-energy irradiation) and salt exchange is repeated over and over, the acid generation points are averaged, which leads to a resist pattern with reduced LER after development.

As a matter of course, the acid diffusion regulator of the invention is also present in the unexposed region. It is believed that the acid diffusion regulator can trap the acid which has diffused from the exposed region, via the ion exchange reaction mentioned above. It is also believed that since the acid diffusion regulator has a nitrogen atom in its anion moiety, the nitrogen directly traps the acid. Both the mechanisms ensure to quench the acid which has diffused into the unexposed region. As a result, the contrast between the exposed and unexposed regions is increased, leading to substantial improvements in resolution and roughness.

With respect to the compound which exerts a quencher effect by the same mechanism, Patent Document 8 (JP 4226803) and JP-A H11-327143 describe the use of carboxylic acid onium salts, alkylsulfonic acid onium salts, and arylsulfonic acid onium salts as the acid diffusion regulator. However, when the alkylsulfonic acid onium salt or arylsulfonic acid onium salt is used, the acid generated therefrom has a certain level of acid strength so that in the over-exposed region, part of the salt induces alkali-insolubilizing reaction to the base resin rather than serving as the quencher. As a result, acid diffusion is promoted, degrading resist performance such as resolution or roughness. When an alkanecarboxylic acid onium salt is used, the carboxylic acid generated therefrom has too weak an acidity to turn the base resin alkali insoluble. However, the salt fails to trap exhaustively the strong acid generated by a PAG that has diffused into the unexposed region, leading to resolution and roughness below the satisfactory level. By contrast, since the acid diffusion regulator of the invention has a quench ability due to both ion exchange and neutralization via reaction with nitrogen atom, it can trap the acid that has diffused into the unexposed region more positively than the alkanecarboxylic acid onium salt.

Also, Patent Document 9 (JP-A 2006-208781) and Patent Document 10 (JP-A 2012-123189) disclose a photo-decomposable base in the form of a sulfonium salt having a nitrogen-containing group in its anion moiety, adapted to be decomposed to lose its basicity in the exposed region. A high contrast is available as a result of losing basicity in the exposed region, but maintaining basicity in the unexposed region. In fact, however, the control of acid diffusion is insufficient and resist performance such as resolution or MEF is not satisfactory. This is probably because the sulfonic acid generated from the photo-decomposable base in the exposed region also contributes to alkali insolubilization of the base resin together with the PAG.

On the other hand, JP-A 2007-293250 discloses nitrogen-containing carboxylic acid sulfonium or iodonium salts although synthesis examples are described nowhere. These nitrogen-containing carboxylates of monocyclic structure generally have a high solubility in water and an extremely low solubility in organic solvents. They are thus less compatible in resist compositions. Such properties suggest a possibility that resist performance such as pattern profile or roughness is degraded because the resist film in the unexposed region is partially dissolved away in the positive tone resist process of alkaline development type, or the resist film in the unexposed region is partially left undissolved in the negative tone resist process of organic solvent development type.

By contrast, the inventive onium salt having formula (1) or (2) functioning as acid diffusion regulator is characterized in that the anion moiety is a nitrogen-containing carboxylate of fused ring structure. The inventive acid diffusion regulator is lipophilic enough to eliminate any concern about performance degradation due to solubility as discussed above. Since the inventive acid diffusion regulator has the acid trapping function by ion exchange process as previously mentioned, it is effective for improving LER. Since the inventive acid diffusion regulator can trap the acid that has diffused into the unexposed region, by the quench function due to both ion exchange reaction and neutralization reaction at the nitrogen-containing site, it is effective for improving contrast and controlling acid diffusion. It is also effective for improving the lithography performance in terms of resolution (especially of a dot pattern) and roughness. Due to a quench ability within the system including suppression of chemical flare caused by acid during EB writing, and prevention of volatilization by local heat during high current quantity EB writing, the acid diffusion regulator is effective for suppressing unnecessary negative working reaction in the unexposed or unwritten region and reducing defects. When a resist film is combined with an anti-charging film, the acid diffusion regulator is effective for preventing intermixing therebetween. The resist composition comprising the acid diffusion regulator is best suited for the advanced micropatterning technology.

In the resist composition, the onium salt having formula (1) or (2) is preferably formulated in an amount of 0.1 to 50 parts by weight, more preferably 0.5 to 30 parts by weight per 100 parts by weight of the base resin. Outside the range, a less amount of the salt may not exert its function whereas a larger amount of the salt may invite degradations such as a lowering of sensitivity, a lack of solubility, and generation of foreign particles.

The compounds having formulae (1) and (2) may be readily synthesized by the skilled artisan using any well-known organic chemistry methods. For example, the desired compound may be synthesized by ion exchange reaction between a carboxylic acid serving as a precursor to the anion moiety in formula (1) and a cationic agent such as a triarylsulfonium halide or diaryliodonium halide. The carboxylic acid as the precursor may be synthesized by any well-known organic chemistry methods or any commercially available one may be used. The ion exchange reaction may be performed by any well-known methods, for example, with reference to JP-A 2007-145797.

The base resin (U-1) or (U-2) in the resist composition should preferably comprise recurring units having the following formula (3).

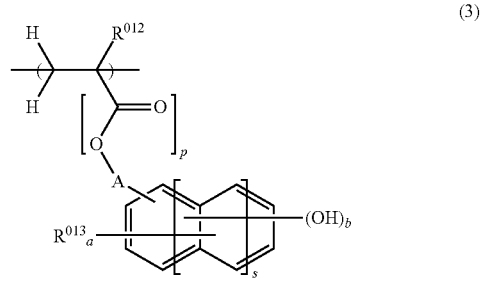

Herein "A" is a single bond or a $C_1$-$C_{10}$ alkylene group which may contain an ether bond at an intermediate of its chain. $R^{012}$ is hydrogen, fluorine, methyl or trifluoromethyl. $R^{013}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group. The subscript b is an integer of 1 to 5, s is an integer of 0 to 2, a is an integer equal to or less than (5+2s−b), and p is 0 or 1.

The recurring units of formula (3) are able to impart etch resistance, substrate adhesion, and solubility in alkaline developer. These recurring units are already used in many resist compositions for KrF excimer laser and EB lithography as disclosed in the patent documents cited herein.

In formula (3), "A" is a single bond or a $C_1$-$C_{10}$ alkylene group which may contain an ether bond at an intermediate of the chain. Examples of the alkylene group include methylene, ethylene, propylene, butylene, pentylene, hexylene and structural isomers of a carbon skeleton having branched or cyclic structure. For the alkylene group containing an ether bond, in case p=1 in formula (3), the ethereal oxygen atom may be incorporated at any position excluding the position between the α- and β-carbons relative to the ester oxygen. In case p=0, the atom in "A" that bonds with the main chain becomes an ethereal oxygen atom, and a second ethereal oxygen atom may be incorporated at any position excluding the position between the α- and β-carbons relative to that ethereal oxygen atom. Alkylene groups having no more than 10 carbon atoms are desirable because of a sufficient solubility in alkaline developer.

$R^{013}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group. If any substituent group has more carbon atoms than the range, a polymer may have a low solubility in alkaline developer and become difficult to design it for high resolution. Preferred examples of the hydrocarbon moiety in the acyloxy, alkyl and alkoxy groups include methyl, ethyl, propyl, isopropyl, butyl, pentyl, hexyl, and structural isomers of a carbon skeleton having branched or cyclic structure. If any hydrocarbon moiety has more carbon atoms than the range, undesirably a polymer may have a low solubility in alkaline developer.

In formula (3), a is an integer equal to or less than (5+2s−b), and b is an integer of 1 to 5. In case s=0, preferably a is an integer of 0 to 3, and b is an integer of 1 to 3. In case s=1 or 2, preferably a is an integer of 0 to 4, and b is an integer of 1 to 5. The subscript s is an integer of 0 to 2, and the structure represents a benzene skeleton when s=0, a naphthalene skeleton when s=1, and an anthracene skeleton when s=2.

The recurring units of formula (3) are preferably incorporated in an amount of at least 50 mol % of the entire recurring units in order to acquire a high resolution in that a high contrast is established between the region to be exposed to high-energy radiation and to be turned negative and the region not to be exposed and not to be turned negative.

Of the recurring units of formula (3), those recurring units wherein p is 0 and A is a single bond (meaning that the aromatic ring is directly bonded to the main chain of the polymer), that is, linker-free recurring units are units derived from a monomer in which a 1-substituted or unsubstituted vinyl group is attached to a hydroxyl-substituted aromatic ring, typically hydroxystyrene unit. Preferred examples include 3-hydroxystyrene, 4-hydroxystyrene, 5-hydroxy-2-vinylnaphthalene, and 6-hydroxy-2-vinylnaphthalene. More preferred are 3-hydroxystyrene and 4-hydroxystyrene represented by the following formula (3-1).

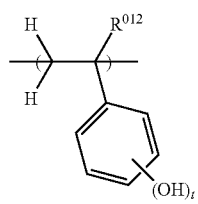

(3-1)

Herein $R^{012}$ is as defined for formula (3), and t is an integer of 1 to 3.

Those recurring units wherein p is 1, that is, recurring units having an ester structure as the linker are units of carbonyl-substituted vinyl monomers as typified by (meth)acrylates. Preferred examples of the units of formula (3) having a linker (—CO—O—A—) derived from (meth)acrylates are shown below.

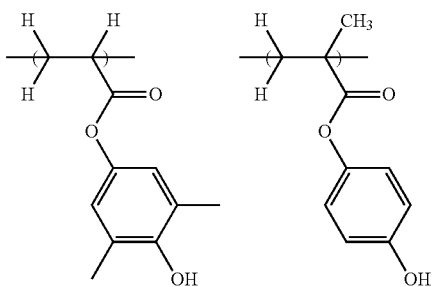

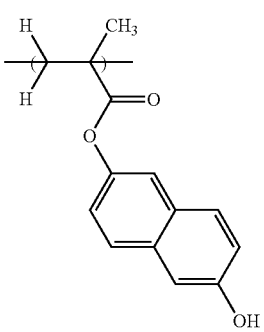

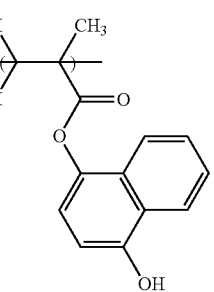

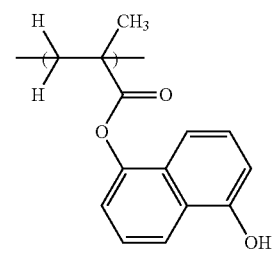

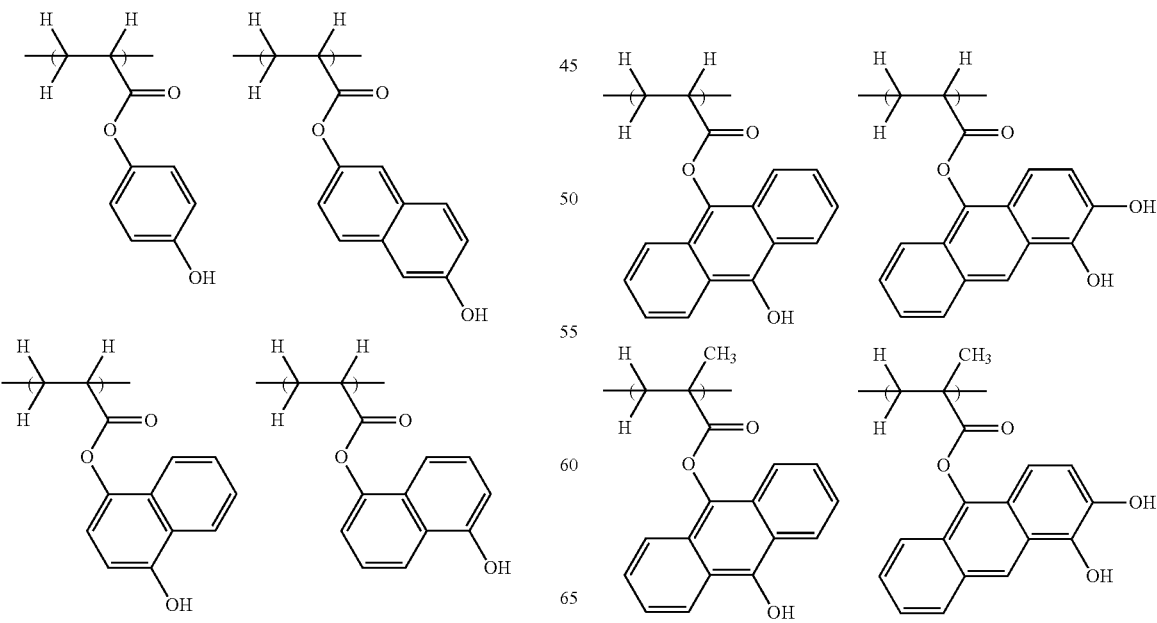

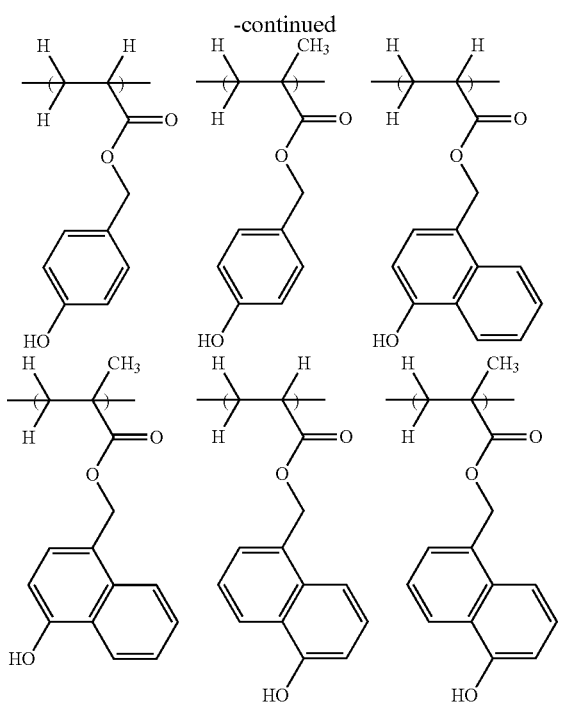

For the purpose of improving etch resistance, preferably the resin (U-1) or (U-2) further comprises recurring units of at least one type selected from units having the formulae (5), (6) and (7).

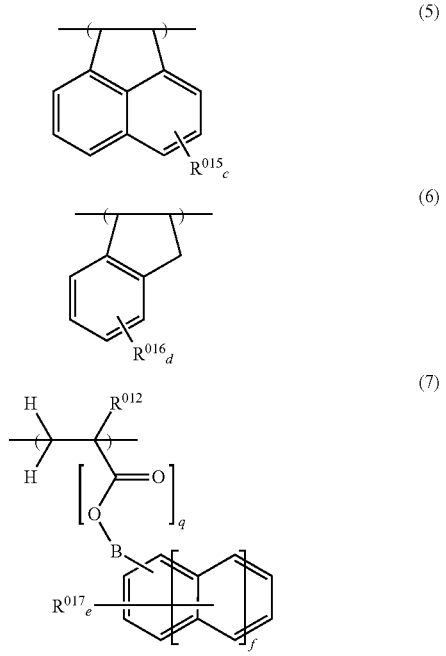

Herein B is a single bond or a $C_1$-$C_{10}$ alkylene group which may contain an ether bond at an intermediate of its chain. $R^{012}$ is hydrogen, fluorine, methyl or trifluoromethyl. $R^{015}$ and $R^{016}$ are each independently hydrogen, an optionally halo-substituted $C_1$-$C_6$ alkyl group or primary or secondary alkoxy group, or an optionally halo-substituted $C_2$-$C_7$ alkylcarbonyloxy group. $R^{017}$ is hydrogen, a straight, branched or cyclic $C_1$-$C_{20}$ alkyl, alkoxy or acyloxy group, $C_2$-$C_{20}$ alkoxyalkyl group, $C_2$-$C_{20}$ alkylthioalkyl group, halogen, nitro, cyano, sulfinyl, or sulfonyl group. The subscripts c and d each are an integer of 0 to 4, e is an integer of 0 to 5, f is an integer of 0 to 2, and q is 0 or 1.

In formula (7), B is a single bond or a $C_1$-$C_{10}$ alkylene group which may contain an ether bond (or ethereal oxygen atom) at an intermediate of its chain. Preferred examples of the alkylene group include methylene, ethylene, propylene, butylene, pentylene, hexylene and structural isomers of a carbon skeleton having branched or cyclic structure. For the alkylene group containing an ether bond, in case q=1 in formula (7), the ethereal oxygen atom may be incorporated at any position excluding the position between the α- and β-carbons relative to the ester oxygen. In case q=0 in formula (7), the atom in B that bonds with the main chain becomes an ethereal oxygen atom, and a second ethereal oxygen atom may be incorporated at any position excluding the position between the α- and β-carbons relative to that ethereal oxygen atom. Alkylene groups having no more than 10 carbon atoms are desirable because of a high solubility in alkaline developer.

In formula (7), $R^{017}$ is hydrogen, a straight, branched or cyclic $C_1$-$C_{20}$ alkyl group, $C_2$-$C_{20}$ (preferably $C_2$-$C_{10}$) alkoxyalkyl group, $C_2$-$C_{20}$ (preferably $C_2$-$C_{10}$) alkylthioalkyl group, halogen, nitro, cyano, sulfinyl, or sulfonyl group. Illustrative substituent groups include hydrogen, halogen atoms such as chlorine, bromine and iodine, alkyl groups such as methyl, ethyl, propyl, butyl, pentyl, hexyl and structural isomers thereof, cyclopentyl, cyclohexyl, methoxy, ethoxy, propoxy, butoxy, pentyloxy, hexyloxy and structural isomers of its hydrocarbon moiety, cyclopentyloxy, and cyclohexyloxy. Inter alia, methoxy and ethoxy are useful. An acyloxy group may be readily introduced into a polymer even after polymerization, by a chemical modification method and is advantageously utilized for fine adjustment of the solubility of the base resin in alkaline developer. Preferred acyloxy groups include methylcarbonyloxy, ethylcarbonyloxy, propylcarbonyloxy, butylcarbonyloxy, pentylcarbonyloxy, hexylcarbonyloxy and structural isomers thereof, cyclopentylcarbonyloxy, cyclohexylcarbonyloxy, and benzoyloxy. As long as the carbon count is equal to or less than 20, an appropriate effect of controlling or adjusting (typically reducing) the solubility of the base resin in alkaline developer is obtainable, and the generation of scum or development defects may be suppressed. Of the foregoing preferred substituent groups, such substituent groups as hydrogen, chlorine, bromine, iodine, methyl, ethyl and methoxy are useful because corresponding monomers may be readily prepared.

In formula (7), in case f=0, preferably e is an integer of 0 to 3; in case f=1 or 2, preferably e is an integer of 0 to 4. The subscript f is an integer of 0 to 2, and the structure represents a benzene skeleton when f=0, a naphthalene skeleton when f=1, and an anthracene skeleton when f=2.

Of the recurring units of formula (7), those recurring units wherein q is 0 and B is a single bond (meaning that the aromatic ring is directly bonded to the main chain of the polymer), that is, linker-free recurring units are units derived from monomers in which a 1-substituted or unsubstituted vinyl group is attached to an aromatic ring, as typified by styrene skeleton. Preferred examples of the basic skeleton include styrene, 4-chlorostyrene, 4-bromostyrene, 4-methylstyrene, 4-methoxystyrene, 2-hydroxypropylstyrene, 2-vinylnaphthalene, and 3-vinylnaphthalene.

Those recurring units wherein q is 1, that is, recurring units having an ester structure as the linker are units of carbonyl-substituted vinyl monomers as typified by (meth)acrylates. Preferred examples of the units of formula (7) having a linker (—CO—O—B—) derived from (meth)acrylates are shown below.

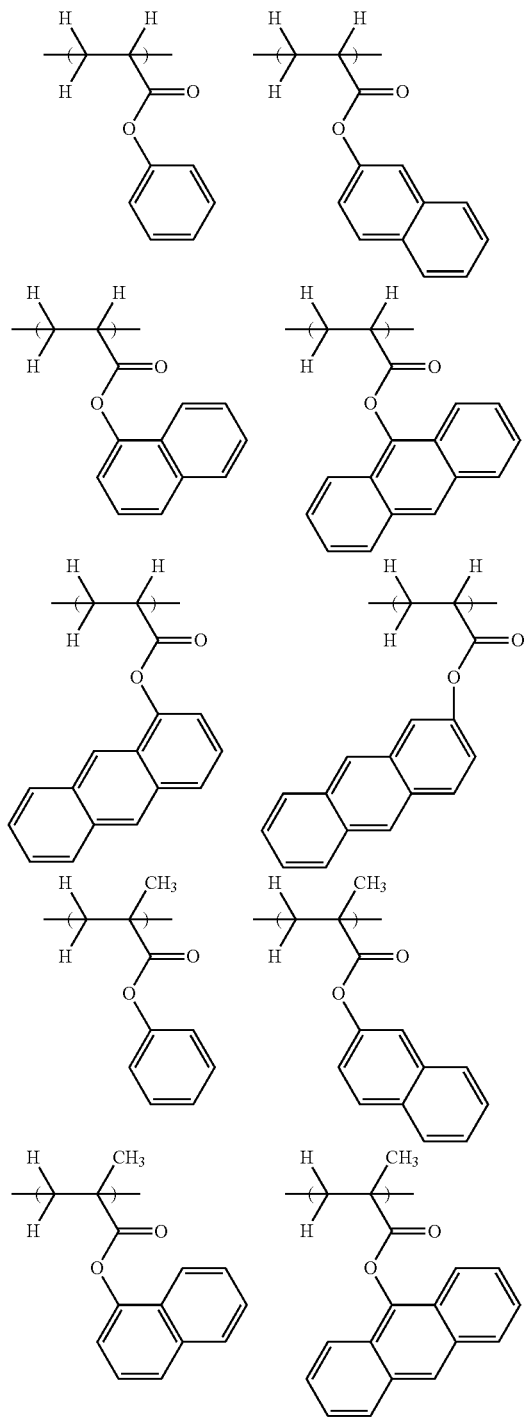

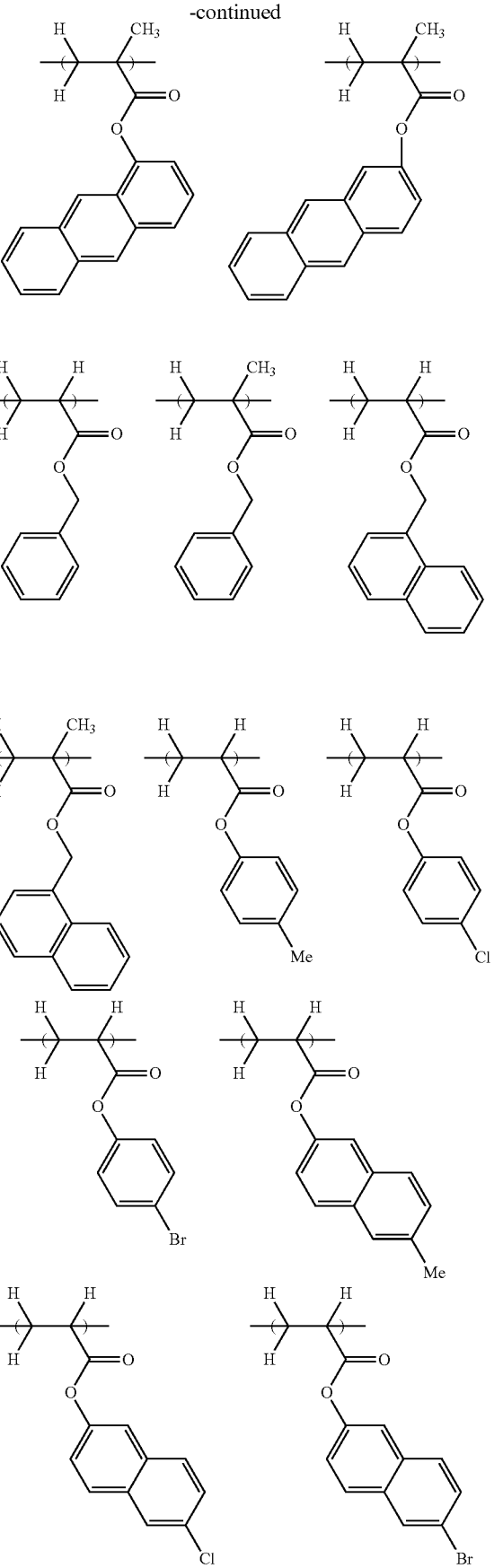

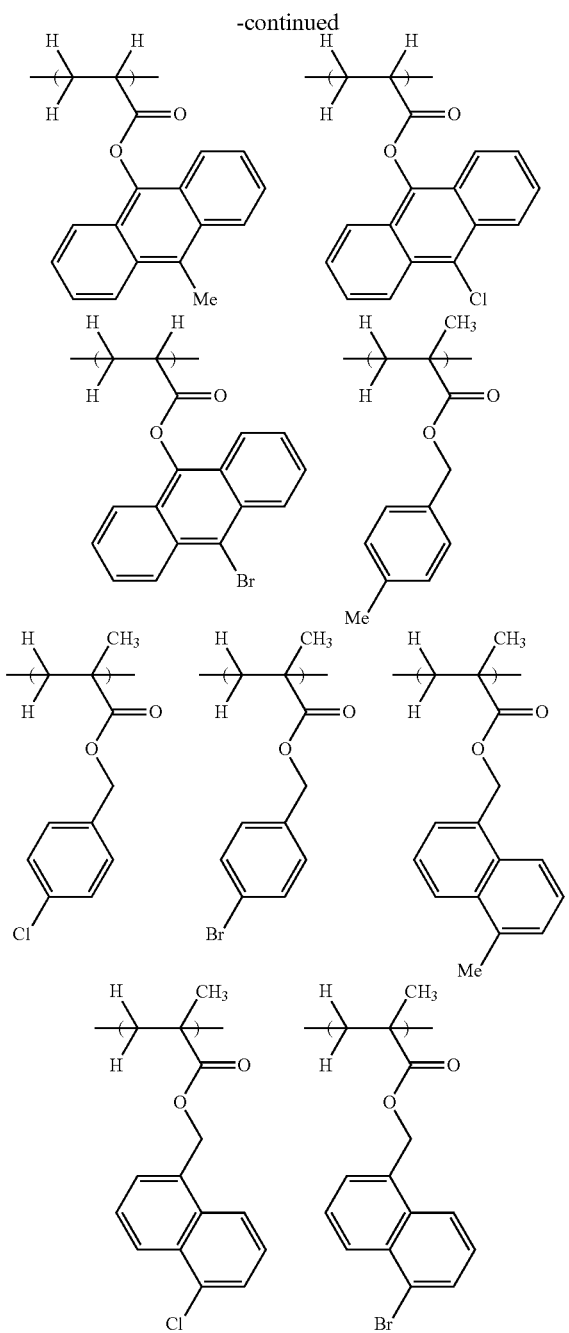

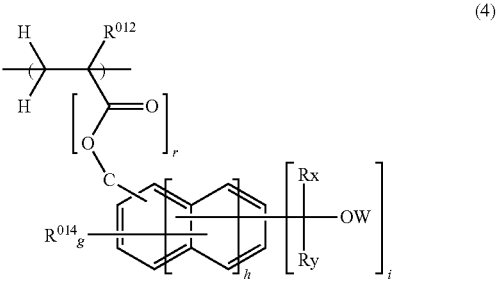

When the recurring units of at least one type selected from recurring units having formulae (5) to (7) are incorporated, etching resistance is further improved because not only the aromatic ring possesses etching resistance, but the cyclic structure incorporated into the main chain also exerts the effect of improving resistance to EB irradiation during etching and pattern inspection steps.

The recurring units having formulae (5) to (7) which incorporate a cyclic structure into the main chain to improve etching resistance may be of one type or a combination of plural types. The units of formulae (5) to (7) are preferably incorporated in a range of at least 5 mol % based on the overall recurring units of the base resin in order to exert an effect of improving etching resistance.

Also preferably, the resin (U-2) further comprises recurring units having the formula (4).

In formula (4), C is a single bond or a $C_1$-$C_{10}$ alkylene group which may contain an ethereal oxygen atom at an intermediate of its chain. $R^{012}$ is hydrogen, fluorine, methyl or trifluoromethyl. $R^{014}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group. W is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group. Rx and Ry are each independently hydrogen, a $C_1$-$C_{15}$ alkyl group which may be substituted with hydroxy or alkoxy, or an optionally substituted monovalent aromatic group, Rx and Ry may bond together to form a ring with the carbon atom to which they are attached, excluding that Rx and Ry are hydrogen at the same time. The subscript i is an integer of 1 to 3, h is an integer of 0 to 2, g is an integer equal to or less than (5+2h−i), and r is 0 or 1.

The unit of formula (4) functions upon exposure to high-energy radiation, such that the acid-eliminatable group undergoes elimination reaction under the action of an acid which is generated by the acid generator (upon exposure to high-energy radiation). That is, the unit of formula (4) itself induces alkali insolubilization and crosslinking reaction between polymer molecules.

When the acid eliminatable group-bearing side chain substitutes on the aromatic ring, i indicative of the substitution number is an integer of 1 to 3. W is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group. Preferred examples include hydrogen, methyl, ethyl, propyl, isopropyl, cyclopentyl, cyclohexyl, adamantyl, methylcarbonyl and phenyl.

Rx and Ry are each independently hydrogen, a $C_1$-$C_{15}$ alkyl group which may be substituted with hydroxyl or alkoxy, or an optionally substituted monovalent aromatic group. It is excluded that Rx and Ry are hydrogen at the same time. Preferred structures of Rx and Ry include methyl, ethyl, propyl, butyl and structural isomers thereof, and the foregoing having hydroxyl or alkoxy substituted thereon.

In formula (4), the aromatic ring may be bonded to the main chain via a single bond or via a carbonyloxy group or a linker C. The subscript h is an integer of 0 to 2. The structure represents a benzene ring when h=0, a naphthalene ring when h=1, and an anthracene ring when h=2.

C is a single bond or a $C_1$-$C_{10}$ alkylene group which may contain an ether bond (or ethereal oxygen atom) at an intermediate of its chain. Preferred examples of the alkylene group include methylene, ethylene, propylene, butylene, pentylene, hexylene and structural isomers of a carbon skeleton having branched or cyclic structure. For the alkylene group containing an ether bond, in case r=1 in formula (4), the ethereal oxygen atom may be incorporated at any position excluding the position between the α- and β-carbons relative to the ester oxygen. In case r=0, the atom in C that bonds with the main chain becomes an ethereal oxygen atom, and a second ethereal oxygen atom may be incorporated at any position excluding the position between the α- and β-carbons relative to that ethereal oxygen atom.

Preferred examples of the recurring unit of formula (4) are given below.

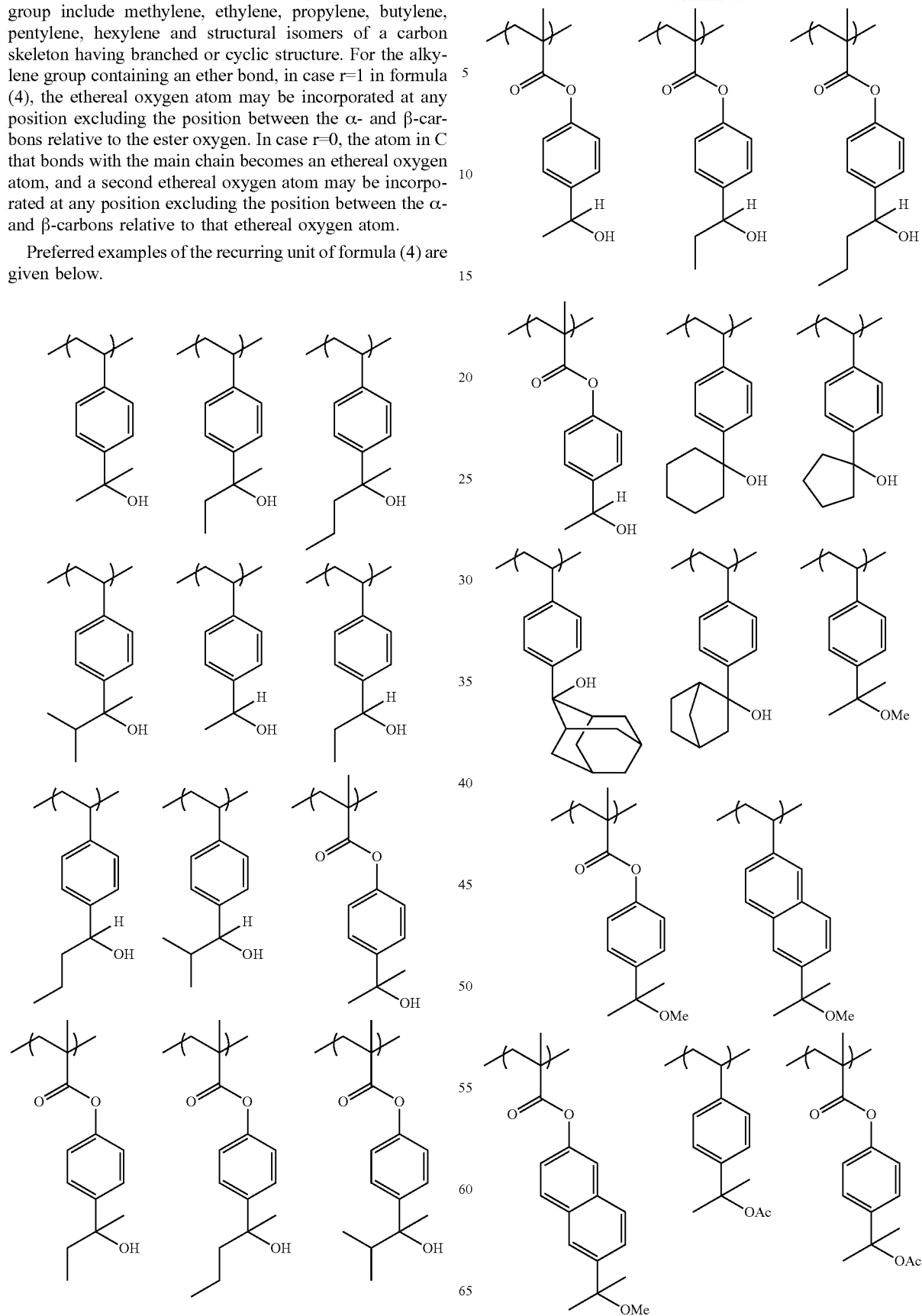

-continued
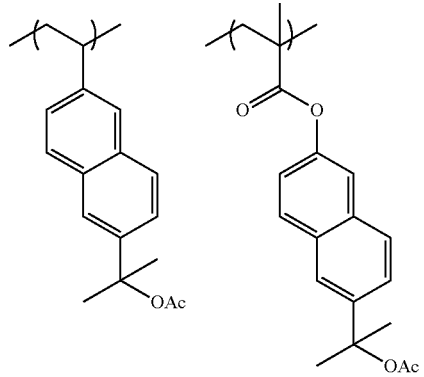
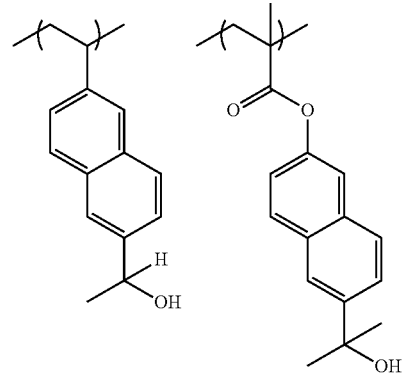
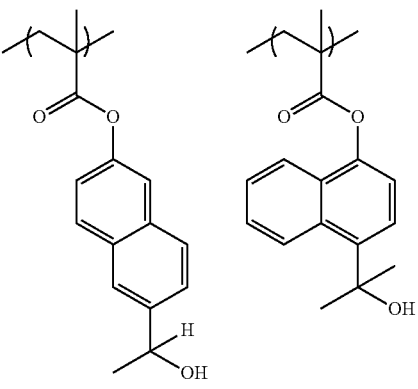
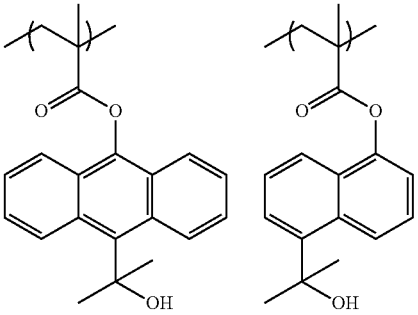
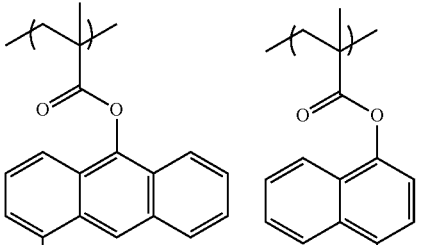
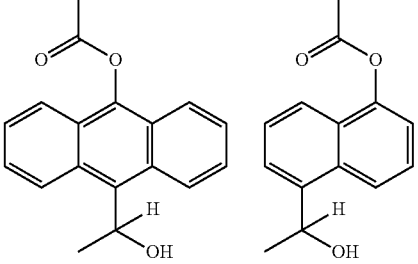

45
-continued
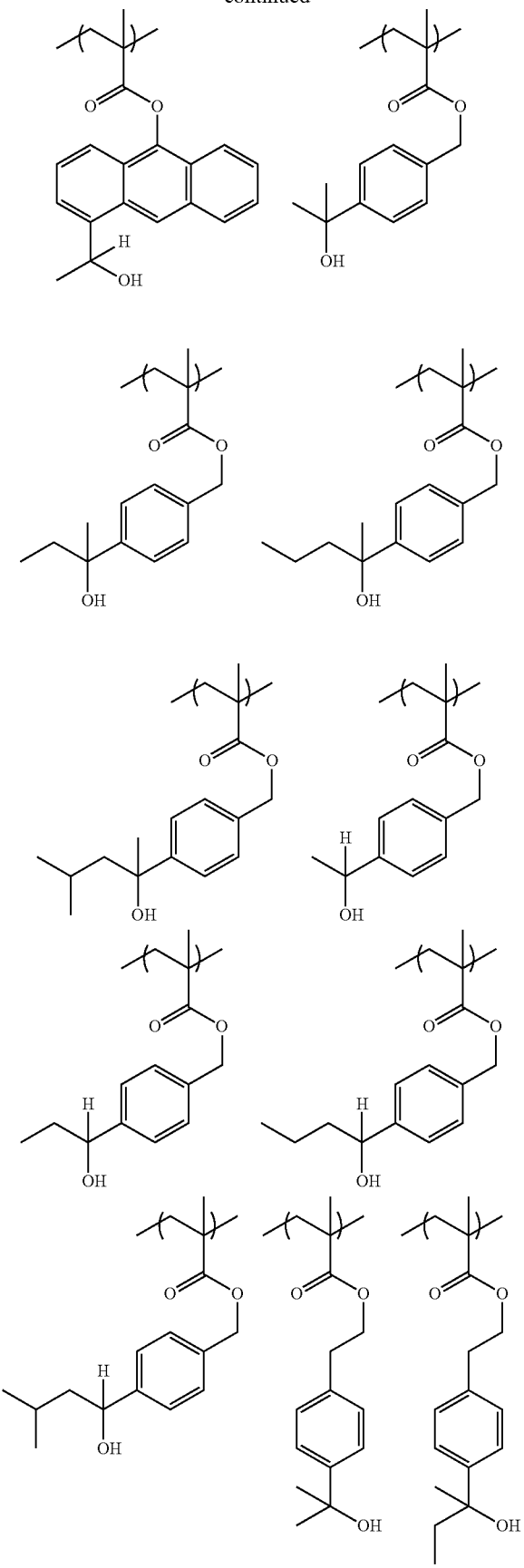
46
-continued
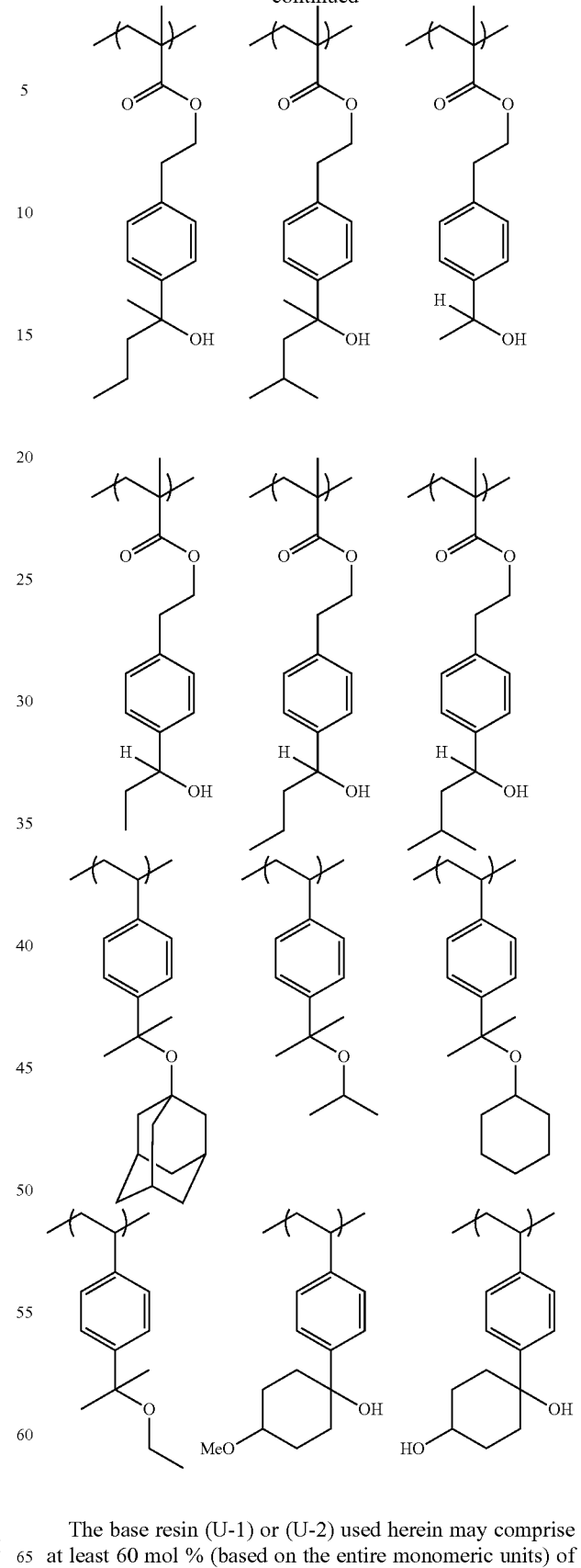
The base resin (U-1) or (U-2) used herein may comprise at least 60 mol % (based on the entire monomeric units) of recurring units of at least one type selected from formulae (3) and (4) and formulae (5), (6) and (7) as main constituent units because this range ensures to formulate a chemically amplified negative resist composition having satisfactory properties.

While the base resin (U-2) used herein comprises recurring units of at least one type selected from formulae (3) to (7), it may further comprise recurring units of at least one type selected from the following formulae (a1), (a2), and (a3). In this case, a resin comprising recurring units of at least one type selected from formulae (3) to (7), but not recurring units of formulae (a1) to (a3) may be used in combination. In the base resin (U-2), preferably recurring units of at least one type selected from formulae (a1) to (a3) account for 0.5 to 20 mol %, and recurring units of at least one type selected from formulae (3) to (7) account for 60 to 99.5 mol % based on the entire recurring units.

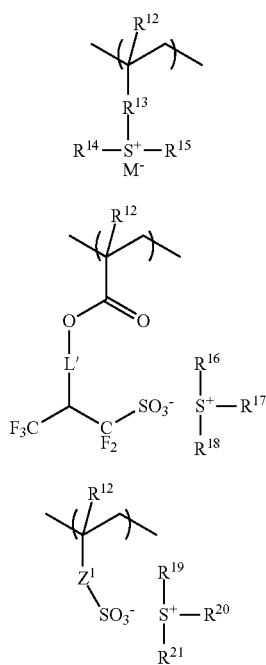

In formulae (a1) to (a3), $R^{12}$ is each independently hydrogen or methyl. $R^{13}$ is a single bond, phenylene group, —O—$R^{22}$—, or —C(=O)—$Z^2$—$R^{22}$—, wherein $Z^2$ is oxygen or NH, and $R^{22}$ is a straight, branched or cyclic $C_1$-$C_6$ alkylene, alkenylene or phenylene group which may contain a carbonyl (—CO—), ester (—COO—), ether (—O—) or hydroxyl moiety. L' is a single bond or —$Z^3$—C(=O)—O—, wherein $Z^3$ is a straight, branched or cyclic $C_1$-$C_{20}$ divalent hydrocarbon group which may be substituted with a heteroatom. $Z^1$ is a single bond, methylene, ethylene, phenylene, fluorinated phenylene, —O—$R^{23}$—, or —C(=O)—$Z^4$—$R^{23}$—, wherein $Z^4$ is oxygen or NH, and $R^{23}$ is a straight, branched or cyclic $C_1$-$C_6$ alkylene, alkenylene or phenylene group which may contain a carbonyl, ester, ether or hydroxyl moiety. $M^-$ is a non-nucleophilic counter ion. $R^{14}$, $R^{15}$, $R^{16}$, $R^{17}$, $R^{18}$, $R^{19}$, $R^{20}$, and $R^{21}$ are each independently a straight $C_1$-$C_{20}$, branched or cyclic $C_3$-$C_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene. $R^{14}$ and $R^{15}$ may bond together to form a ring with the sulfur atom, or any two or more of $R^{16}$, $R^{17}$ and $R^{13}$ or any two or more of $R^{19}$, $R^{20}$ and $R^{21}$ may bond together to form a ring with the sulfur atom.

In formula (a2) wherein L' is —$Z^3$—C(=O)—O—, $Z^3$ is a straight, branched or cyclic $C_1$-$C_{20}$ divalent hydrocarbon group which may be substituted with a heteroatom. Illustrative, non-limiting examples of the hydrocarbon group $Z^3$ are given below.

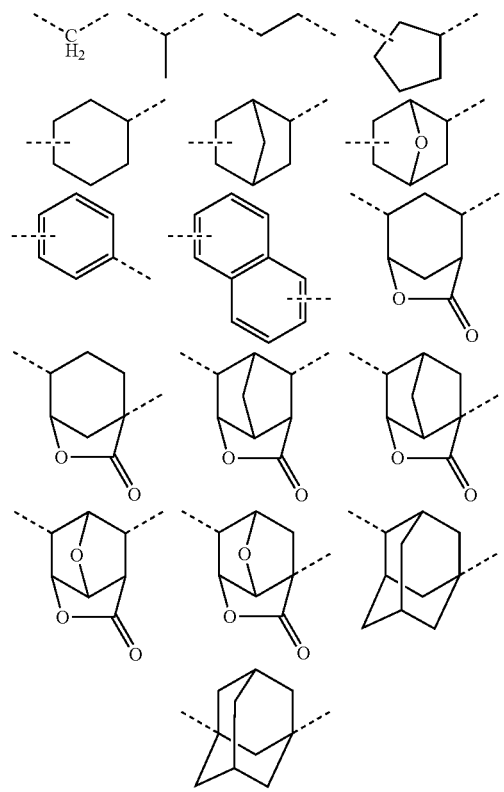

Where $R^{14}$ and $R^{15}$ bond together to form a ring with the sulfur atom, or where any two or more of $R^{16}$, $R^{17}$ and $R^{18}$ or any two or more of $R^{19}$, $R^{20}$ and $R^{21}$ bond together to form a ring with the sulfur atom, exemplary ring structures are shown below.

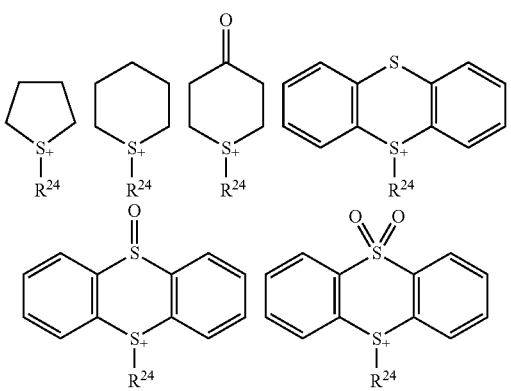

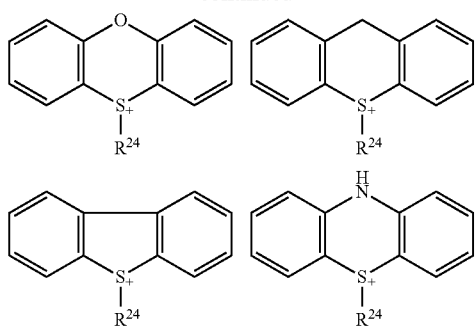
It is noted that $R^{24}$ is the same as defined and exemplified for $R^{14}$ to $R^{21}$.
Examples of the sulfonium cation in formulae (a2) and (a3) are shown below, but not limited thereto.
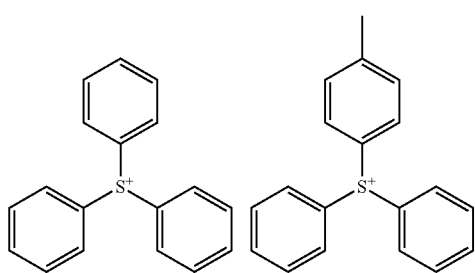
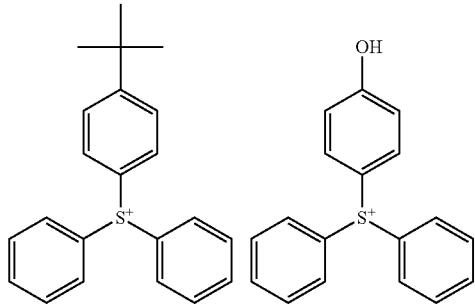
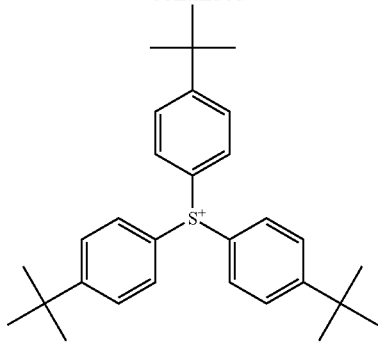
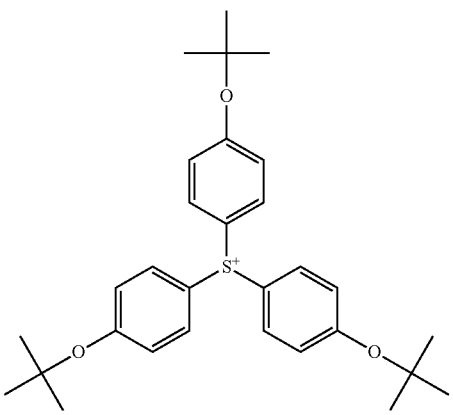
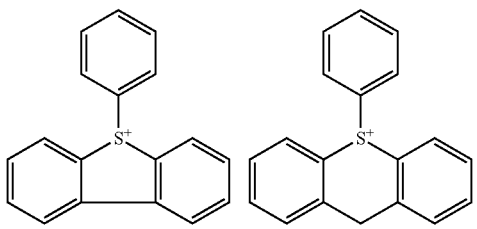
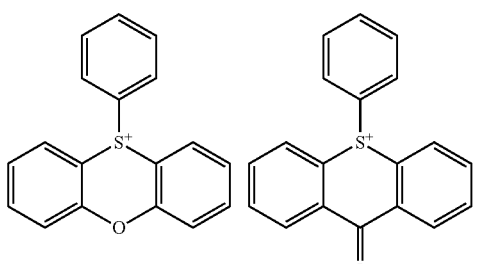
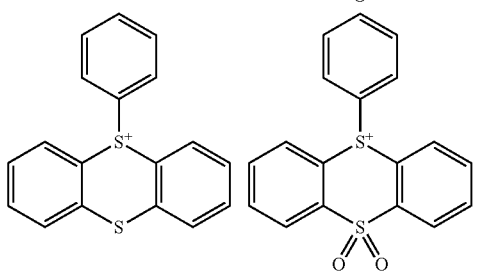

-continued

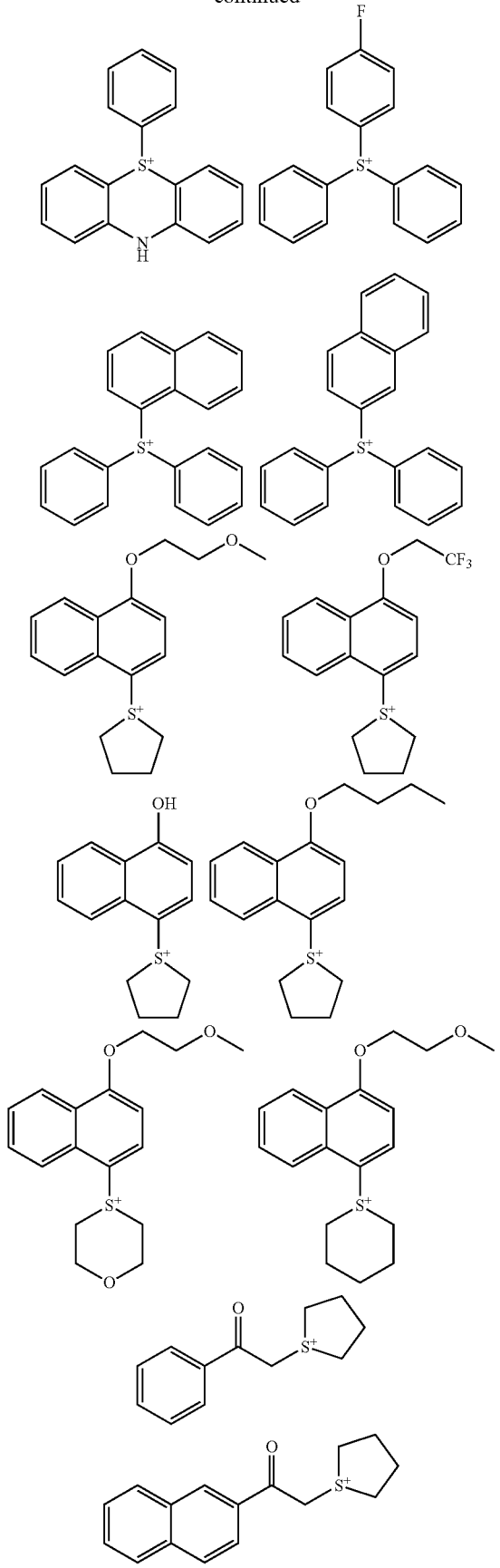

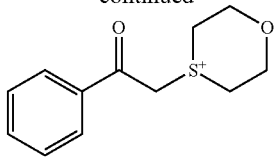

-continued

The units of formulae (a1), (a2) and (a3) are units capable of generating an acid upon receipt of high-energy radiation. With the relevant units bound into a polymer, an appropriate control of acid diffusion becomes possible, and a pattern with minimal LER can be formed. Since the acid-generating unit is bound to a polymer, the phenomenon that acid volatilizes from the exposed region and re-deposits on the unexposed region during bake in vacuum is suppressed. This is effective for reducing LER and for suppressing unwanted negative tone reaction in the unexposed region for thereby reducing defects. The content of units of formulae (a1) to (a3) is preferably 0.5 to 20 mol % based on the entire recurring units.

In the resin (U-1) or (U-2) comprising recurring units as defined above, (meth)acrylate and other recurring units having an adhesive group such as lactone structure may be incorporated for fine adjustment of properties of a resist film, though they are optional.

Preferably, the resin (U-1) comprises, based on the entire recurring units, 50 to 95 mol %, more preferably 70 to 85 mol % of recurring units having formula (3), 0 to 30 mol %, more preferably 3 to 20 mol % of recurring units having formula (5) to (7), and 0 to 20 mol %, more preferably 0 to 10 mol % of other recurring units.

Preferably, the resin (U-2) comprises, based on the entire recurring units, 25 to 94.5 mol %, more preferably 36 to 85 mol % of recurring units having formula (3), 5 to 70 mol %, more preferably 10 to 60 mol % of recurring units having formula (4), 0 to 30 mol %, more preferably 3 to 20 mol % of recurring units having formula (5) to (7), 0.5 to 20 mol %, more preferably 1 to 10 mol % of recurring units having formula (a1) to (a3), and 0 to 20 mol %, more preferably 0 to 10 mol % of other recurring units.

Where a polymer free of recurring units having formula (a1) to (a3) is used, it is preferably a polymer comprising 25 to 95 mol %, more preferably 40 to 85 mol % of recurring units having formula (3), 5 to 70 mol %, more preferably 10 to 60 mol % of recurring units having formula (4), 0 to 30 mol %, more preferably 3 to 20 mol % of recurring units having formula (5) to (7), and 0 to 20 mol %, more preferably 0 to 10 mol % of other recurring units. Where a polymer free of recurring units having formula (a1) to (a3) is used, it is preferably added in an amount of 2 to 5,000 parts, more preferably 10 to 1,000 parts by weight per 100 parts by weight of the base resin (U-2).

The base resin used herein may be prepared by any well-known techniques, by selecting suitable monomers and effecting copolymerization while optionally combining protection and deprotection reactions. The copolymerization reaction is preferably radical or anionic polymerization though not limited thereto. Reference may be made to WO 2006/121096, JP-A 2008-102383, JP-A 2008-304590, and JP-A 2004-115630, for example.

The base resin used herein preferably has a weight average molecular weight (Mw) of 2,000 to 50,000, and more preferably 3,000 to 20,000, as measured by GPC using polystyrene standards. As is well known in the art, a resin with a Mw of at least 2,000 avoids the phenomenon that a pattern is rounded at the top, reduced in resolution, and degraded in LER. If Mw is higher than the necessity, there is a tendency of increasing LER, depending on a particular pattern to be resolved. Thus the resin is preferably controlled to a Mw of up to 50,000, and more preferably to a Mw of up to 20,000 particularly when a pattern with a line width of up to 100 nm is to be formed. Notably, the GPC measurement may use tetrahydrofuran (THF) solvent as commonly used.

The base resin should preferably have a narrow dispersity (Mw/Mn) of 1.0 to 2.0, especially 1.0 to 1.8. A resin with narrow dispersity avoids the phenomenon that foreign particles are left on the pattern after development or the pattern is degraded in profile.

The negative resist composition may further comprising (D) a polymer comprising recurring units having the formula (8) and fluorine-containing recurring units of at least one type selected from the formulae (9), (10), (11) and (12) for the purposes of preventing the chemical flare of acid upon exposure to high-energy radiation, preventing mixing of acid from an anti-charging film to the resist film, and suppressing unexpected unnecessary negative working reaction. In addition, the additive polymer (D) functions to increase the dissolution rate of the unexposed region of resist film in alkaline developer and is thus effective for reducing development defects.

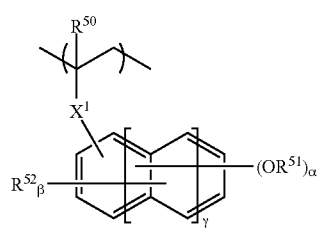

(8)

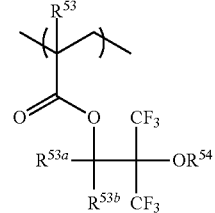

(9)

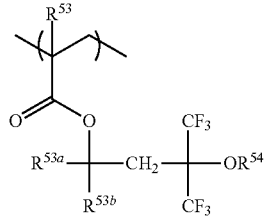

(10)

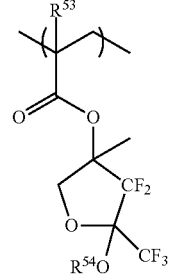

(11)

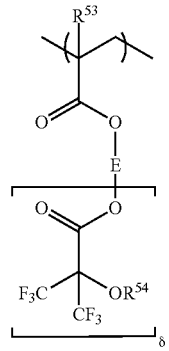

(12)

Herein $R^{50}$ is hydrogen or methyl. $R^{51}$ is hydrogen or a straight or branched $C_1$-$C_5$ monovalent hydrocarbon group which may be separated by a heteroatom. $R^{52}$ is a straight or branched $C_1$-$C_5$ monovalent hydrocarbon group which may be separated by a heteroatom. $R^{53}$ is each independently hydrogen, fluorine, methyl or trifluoromethyl. $R^{53a}$ and $R^{53b}$ are each independently hydrogen or a straight, branched or cyclic $C_1$-$C_{10}$ alkyl group. $R^{54}$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^{54}$, an ether bond (—O—) or carbonyl moiety (—C(=O)—) may intervene in a carbon-carbon bond. The subscript $\alpha$ is an integer of 1 to 3, $\beta$ is an integer satisfying $0 \le \beta \le 5+2\gamma-\alpha$, $\gamma$ is 0 or 1, and $\delta$ is an integer of 1 to 3. $X^1$ is a single bond, —C(=O)O— or —C(=O)NH—. E is a straight, branched or cyclic $C_1$-$C_{20}$ ($\delta$+1)-valent hydrocarbon or fluorinated hydrocarbon group.

Exemplary of the hydrocarbon groups are alkyl, alkenyl and alkynyl groups, with alkyl groups being preferred. Suitable alkyl groups include methyl, ethyl, n-propyl, isopropyl, n-butyl, isobutyl, sec-butyl, and n-pentyl. A heteroatom such as oxygen, sulfur or nitrogen may intervene in a carbon-carbon bond in the group.

In formula (8), —$OR^{51}$ is preferably a hydrophilic group. In this sense, $R^{51}$ is preferably hydrogen or a $C_1$-$C_5$ alkyl group having an oxygen atom intervening in a carbon-carbon bond.

Examples of the recurring unit having formula (8) are shown below, but not limited thereto.

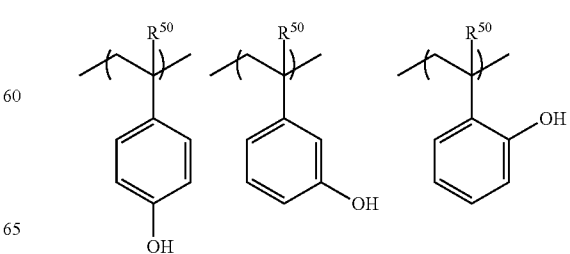

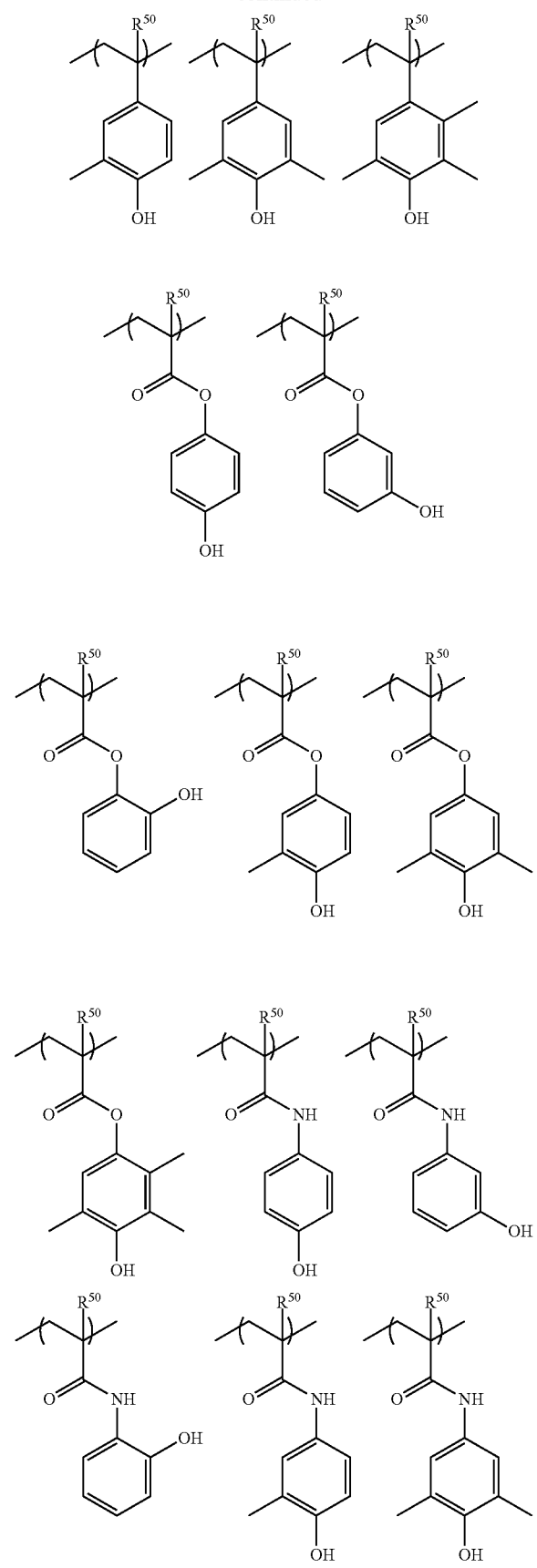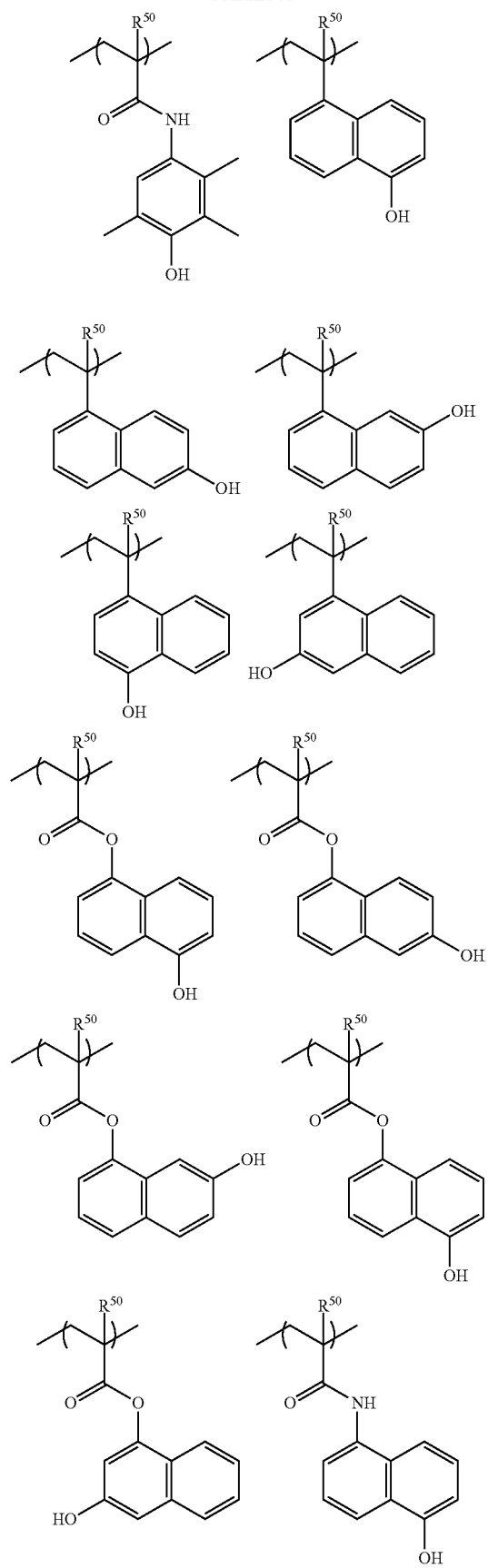

57

-continued

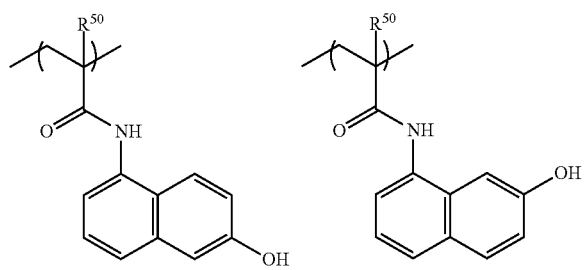

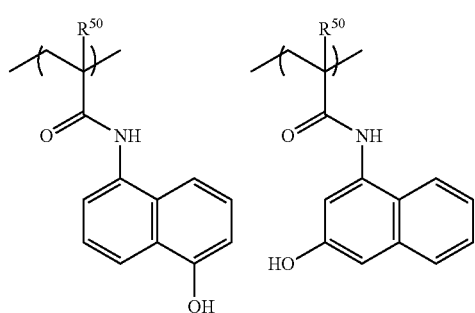

Herein $R^{50}$ is as defined above.

In formula (8), $X^1$ is preferably —C(=O)O— or —C(=O)NH— rather than a single bond. Also preferably $R^{50}$ is hydrogen or methyl. The inclusion of carbonyl in $X^1$ serves to improve the resist film's ability of trapping the acid originating from the anti-charging film. The polymer of formula (8) wherein $R^{50}$ is methyl is a rigid polymer having a higher glass transition temperature (Tg), which is more effective for suppressing acid diffusion. As a result, the age stability of the resist film is improved, and the resolution and pattern profile are not degraded.

The recurring units having at least one fluorine atom are preferably units of at least one type selected from units having the formulae (9) to (12).

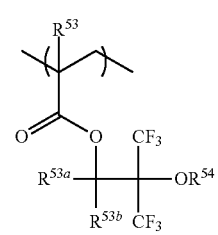

(9)

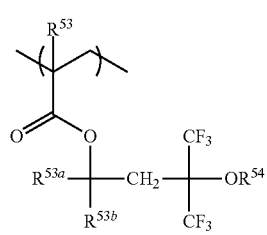

(10)

58

-continued

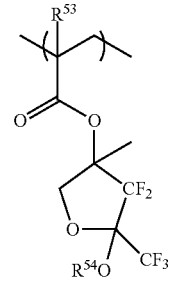

(11)

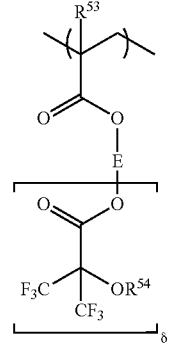

(12)

Herein $R^{53}$ is each independently hydrogen, fluorine, methyl or trifluoromethyl. $R^{53a}$ and $R^{53b}$ are each independently hydrogen or a straight, branched or cyclic $C_1$-$C_{10}$ alkyl group. $R^{54}$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^{54}$, an ether bond (—O—) or carbonyl moiety (—C(=O)—) may intervene in a carbon-carbon bond. E is a (δ+1)-valent, straight, branched or cyclic $C_1$-$C_{20}$ hydrocarbon or fluorinated hydrocarbon group, and δ is an integer of 1 to 3.

Examples of the straight, branched or cyclic $C_1$-$C_{10}$ alkyl group include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, adamantyl, and norbornyl. Inter alia, straight, branched or cyclic $C_1$-$C_6$ alkyl groups are preferred.

Examples of the straight, branched or cyclic $C_1$-$C_{15}$ monovalent hydrocarbon group include alkyl, alkenyl and alkynyl groups, with alkyl groups being preferred. Examples of the alkyl group include n-undecyl, n-dodecyl, tridecyl, tetradecyl, and pentadecyl as well as those mentioned above. Examples of the straight, branched or cyclic $C_1$-$C_{15}$ monovalent fluorinated hydrocarbon group include the foregoing monovalent hydrocarbon groups in which some or all carbon-bonded hydrogen atoms are substituted by fluorine atoms.

Examples of the straight, branched or cyclic $C_1$-$C_{20}$ (δ+1)-valent hydrocarbon or fluorinated hydrocarbon group include the foregoing exemplary monovalent hydrocarbon and fluorinated hydrocarbon groups, with a number "δ" of hydrogen atoms being eliminated.

Examples of the recurring units having formulae (9) to (12) are given below, but not limited thereto.

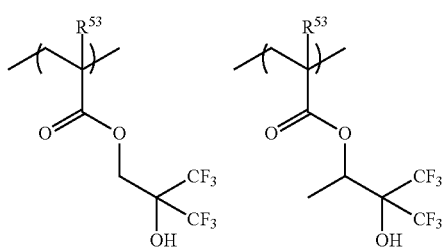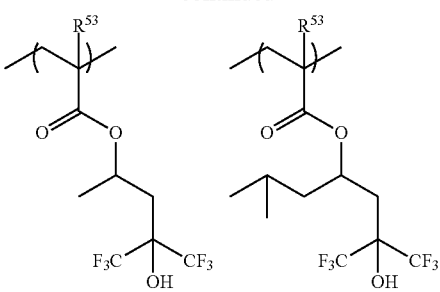
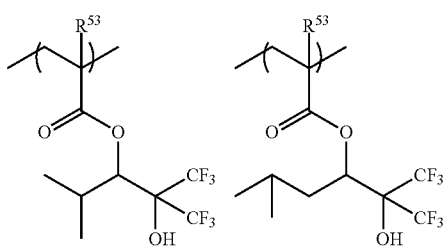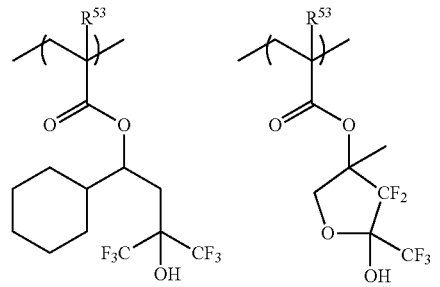
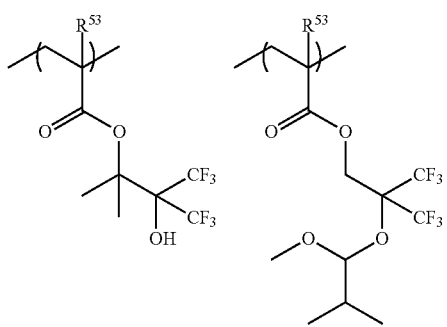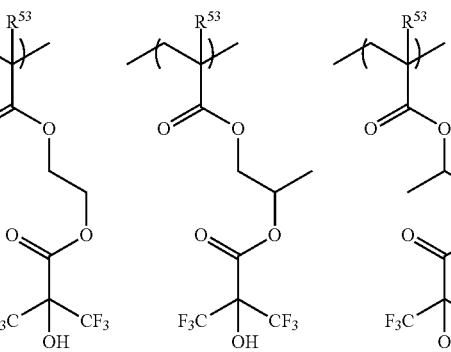
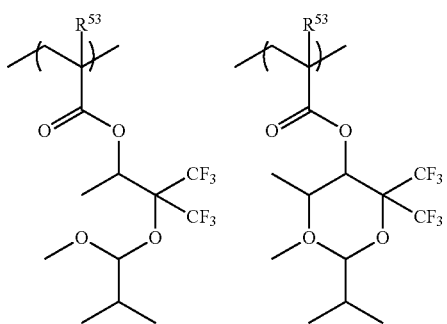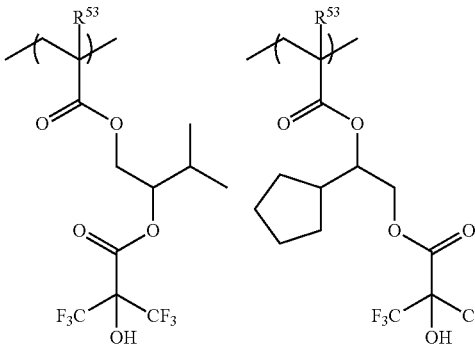
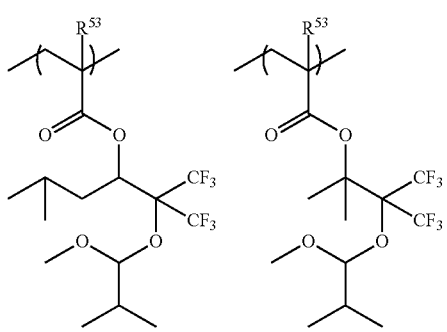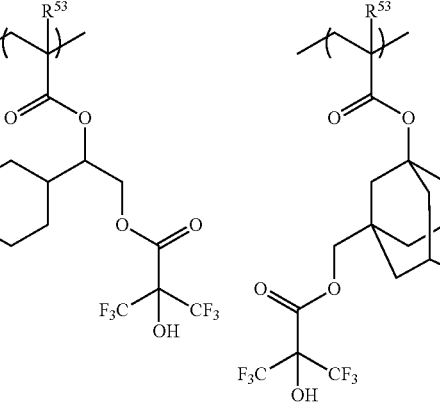

-continued

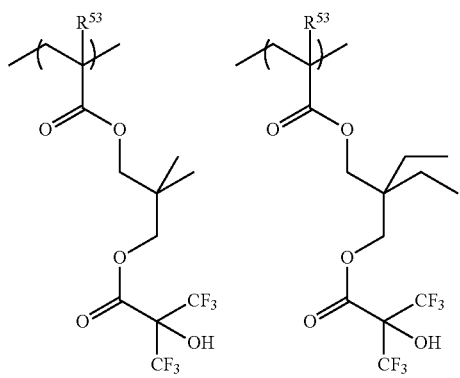

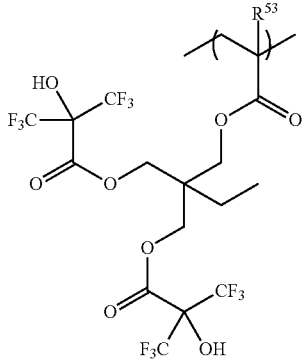

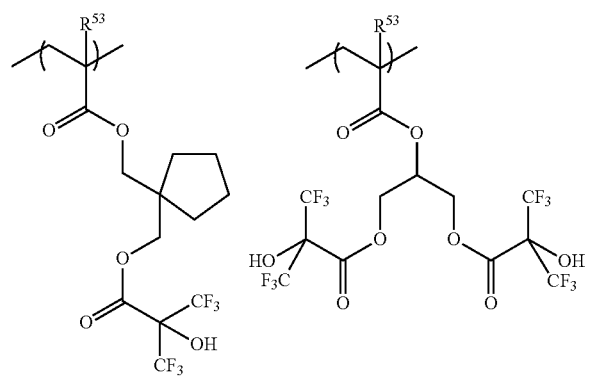

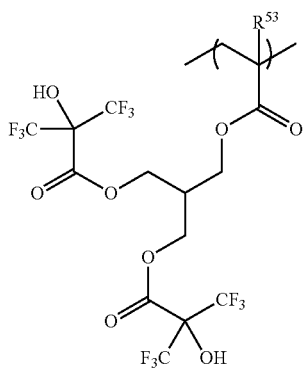

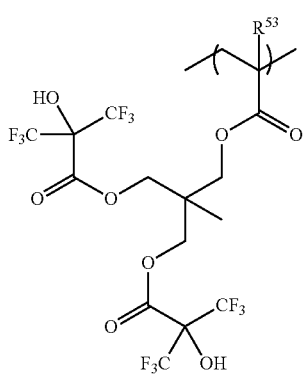

Herein $R^{53}$ is as defined above.

In the polymer (D), the recurring units of formula (8) are preferably incorporated in an amount of 5 to 80 mol %, more preferably 15 to 70 mol % based on the entire recurring units. The recurring units of formulae (9) to (12) may be of a single type or a combination of two or more types, and are preferably incorporated in an amount of 20 to 95 mol %, more preferably 30 to 85 mol % based on the entire recurring units.

Besides the foregoing recurring units, the polymer (D) may comprise other recurring units. Other recurring units include those described in JP-A 2014-177407, paragraphs [0046] to [0078](U.S. Pat. No. 9,091,918). The other recurring units are preferably included in an amount of up to 50 mol % based on the entire recurring units.

The polymer (D) may be obtained by combining suitable monomers and copolymerizing them in the standard way while protection and deprotection reactions are combined if necessary. The copolymerization reaction is preferably radical polymerization or anionic polymerization though not limited thereto. For the polymerization reaction, reference may be made to JP-A 2004-115630.

The polymer (D) should preferably have a weight average molecular weight (Mw) of 2,000 to 50,000, and more preferably 3,000 to 20,000. If Mw is less than 2,000, the polymer may help acid diffusion, detracting from resolution and age stability. With too much Mw, the polymer may have a low solubility in solvents and can generate coating defects.

The polymer (D) preferably has a molecular weight distribution or dispersity (Mw/Mn) of 1.0 to 2.2, more preferably 1.0 to 1.7.

The polymer (D) is preferably added in an amount of 0.01 to 30 parts by weight, and more preferably 0.1 to 20 parts by weight per 100 parts by weight of the base resin (U-1) or (U-2) as component (B).

In the resist composition, an acid generator is preferably added in order that the composition perform as a chemically amplified negative resist composition in the pattern forming process of the invention. The acid generator may be a compound (photoacid generator or PAG) which generates an acid in response to actinic ray or radiation. While the PAG used herein is not particularly limited, suitable PAGs include sulfonium salts, iodonium salts, sulfonyldiazomethane, N-sulfonyloxyimide, and oxime-O-sulfonate acid generators, which may be used alone or in admixture.

The acid generator is preferably used in an amount of 2 to 20 parts, more preferably 5 to 15 parts by weight per 100 parts by weight of the base resin (U-1) or (U-2). Understandably, in the resist composition comprising the base resin (U-2), the acid generator may be omitted.

Examples of the acid generator include those described in JP-A 2008-111103, paragraphs [0122] to [0142](U.S. Pat. No. 7,537,880). Of such exemplary acid generators, those of arylsulfonate type are preferred because they generate an acid having an appropriate strength to induce reaction of the polymer with a crosslinker (to be described below). Also the preferred PAG generates an acid having a pKa value in the range of −3.0 to 1.5, more preferably −1.0 to 1.5 because when the PAG is combined with the onium salt in the inventive resist composition, exchange reaction takes place between the generated acid and the onium salt to exert an LER improving effect.

The preferred PAGs are compounds having a sulfonium anion of the structure shown below while a pairing cation may be any of the exemplary cations listed above for the sulfonium cations having formulae (a2) and (a3).

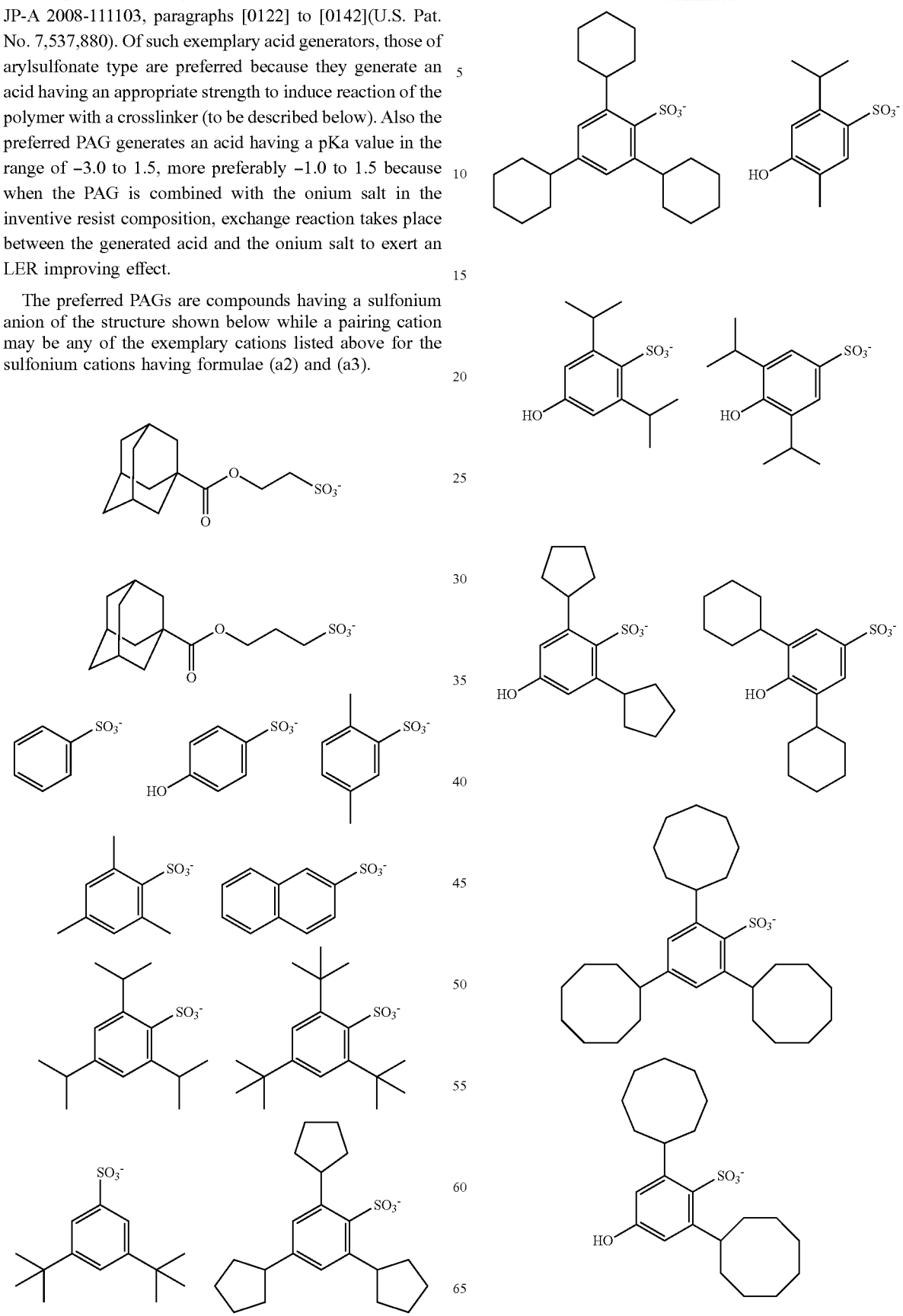

65
-continued
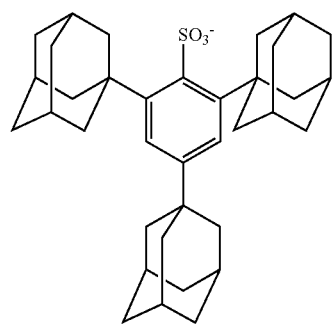
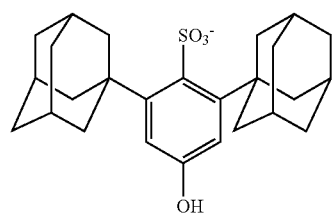
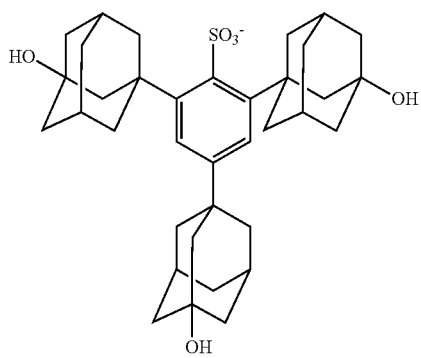
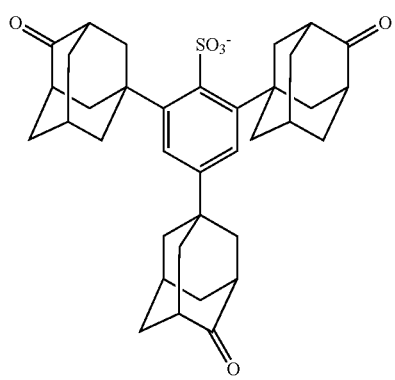
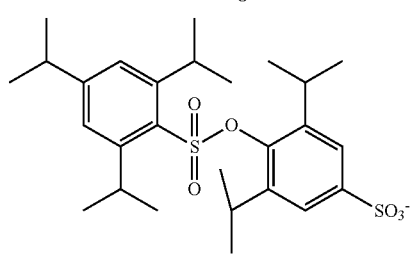
66
-continued
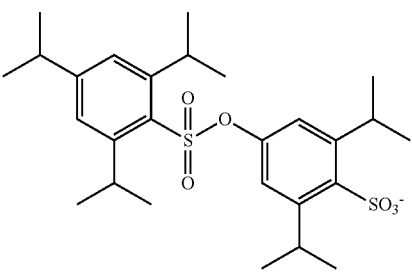
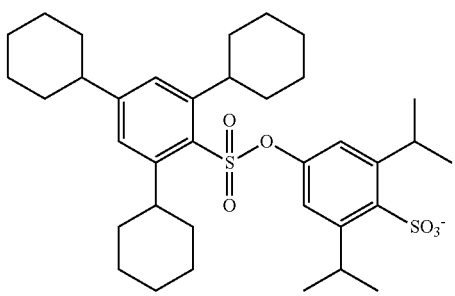
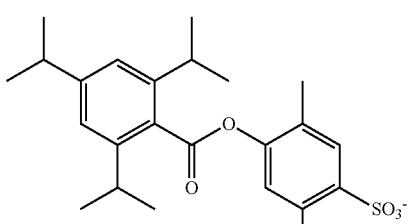
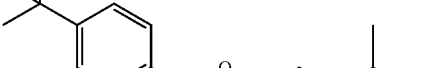

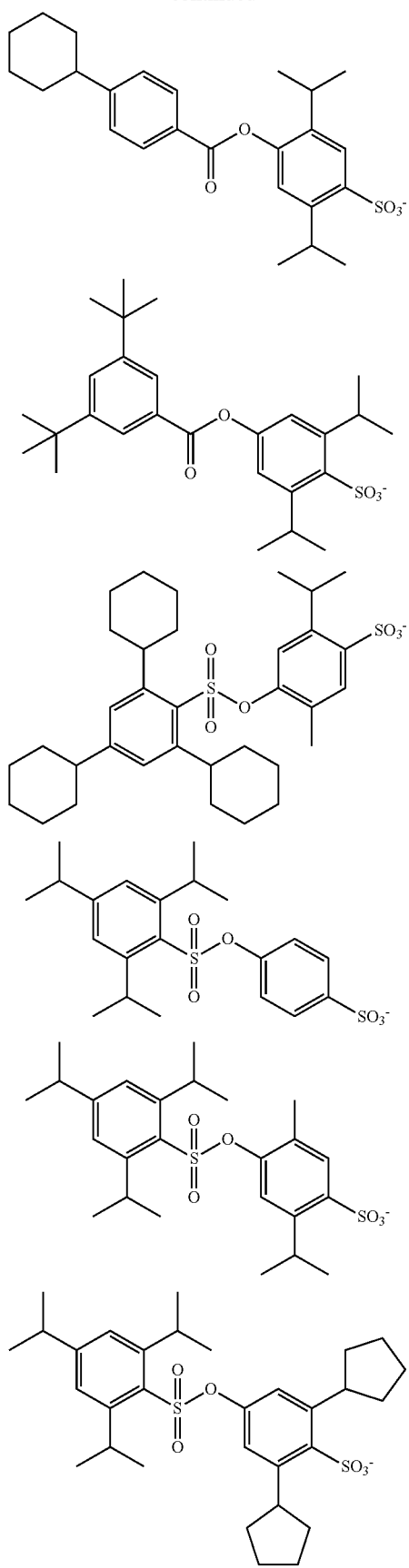
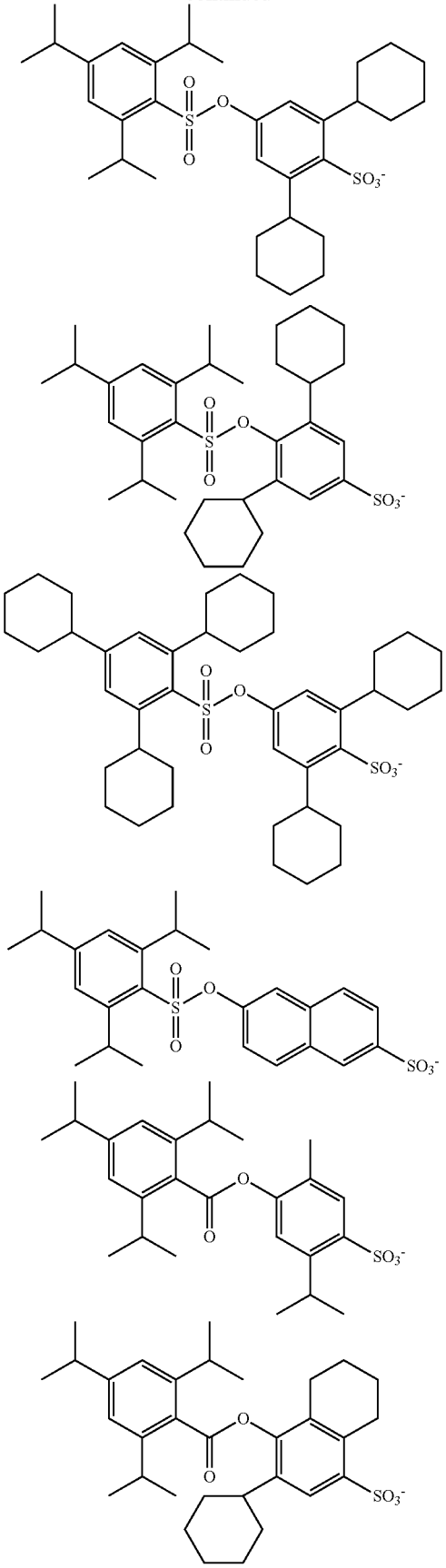

69
-continued
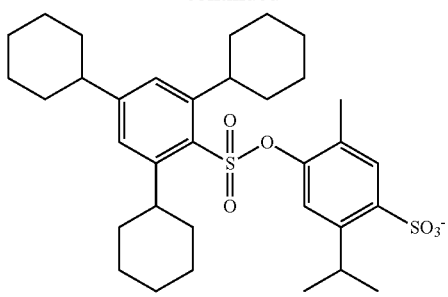
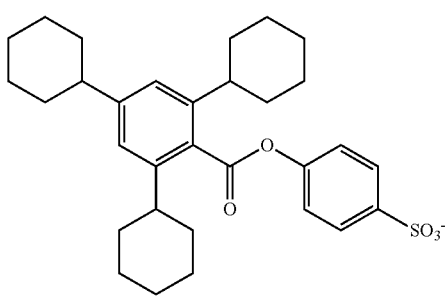
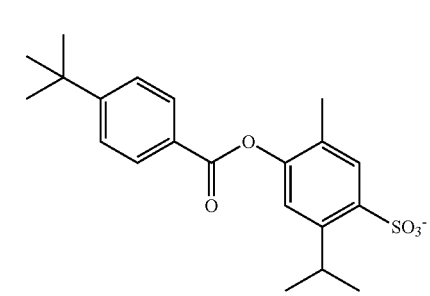
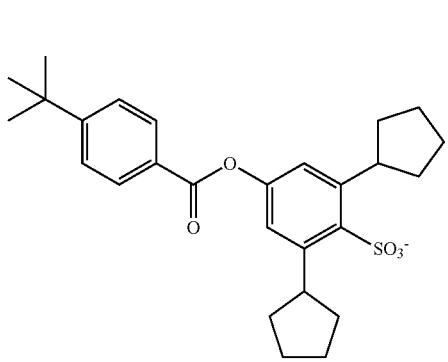
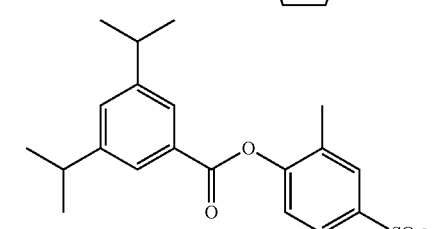
70
-continued
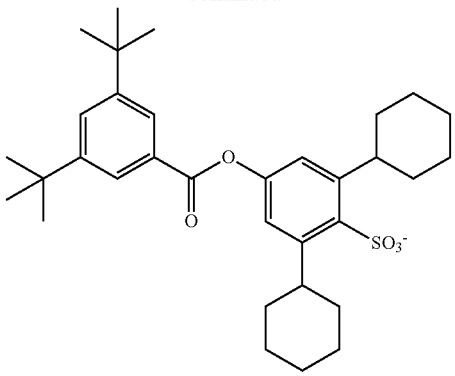
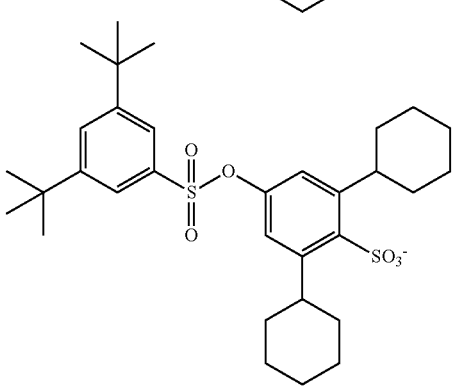
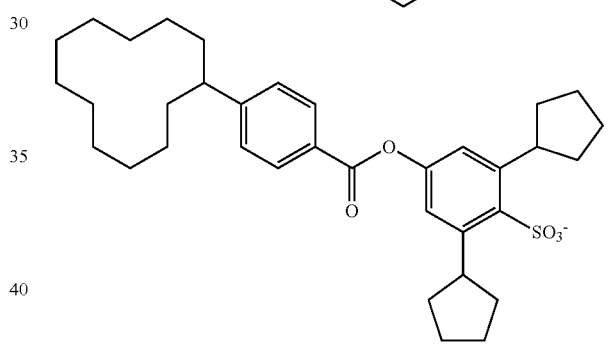
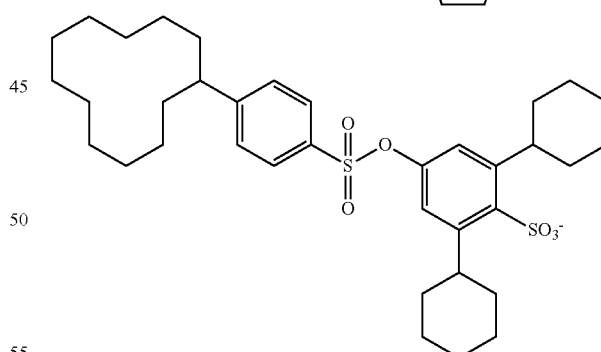
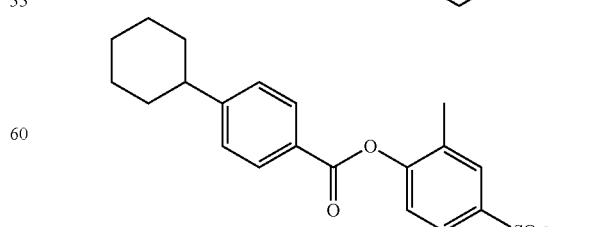

71
-continued
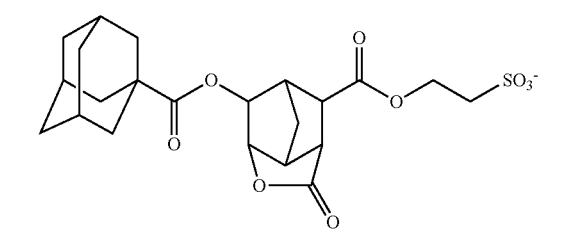
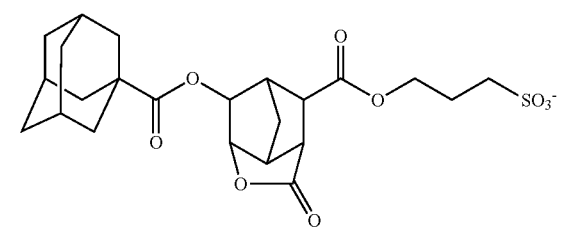
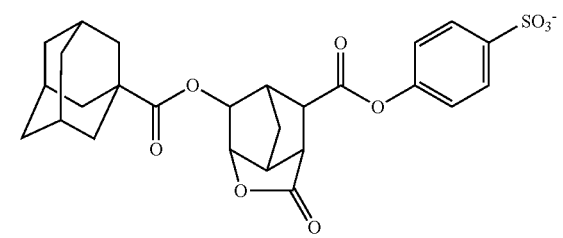
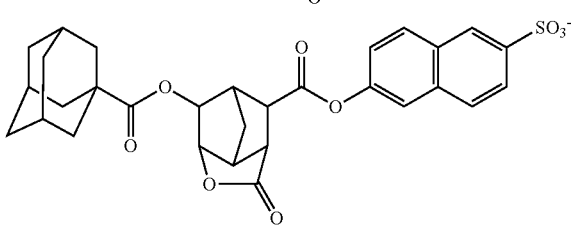
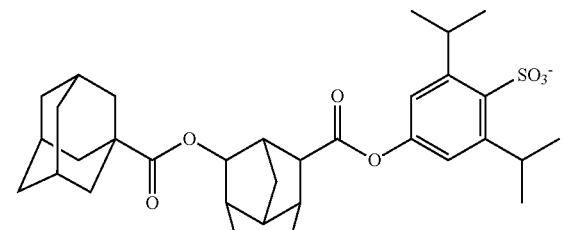
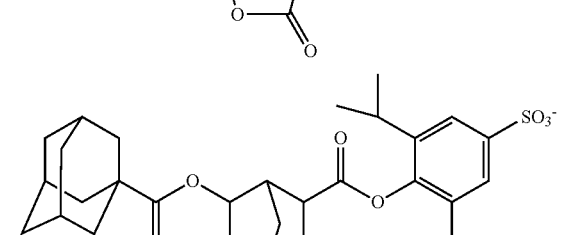
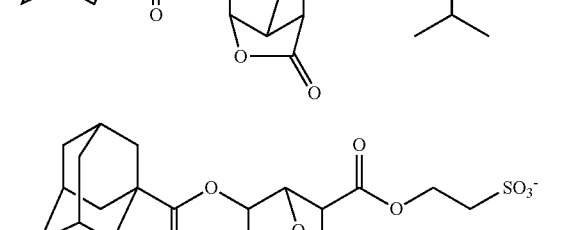
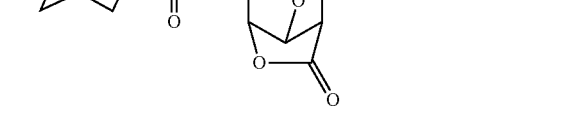
72
-continued
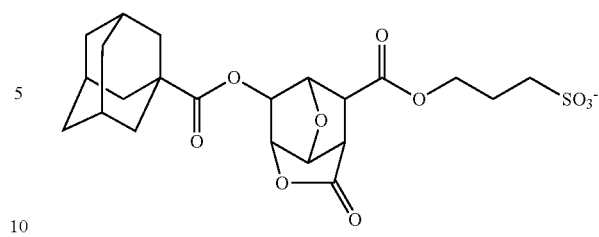
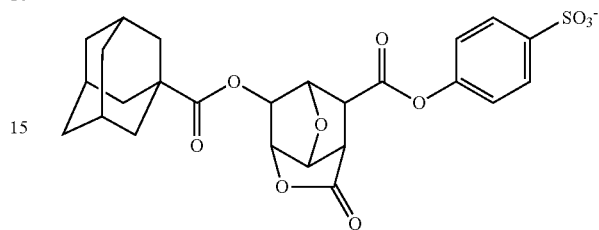
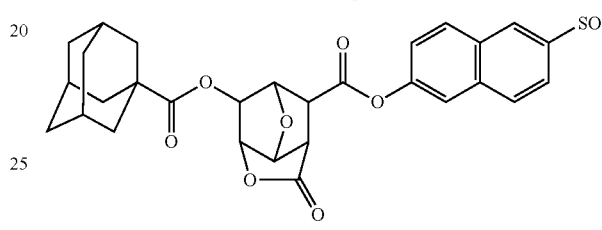
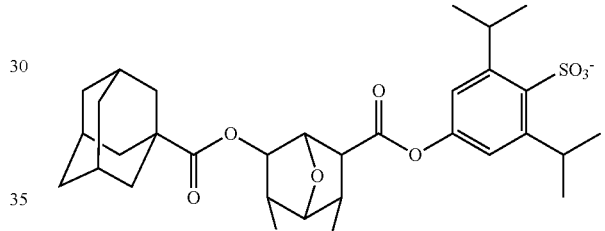
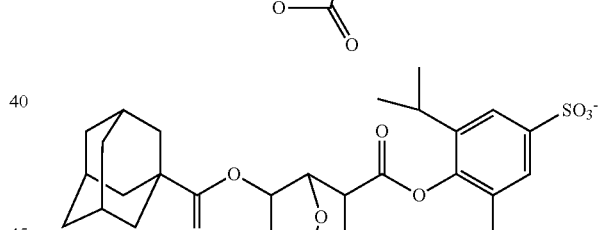
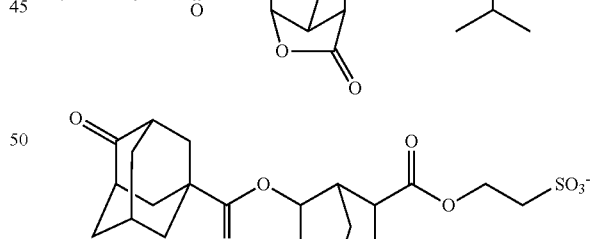
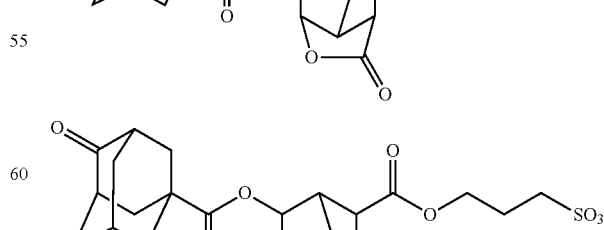
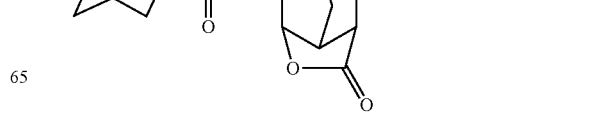

-continued

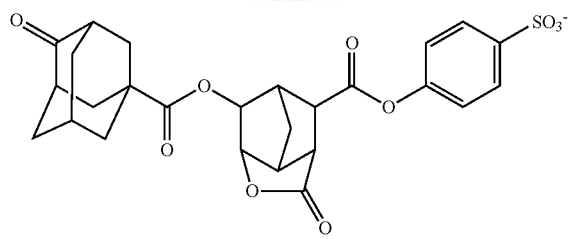
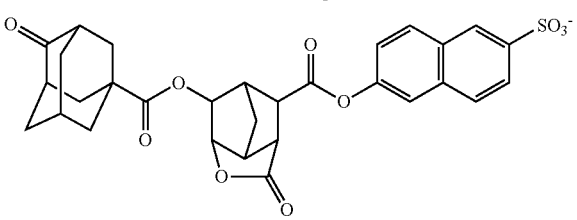
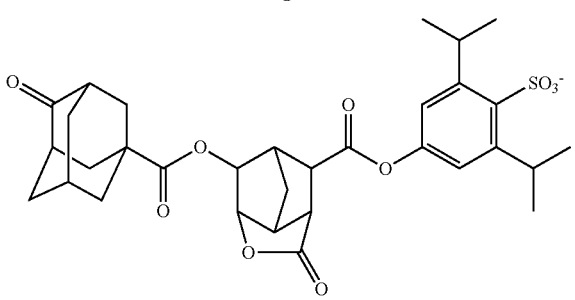
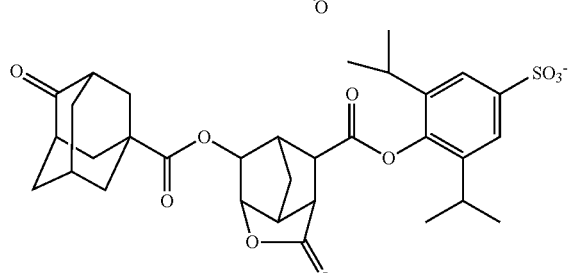
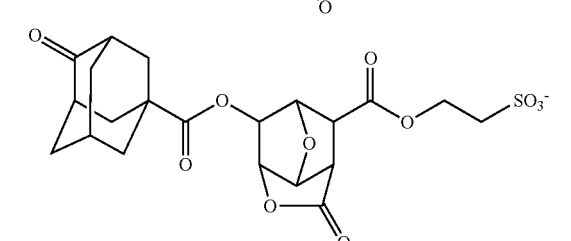
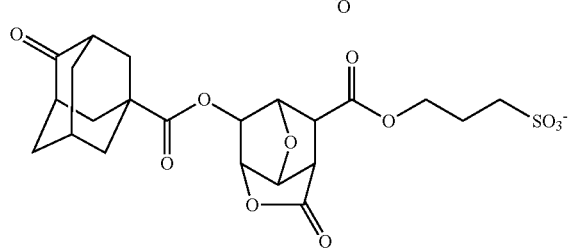
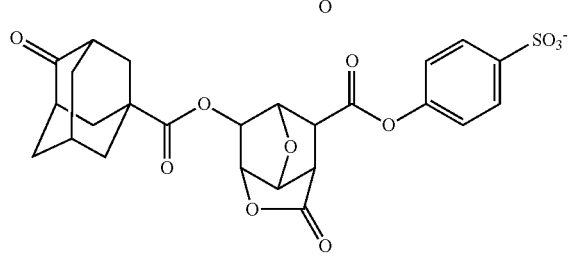

-continued

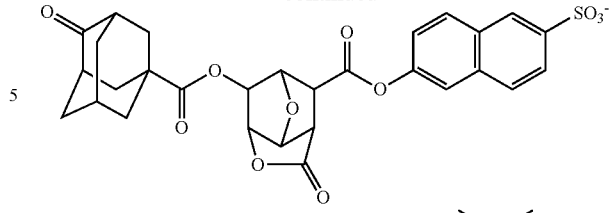
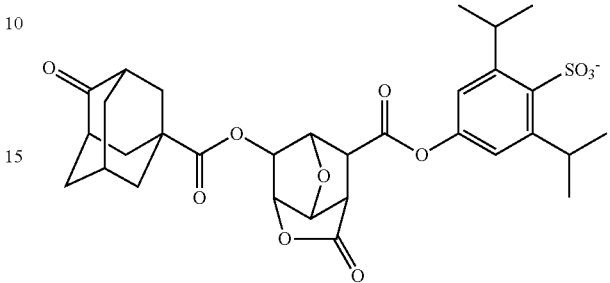
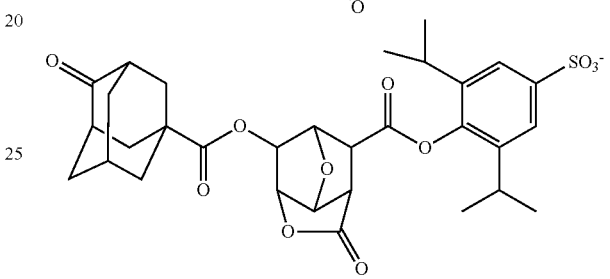

In the resist composition comprising the base resin (U-1), a crosslinker is added. In the resist composition comprising the base resin (U-2), preferably a crosslinker is omitted.

Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

These crosslinkers may be used alone or in admixture. An appropriate amount of the crosslinker used is 2 to 50 parts, and more preferably 5 to 30 parts by weight per 100 parts by weight of the base resin (U-1). As long as the amount of the crosslinker is up to 50 pbw, the risk of resolution being reduced by forming bridges between pattern features is mitigated.

In the resist composition, a basic compound may be added for the purpose of correcting a pattern profile or the like. The basic compound is effective for controlling acid diffusion. Even when the resist film is applied to a processable substrate having an outermost surface layer made of a chromium-containing material, the basic compound is effective for minimizing the influence of the acid generated in the resist film on the chromium-containing material. An appropriate amount of the basic compound added is 0.01 to 10 parts, and more preferably 0.05 to 5 parts by weight per 100 parts by weight of the base resin (U-1) or (U-2).

Numerous basic compounds are known useful including primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Examples are described in Patent Document 9, for example, and any such compounds are useful. The basic compounds may be used alone or in admixture. Of the foregoing basic compounds, preferred are tris[2-(methoxymethoxy)ethyl]amine, tris[2-(methoxymethoxy)ethyl]amine-N-oxide, morpholine derivatives and imidazole derivatives.

In the resist composition, any of surfactants commonly used for improving coating characteristics may be added as an optional component. Numerous surfactants are known in the art including those described in JP-A 2004-115630, for example. A choice may be made with reference to such patent documents. An appropriate amount of the surfactant used is 0 to 2 parts by weight per 100 parts by weight of the base resin.

Process

A further embodiment of the invention is a pattern forming process comprising the steps of applying the resist composition defined above onto a processable substrate to form a resist film thereon, exposing the resist film patternwise to high-energy radiation, and developing the resist film in an alkaline developer to form a resist pattern.

Pattern formation using the negative resist composition of the invention may be performed by well-known lithography processes. In general, the resist composition is first applied onto a processable substrate such as a substrate for IC fabrication (e.g., Si, $SiO_2$, SiN, SiON, TiN, WSi, BPSG, SOG, organic antireflective coating, etc.) or a substrate for mask circuit fabrication (e.g., Cr, CrO, CrON, MoSi, etc.) by a suitable coating technique such as spin coating. The coating is prebaked on a hot plate at a temperature of 60 to 150° C. for 1 to 20 minutes, preferably 80 to 140° C. for 1 to 10 minutes to form a resist film of 0.05 to 2.0 μm thick.

Then the resist film is exposed patternwise to high-energy radiation such as UV, deep UV, excimer laser, EB, EUV, x-ray, γ-ray or synchrotron radiation through a mask having a desired pattern or directly by beam writing. The exposure dose is preferably 1 to 200 $mJ/cm^2$, more preferably 10 to 100 $mJ/cm^2$ in the case of high-energy radiation or 1 to 300 $\mu C/cm^2$, more preferably 10 to 200 $\mu C/cm^2$ in the case of EB. The resist composition of the invention is especially effective on patternwise exposure to EUV or EB. The exposure may be performed by conventional lithography whereas the immersion lithography of holding a liquid between the mask and the resist film may be employed if desired. When the immersion lithography is applied, a protective film which is insoluble in water may be formed on the resist film.

The resist film is then baked (PEB) on a hot plate at 60 to 150° C. for 1 to 20 minutes, preferably 80 to 140° C. for 1 to 10 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

From the resist composition, a pattern with a high resolution and minimal LER may be formed. The resist composition is effectively applicable to a processable substrate, specifically a substrate having a surface layer of material to which a resist film is less adherent and which is likely to invite pattern stripping or pattern collapse, and particularly a substrate having sputter deposited thereon metallic chromium or a chromium compound containing at least one light element selected from oxygen, nitrogen and carbon or a substrate having an outermost surface layer of $SiO_x$. The invention is especially effective for pattern formation on a photomask blank.

EXAMPLE

Synthesis Examples, Examples, and Comparative Examples are given below by way of illustration and not by way of limitation. The average molecular weights including Mw and Mn are determined by GPC versus polystyrene standards, from which a dispersity (Mw/Mn) is computed. The compositional ratio of a copolymer is on a molar basis.

Synthesis Example 1-1

Synthesis of triphenylsulfonium indole-2-carboxylate (Salt-1)

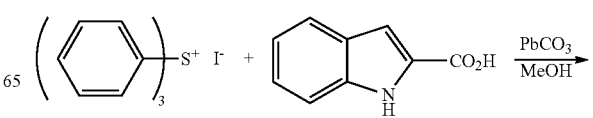

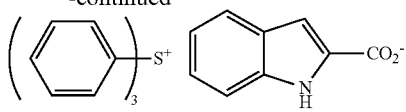

A solution of 2.4 g of indole-2-carboxylic acid, 2.0 g of lead carbonate, and 5.8 g of triphenylsulfonium iodide in 30 g of methanol was heated and stirred at 70° C. for 8 hours. The reaction solution was cooled to room temperature and filtered. The filtrate was concentrated under reduced pressure. The solid precipitate was washed with methyl isobutyl ketone and dried in vacuum, obtaining 4.8 g of the target compound, triphenylsulfonium indole-2-carboxylate. Yield 75%. The compound was analyzed by spectroscopy, with the data shown below.

IR (D-ATR): 3389, 3135, 3083, 3022, 1574, 1523, 1474, 1445, 1415, 1382, 1371, 1340, 1320, 1230, 995, 844, 826, 816, 765, 755, 748, 699, 683 cm$^{-1}$

Time-of-flight mass spectrometry (TOFMS, MALDI)
Positive M$^+$ 263 (corresponding to $(C_8H_5)_3S^+$)
Negative M$^-$ 160 (corresponding to $C_8H_6N$—$CO_2^-$)

Synthesis Example 1-2

Synthesis of triphenylsulfonium 4-morpholin-4-yl-benzoate (Salt-8)

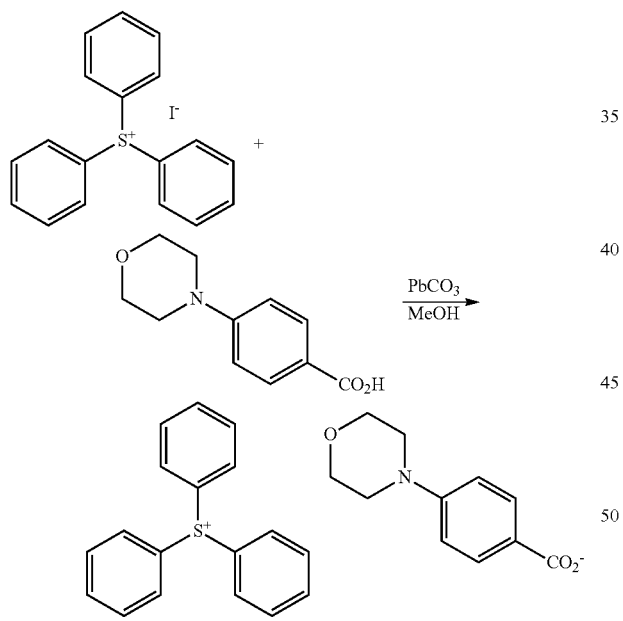

A solution of 3.1 g of 4-(4-morpholinyl)benzoic acid, 2.0 g of lead carbonate, and 5.8 g of triphenylsulfonium iodide in 30 g of methanol was heated and stirred at 70° C. for 8 hours. The reaction solution was cooled to room temperature and filtered. The filtrate was concentrated under reduced pressure. The solid precipitate was washed with methyl isobutyl ketone and dried in vacuum, obtaining 5.8 g of the target compound, triphenylsulfonium 4-morpholin-4-yl-benzoate. Yield 83%. The spectroscopic data of the compound are shown below. FIG. 1 is NMR spectrum ($^1$H-NMR/DMSO-d6). In $^1$H-NMR spectroscopy, a trace of water was observed.

IR (D-ATR): 3351, 3082, 3038, 3009, 2995, 2861, 2826, 1601, 1549, 1510, 1478, 1449, 1364, 1347, 1235, 1118, 995, 927, 792, 759, 703, 687, 658 cm$^{-1}$

LC-MS
Positive M$^+$ 263 (corresponding to $(C_8H_5)_3S^+$)
Negative M$^-$ 206 (corresponding to $C_{10}H_{12}NO$—$CO_2^-$)

Salt-2 to Salt-7 and Salt-9 to Salt-13 were synthesized by the same procedure as above.

Synthesis Example 2-1

Synthesis of Polymer 1

A 3-L flask was charged with 314.4 g of 5-acetoxyacenaphthylene, 22.0 g of 4-chlorostyrene, 190.7 g of indene, and 675 g of toluene as solvent. The reactor was cooled at −70° C. in a nitrogen atmosphere, after which vacuum pumping and nitrogen flow were repeated three times. The reactor was warmed up to room temperature, whereupon 40.5 g of 2,2'-azobis(2,4-dimethylvaleronitrile) (V-65 by Wako Pure Chemical Industries, Ltd.) was added as polymerization initiator. The reactor was heated at 45° C., whereupon reaction ran for 20 hours. The temperature was raised to 55° C., at which reaction ran for a further 20 hours. The reaction solution was concentrated to ½ in volume and poured into 15.0 L of methanol for precipitation. The white solid was filtered and dried in vacuum at 40° C., yielding 309 g of a white polymer.

The polymer was dissolved in 488 g of methanol and 540 g of tetrahydrofuran again, to which 162 g of triethylamine and 32 g of water were added. The solution was kept at 60° C. for 40 hours for deprotection reaction to take place. The reaction solution was concentrated, and dissolved in 870 g of ethyl acetate. The solution was subjected to once neutralization/separatory washing with a mixture of 250 g water and 98 g acetic acid, once separatory washing with a mixture of 225 g water and 75 g pyridine, and 4 times separatory washing with 225 g water. Thereafter, the upper layer or ethyl acetate solution was concentrated, dissolved in 250 g of acetone, and poured into 15 L of water for precipitation. The precipitate was filtered and dried in vacuum at 50° C. for 40 hours, yielding 223 g of a white polymer. The polymer, designated Polymer 1, was analyzed by $^{13}$C-NMR, $^1$H-NMR and GPC, with the results shown below.

Copolymer Compositional Ratio

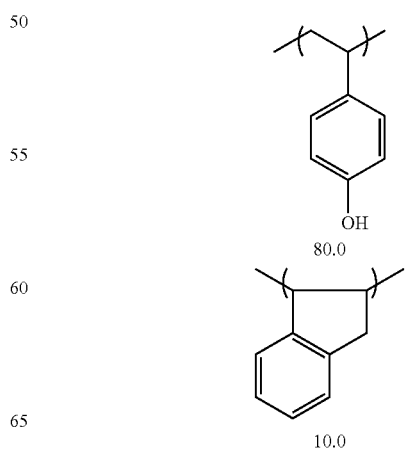

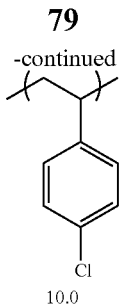

10.0

Mw=4,500
Mw/Mn=1.65

Synthesis Example 2-2

Synthesis of Polymer 8

In nitrogen atmosphere, 890 g of 50.0 wt % PGMEA solution of 4-hydroxystyrene, 47.7 g of acenaphthylene, 310 g of 54.7 wt % PGMEA solution of 4-(2-hydroxy-2-propyl) styrene, 87.0 g of triphenylsulfonium 1,1,3,3,3-pentafluoro-2-methacryloyl-oxypropane-1-sulfonate, 96.1 g of dimethyl 2,2'-azobis(2-methylpropionate) (V-601 by Wako Pure Chemical Industries, Ltd.), and 360 g of γ-butyrolactone and 220 g of PGMEA as solvent were fed into a 3000-mL dropping cylinder to form a monomer solution. In nitrogen atmosphere, a 5000-mL polymerization flask was charged with 580 g of γ-butyrolactone, which was heated at 80° C. The monomer solution was added dropwise from the dropping cylinder to the flask over 4 hours. After the completion of dropwise addition, the polymerization solution was continuously stirred for 18 hours while maintaining its temperature at 80° C. The polymerization solution was cooled to room temperature and added dropwise to 22.5 kg of diisopropyl ether whereupon the copolymer agglomerated. Diisopropyl ether was decanted off, and the copolymer was dissolved in 2,250 g of acetone. The acetone solution was added dropwise to 22.5 kg of diisopropyl ether whereupon the copolymer precipitated. The copolymer precipitate was collected by filtration and dissolved in 2,250 g of acetone again. The acetone solution was added dropwise to 22.5 kg of water. The copolymer precipitate was collected by filtration and dried at 40° C. for 40 hours, obtaining 700 g of a white polymer. The polymer designated Polymer 8 was analyzed by $^{13}$C-NMR, $^{1}$H-NMR and GPC, with the results shown below.

Copolymer Compositional Ratio

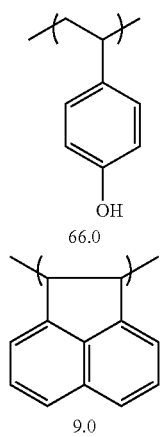

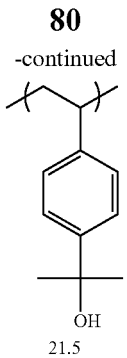

21.5

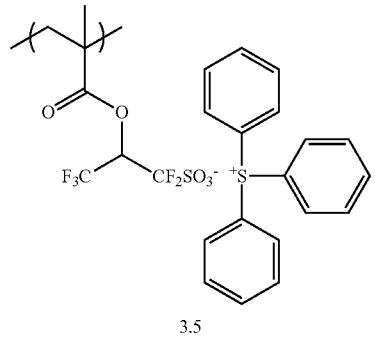

3.5

Mw=13,000
Mw/Mn=1.62

Synthesis Example 2-3

Synthesis of Polymers 2 to 7, 9 to 16

Polymers 2 to 7 and 9 to 16 were synthesized by the same procedures as Polymers 1 and 8 except that the type and amount (molar ratio) of monomers were changed. For Polymers 1 to 16, the type and molar ratio of monomers are tabulated in Table 1. The structures of recurring units incorporated in the polymers are shown in Tables 2 to 5.

TABLE 1

| | Unit 1 | Ratio (mol %) | Unit 2 | Ratio (mol %) | Unit 3 | Ratio (mol %) | Unit 4 | Ratio (mol %) |
|---|---|---|---|---|---|---|---|---|
| Polymer 1 | A-1 | 80.0 | B-1 | 10.0 | B-5 | 10.0 | | |
| Polymer 2 | A-1 | 80.0 | B-2 | 8.0 | B-4 | 12.0 | | |
| Polymer 3 | A-1 | 60.0 | B-2 | 10.0 | C-1 | 30.0 | | |
| Polymer 4 | A-1 | 70.0 | B-2 | 7.0 | C-2 | 23.0 | | |
| Polymer 5 | A-1 | 70.0 | B-2 | 10.0 | C-3 | 20.0 | | |
| Polymer 6 | A-1 | 70.0 | B-2 | 10.0 | C-4 | 20.0 | | |
| Polymer 7 | A-1 | 55.0 | B-3 | 10.0 | C-1 | 35.0 | | |
| Polymer 8 | A-1 | 66.0 | B-2 | 9.0 | C-1 | 21.5 | P-1 | 3.5 |
| Polymer 9 | A-1 | 63.0 | B-2 | 5.0 | C-1 | 24.0 | P-1 | 8.0 |
| Polymer 10 | A-1 | 67.0 | B-2 | 10.0 | C-1 | 18.5 | P-2 | 4.5 |
| Polymer 11 | A-1 | 67.0 | B-2 | 9.3 | C-1 | 20.0 | P-3 | 3.7 |
| Polymer 12 | A-1 | 67.3 | B-2 | 10.0 | C-1 | 17.5 | P-4 | 5.2 |
| Polymer 13 | A-1 | 64.1 | B-2 | 9.5 | C-1 | 22.0 | P-5 | 4.4 |
| Polymer 14 | A-1 | 64.0 | B-2 | 10.0 | C-1 | 22.8 | P-6 | 3.2 |
| Polymer 15 | A-1 | 62.0 | B-3 | 10.0 | C-1 | 24.3 | P-1 | 3.7 |
| Polymer 16 | A-2 | 60.5 | B-4 | 10.0 | C-1 | 24.4 | P-2 | 5.1 |

TABLE 2
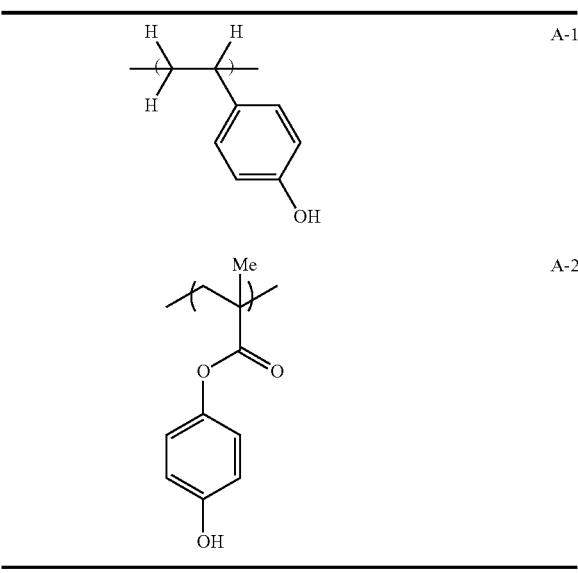
TABLE 3
TABLE 4
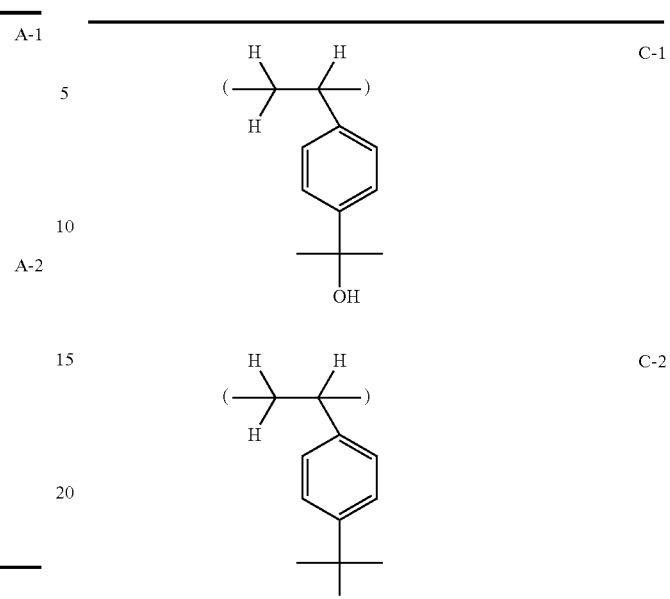
TABLE 5
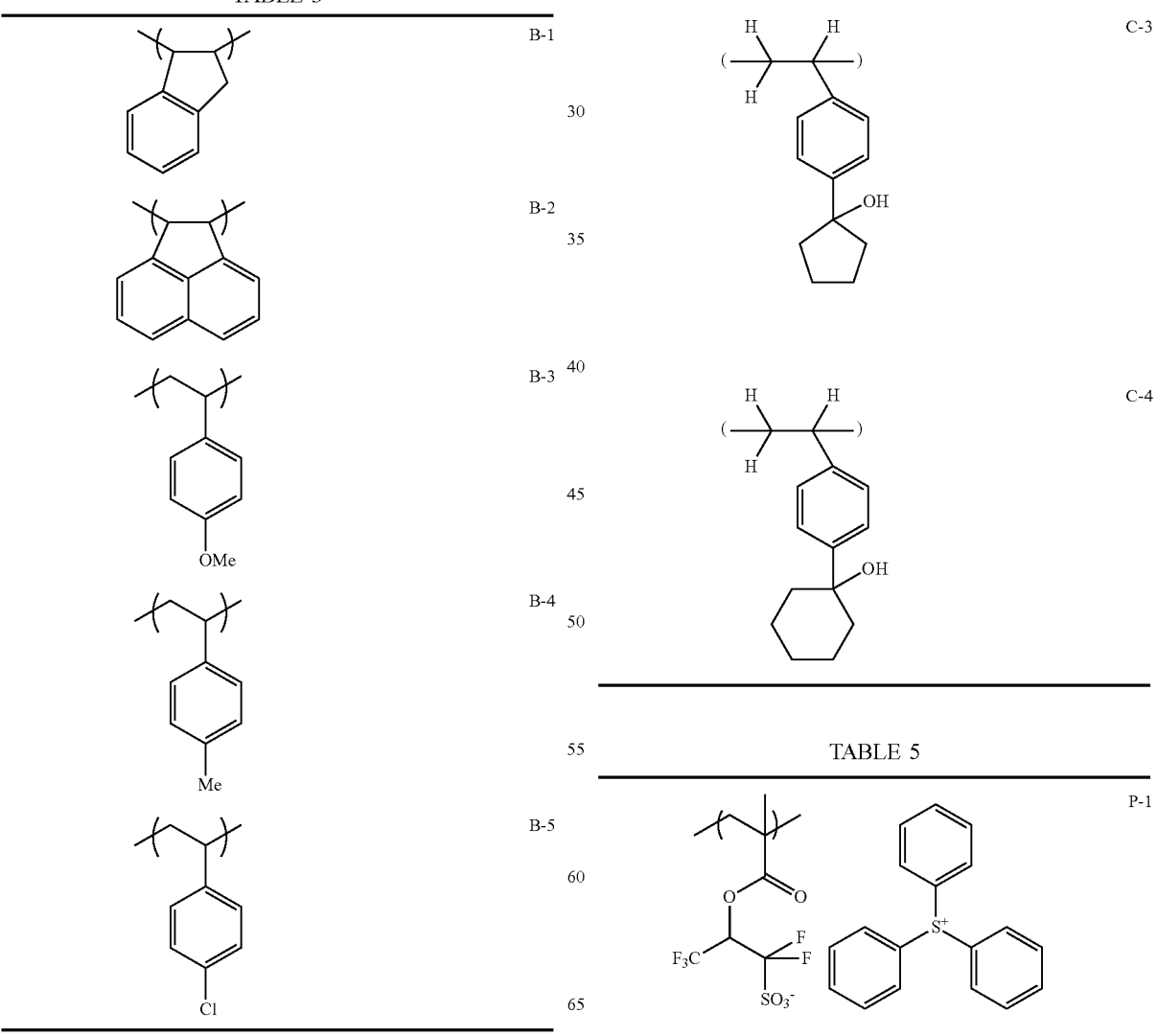

TABLE 5-continued

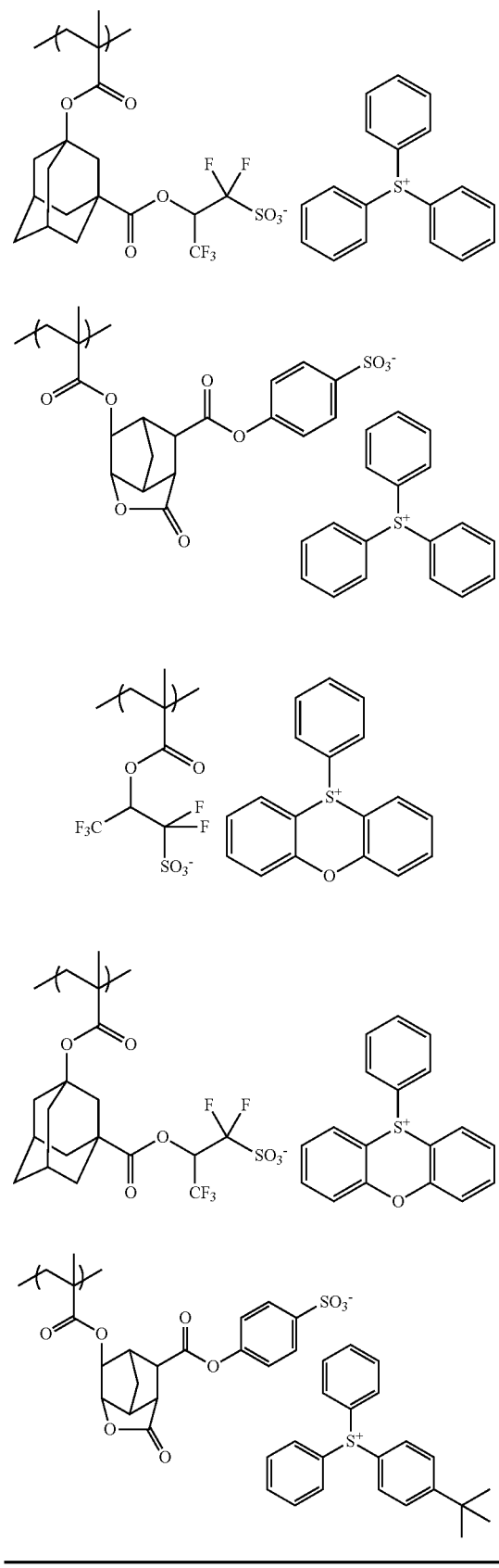

Examples 1 to 91 and Comparative Examples 1 to 4

Preparation of Negative Resist Compositions

Negative resist compositions in solution form were prepared by dissolving a polymer (Polymers 1 to 16), an acid generator (PAG-A to E), and an inventive onium salt (Salt-1 to 13), comparative salt (Salt-1') or basic compound (Base-1) as acid diffusion regulator in an organic solvent in accordance with the formulation shown in Tables 6 to 8, and filtering through a filter with a pore size of 0.2 μm or a nylon or UPE filter with a pore size of 0.02 μm. The organic solvents are 1,204 parts by weight of PGMEA (propylene glycol monomethyl ether acetate), 1,204 parts by weight of EL (ethyl lactate), and 1,606 parts by weight of PGME (propylene glycol monomethyl ether). To some compositions, an additional polymer D (Polymer A1 to A3) and tetramethoxymethylglycoluril (TMGU) as crosslinker were added. Each composition contained 0.075 part by weight of surfactant PF-636 (Omnova Solutions).

The components in Tables 6 to 8 are identified below.

Acid Diffusion Regulator:

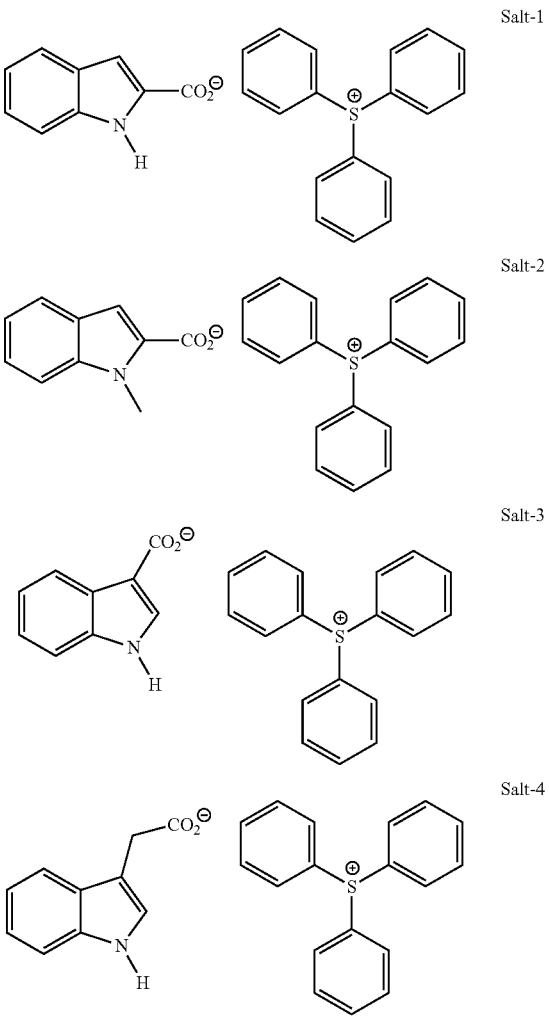

-continued
Salt-5
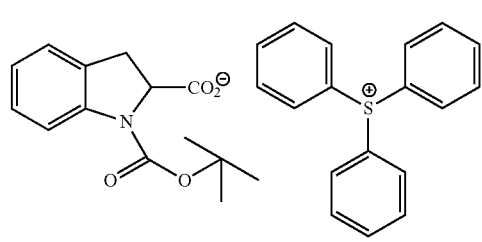
Salt-6
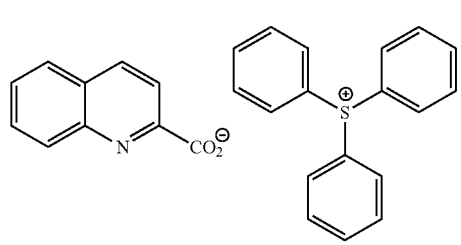
Salt-7
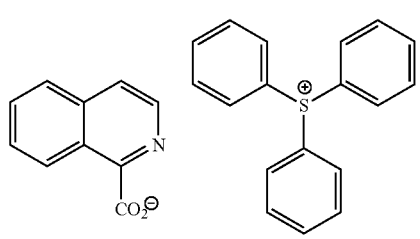
Salt-8
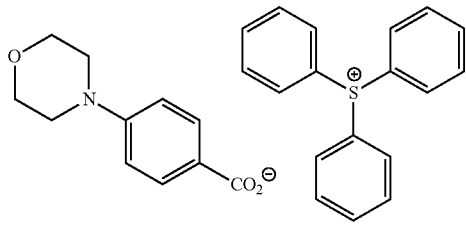
Salt-9
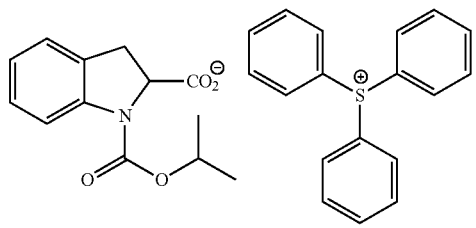
Salt-10
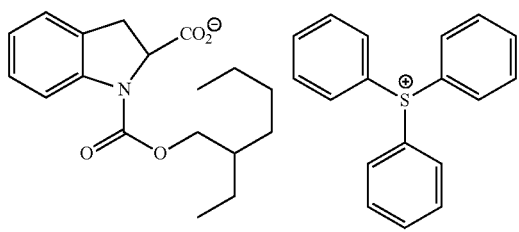
-continued
Salt-11
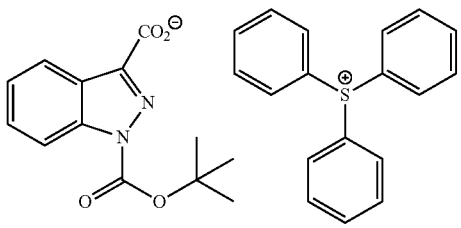
Salt-12
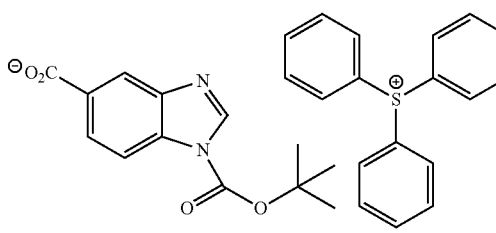
Salt-13
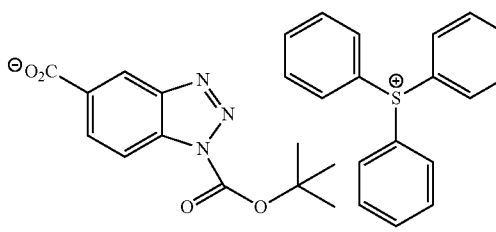
Salt-1'
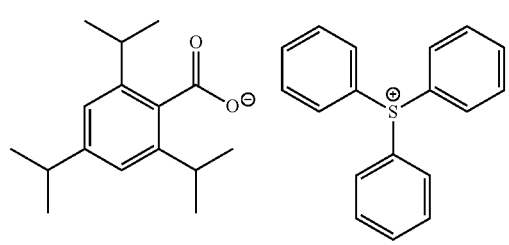
Base-1
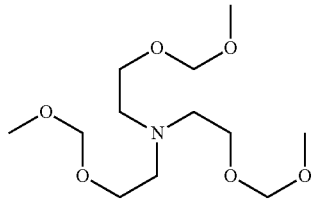
Acid Generator:
PAG-A
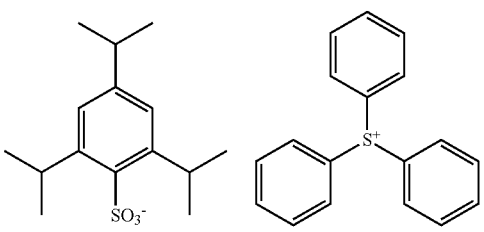

PAG-B
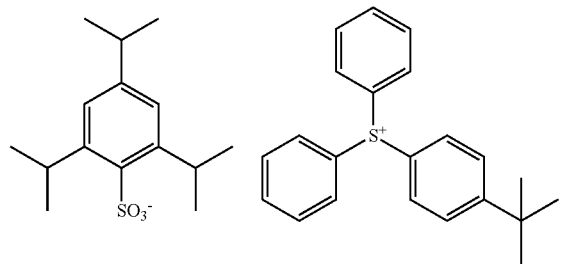
PAG-C
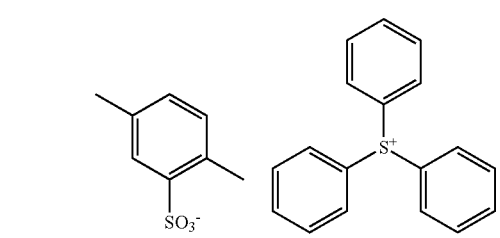
PAG-D
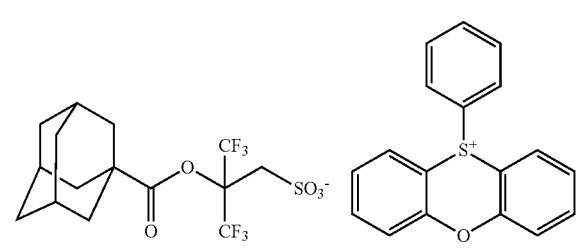
PAG-E
Polymer D:
Polymer A1
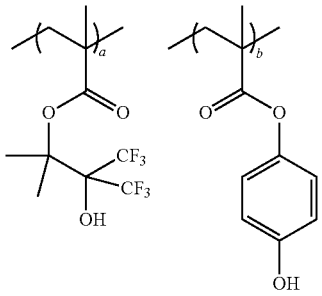
(a = 0.80, b = 0.20, Mw = 6,000)
Polymer A2
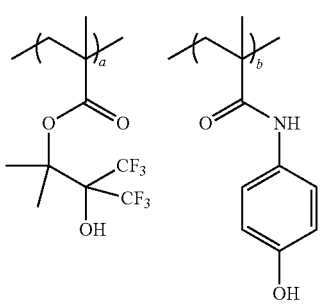
(a = 0.80, b = 0.20, Mw = 6,400)
Polymer A3
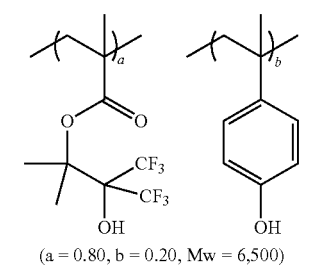
(a = 0.80, b = 0.20, Mw = 6,500)
TABLE 6
|  |  | Acid diffusion regulator (pbw) | Resin 1 (pbw) | Resin 2 (pbw) | Acid generator (pbw) | Crosslinker (pbw) | Additive (pbw) |
|---|---|---|---|---|---|---|---|
| Example | 1 | Salt-1 (5.5) | Polymer 1 (80) |  | PAG-A (2) PAG-C (8) | TMGU (8.154) |  |
|  | 2 | Salt-1 (5.5) | Polymer 1 (80) |  | PAG-A (2) PAG-C (8) | TMGU (8.154) | Polymer A1 (3) |
|  | 3 | Salt-1 (6.0) | Polymer 2 (80) |  | PAG-A (2) PAG-C (8) | TMGU (8.154) |  |
|  | 4 | Salt-1 (5.3) | Polymer 3 (80) |  | PAG-A (10) |  |  |

TABLE 6-continued

| | Acid diffusion regulator (pbw) | Resin 1 (pbw) | Resin 2 (pbw) | Acid generator (pbw) | Crosslinker (pbw) | Additive (pbw) |
|---|---|---|---|---|---|---|
| 5 | Salt-1 (5.3) | Polymer 3 (80) | | PAG-A (10) | | Polymer A1 (3) |
| 6 | Salt-1 (5.3) | Polymer 3 (80) | | PAG-A (10) | | Polymer A2 (3) |
| 7 | Salt-1 (5.3) | Polymer 3 (80) | | PAG-A (10) | | Polymer A3 (3) |
| 8 | Salt-1 (5.1) | Polymer 4 (80) | | PAG-A (10) | | |
| 9 | Salt-1 (4.9) | Polymer 5 (80) | | PAG-A (10) | | |
| 10 | Salt-1 (4.8) | Polymer 6 (80) | | PAG-A (10) | | |
| 11 | Salt-1 (5.5) | Polymer 7 (80) | | PAG-A (10) | | |
| 12 | Salt-1 (5.0) | Polymer 8 (80) | | PAG-D (2) | | |
| 13 | Salt-1 (4.9) | Polymer 9 (80) | | | | |
| 14 | Salt-1 (5.3) | Polymer 9 (80) | | PAG-D (2) | | |
| 15 | Salt-1 (5.3) | Polymer 9 (80) | | PAG-D (2) | | Polymer A1 (3) |
| 16 | Salt-1 (5.3) | Polymer 9 (80) | | PAG-D (2) | | Polymer A2 (3) |
| 17 | Salt-1 (5.3) | Polymer 9 (80) | | PAG-D (2) | | Polymer A3 (3) |
| 18 | Salt-1 (5.0) | Polymer 10 (80) | | PAG-D (2) | | |
| 19 | Salt-1 (4.4) | Polymer 11 (80) | | | | |
| 20 | Salt-1 (5.6) | Polymer 11 (80) | | PAG-D (2) | | |
| 21 | Salt-1 (4.5) | Polymer 12 (80) | | PAG-D (2) | | |
| 22 | Salt-1 (4.3) | Polymer 13 (80) | | PAG-D (2) | | |
| 23 | Salt-1 (4.5) | Polymer 14 (80) | | PAG-D (2) | | |
| 24 | Salt-1 (4.9) | Polymer 15 (80) | | PAG-D (2) | | |
| 25 | Salt-1 (4.9) | Polymer 16 (80) | | PAG-D (2) | | |
| 26 | Salt-1 (5.5) | Polymer 8 (40) | Polymer 7 (40) | PAG-A (7) | | |
| 27 | Salt-1 (5.2) | Polymer 8 (40) | Polymer 3 (40) | PAG-A (5) PAG-B (2) | | |
| 28 | Salt-1 (5.0) | Polymer 8 (40) | Polymer 3 (40) | PAG-D (7) | | |
| 29 | Salt-1 (5.0) | Polymer 8 (40) | Polymer 3 (40) | PAG-D (7) | | Polymer A1 (3) |
| 30 | Salt-1 (5.2) | Polymer 8 (40) | Polymer 7 (40) | PAG-D (7) | | |
| 31 | Salt-1 (5.0) | Polymer 9 (30) | Polymer 3 (50) | PAG-D (7) | | |
| 32 | Salt-1 (4.8) | Polymer 10 (40) | Polymer 3 (40) | PAG-D (7) | | |
| 33 | Salt-1 (4.7) | Polymer 11 (40) | Polymer 3 (40) | PAG-D (7) | | |
| 34 | Salt-1 (4.7) | Polymer 11 (40) | Polymer 7 (40) | PAG-D (7) | | Polymer A1 (3) |
| 35 | Salt-1 (5.0) | Polymer 12 (40) | Polymer 3 (40) | PAG-D (7) | | |

TABLE 7

| | | Acid diffusion regulator (pbw) | Resin 1 (pbw) | Resin 2 (pbw) | Acid generator (pbw) | Crosslinker (pbw) | Additive (pbw) |
|---|---|---|---|---|---|---|---|
| Example | 36 | Salt-1 (4.8) | Polymer 12 (50) | Polymer 4 (30) | PAG-D (7) | | |
| | 37 | Salt-1 (4.6) | Polymer 12 (50) | Polymer 5 (30) | PAG-D (7) | | |
| | 38 | Salt-1 (4.6) | Polymer 12 (50) | Polymer 6 (30) | PAG-D (7) | | |
| | 39 | Salt-1 (4.7) | Polymer 13 (40) | Polymer 3 (40) | PAG-D (7) | | |
| | 40 | Salt-1 (4.6) | Polymer 14 (40) | Polymer 3 (40) | PAG-D (7) | | |
| | 41 | Salt-1 (4.8) | Polymer 15 (40) | Polymer 3 (40) | PAG-D (7) | | |
| | 42 | Salt-1 (5.2) | Polymer 15 (40) | Polymer 7 (40) | PAG-D (7) | | |
| | 43 | Salt-1 (5.1) | Polymer 16 (40) | Polymer 7 (40) | PAG-D (7) | | |
| | 44 | Salt-2 (5.3) | Polymer 1 (80) | | PAG-A (2) PAG-C (8) | TMGU (8.154) | |
| | 45 | Salt-2 (5.3) | Polymer 3 (80) | | PAG-A (10) | | |
| | 46 | Salt-2 (5.3) | Polymer 9 (80) | | PAG-D (2) | | |
| | 47 | Salt-2 (5.0) | Polymer 8 (40) | Polymer 3 (40) | PAG-D (7) | | |
| | 48 | Salt-2 (4.7) | Polymer 11 (40) | Polymer 7 (40) | PAG-D (7) | | |
| | 49 | Salt-3 (5.3) | Polymer 1 (80) | | PAG-A (2) PAG-C (8) | TMGU (8.154) | |
| | 50 | Salt-3 (5.3) | Polymer 3 (80) | | PAG-A (10) | | |
| | 51 | Salt-3 (5.3) | Polymer 9 (80) | | PAG-D (2) | | |
| | 52 | Salt-3 (5.0) | Polymer 8 (40) | Polymer 3 (40) | PAG-D (7) | | |
| | 53 | Salt-3 (4.8) | Polymer 11 (40) | Polymer 7 (40) | PAG-D (7) | | |
| | 54 | Salt-4 (5.3) | Polymer 1 (80) | | PAG-A (2) PAG-C (8) | TMGU (8.154) | |
| | 55 | Salt-4 (5.3) | Polymer 3 (80) | | PAG-A (10) | | |
| | 56 | Salt-4 (5.3) | Polymer 9 (80) | | PAG-D (2) | | |
| | 57 | Salt-4 (5.0) | Polymer 8 (40) | Polymer 3 (40) | PAG-D (7) | | |
| | 58 | Salt-4 (4.8) | Polymer 11 (40) | Polymer 7 (40) | PAG-D (7) | | |
| | 59 | Salt-5 (5.5) | Polymer 1 (80) | | PAG-A (2) PAG-C (8) | TMGU (8.154) | |
| | 60 | Salt-5 (5.5) | Polymer 3 (80) | | PAG-A (10) | | |
| | 61 | Salt-5 (5.5) | Polymer 9 (80) | | PAG-D (2) | | |
| | 62 | Salt-5 (5.3) | Polymer 8 (40) | Polymer 3 (40) | PAG-D (7) | | |
| | 63 | Salt-5 (5.0) | Polymer 11 (40) | Polymer 7 (40) | PAG-D (7) | | |
| | 64 | Salt-6 (5.5) | Polymer 1 (80) | | PAG-A (2) PAG-C (8) | TMGU (8.154) | |
| | 65 | Salt-6 (5.5) | Polymer 3 (80) | | PAG-A (10) | | |
| | 66 | Salt-6 (5.5) | Polymer 9 (80) | | PAG-D (2) | | |

TABLE 7-continued

| | Acid diffusion regulator (pbw) | Resin 1 (pbw) | Resin 2 (pbw) | Acid generator (pbw) | Crosslinker (pbw) | Additive (pbw) |
|---|---|---|---|---|---|---|
| | 67 Salt-6 (5.3) | Polymer 8 (40) | Polymer 3 (40) | PAG-D (7) | | |
| | 68 Salt-6 (5.0) | Polymer 11 (40) | Polymer 7 (40) | PAG-D (7) | | |
| | 69 Salt-7 (5.5) | Polymer 1 (80) | | PAG-A (2) PAG-C (8) | TMGU (8.154) | |
| | 70 Salt-7 (5.5) | Polymer 3 (80) | | PAG-A (10) | | |

TABLE 8

| | | Acid diffusion regulator (pbw) | Resin 1 (pbw) | Resin 2 (pbw) | Acid generator (pbw) | Crosslinker (pbw) | Additive (pbw) |
|---|---|---|---|---|---|---|---|
| Example | 71 | Salt-7 (5.5) | Polymer 9 (80) | | PAG-D (2) | | |
| | 72 | Salt-7 (5.3) | Polymer 8 (40) | Polymer 3 (40) | PAG-D (7) | | |
| | 73 | Salt-7 (5.0) | Polymer 11 (40) | Polymer 7 (40) | PAG-D (7) | | |
| | 74 | Salt-8 (2.5) | Polymer 1 (80) | | PAG-A (2) PAG-C (8) | TMGU (8.154) | |
| | 75 | Salt-8 (2.5) | Polymer 3 (80) | | PAG-A (10) | | |
| | 76 | Salt-8 (2.5) | Polymer 9 (80) | | PAG-D (2) | | |
| | 77 | Salt-8 (2.5) | Polymer 8 (40) | Polymer 3 (40) | PAG-D (7) | | |
| | 78 | Salt-8 (2.2) | Polymer 11 (40) | Polymer 7 (40) | PAG-D (7) | | |
| | 79 | Salt-9 (6.0) | Polymer 1 (80) | | PAG-A (2) PAG-C (8) | TMGU (8.154) | |
| | 80 | Salt-9 (6.0) | Polymer 1 (80) | | PAG-A (2) PAG-C (8) | TMGU (8.154) | Polymer A1 (3) |
| | 81 | Salt-9 (6.0) | Polymer 8 (40) | Polymer 3 (40) | PAG-D (7) | | |
| | 82 | Salt-9 (6.0) | Polymer 8 (40) | Polymer 3 (40) | PAG-E (7) | | |
| | 83 | Salt-9 (6.0) | Polymer 8 (40) | Polymer 3 (40) | PAG-E (7) | | Polymer A1 (3) |
| | 84 | Salt-10 (6.3) | Polymer 1 (80) | | PAG-A (2) PAG-C (8) | | |
| | 85 | Salt-10 (6.3) | Polymer 8 (40) | Polymer 3 (40) | PAG-D (7) | | |
| | 86 | Salt-11 (4.0) | Polymer 1 (80) | | PAG-A (2) PAG-C (8) | | |
| | 87 | Salt-11 (4.0) | Polymer 8 (40) | Polymer 3 (40) | PAG-D (7) | | |
| | 88 | Salt-12 (4.1) | Polymer 1 (80) | | PAG-A (2) PAG-C (8) | | |
| | 89 | Salt-12 (4.1) | Polymer 8 (40) | Polymer 3 (40) | PAG-D (7) | | |
| | 90 | Salt-13 (3.2) | Polymer 1 (80) | | PAG-A (2) PAG-C (8) | | |
| | 91 | Salt-13 (3.2) | Polymer 8 (40) | Polymer 3 (40) | PAG-D (7) | | |
| Comparative Example | 1 | Salt-1' (6.5) | Polymer 1 (80) | | PAG-A (2) PAG-C (8) | TMGU (8.154) | |
| | 2 | Salt-1' (6.5) | Polymer 12 (40) | Polymer 3 (40) | PAG-D (7) | | |
| | 3 | Base-1 (2.8) | Polymer 1 (80) | | PAG-A (2) PAG-C (8) | TMGU (8.154) | |
| | 4 | Base-1 (2.0) | Polymer 12 (40) | Polymer 3 (40) | PAG-D (7) | | |

(1) Evaluation of Resolution by EB Writing Test

Using a coater/developer system ACT-M (Tokyo Electron Ltd.), each of the negative resist compositions (Examples 1 to 91 and Comparative Examples 1 to 4) was spin coated on a mask blank of 152 mm squares having a chromium oxynitride film at the outermost surface and prebaked on a hot plate at 110° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 120° C. for 600 seconds, and developed in a 2.38 wt % tetramethylammonium hydroxide (TMAH) aqueous solution, thereby yielding negative patterns.

The patterned mask blank was observed under a top-down scanning electron microscope (TDSEM). The optimum dose (Eop) was defined as the exposure dose ($\mu C/cm^2$) which provided a 1:1 resolution at the top and bottom of a 400-nm 1:1 line-and-space pattern. The LS resolution (or maximum resolution) was defined as the minimum line width of a L/S pattern that could be resolved at the optimum dose. The dot resolution (or maximum resolution) was defined as the minimum size of a pattern that could be resolved at the exposure dose capable of resolving a dot (line width) of 400 nm squares to square. The LER of a 200-nm L/S pattern was measured under SEM. The pattern was visually observed to judge whether or not the pattern profile was rectangular. The test results are shown in Tables 9 to 11.

TABLE 9

| | | Eop ($\mu C/cm^2$) | Maximum resolution L/S (nm) | Maximum resolution dot (nm) | LER (nm) | Pattern profile |
|---|---|---|---|---|---|---|
| Example | 1 | 50 | 50 | 80 | 5.2 | rectangular |
| | 2 | 50 | 50 | 80 | 5.2 | rectangular |
| | 3 | 50 | 50 | 80 | 5.1 | rectangular |

TABLE 9-continued

| | Eop (μC/cm²) | Maximum resolution L/S (nm) | Maximum resolution dot (nm) | LER (nm) | Pattern profile |
|---|---|---|---|---|---|
| 4 | 51 | 40 | 70 | 4.8 | rectangular |
| 5 | 50 | 40 | 70 | 4.8 | rectangular |
| 6 | 50 | 40 | 70 | 4.9 | rectangular |
| 7 | 51 | 40 | 70 | 4.8 | rectangular |
| 8 | 49 | 40 | 70 | 4.9 | rectangular |
| 9 | 51 | 40 | 70 | 4.7 | rectangular |
| 10 | 50 | 40 | 70 | 4.6 | rectangular |
| 11 | 50 | 40 | 70 | 4.7 | rectangular |
| 12 | 51 | 40 | 70 | 4.7 | rectangular |
| 13 | 51 | 40 | 70 | 4.8 | rectangular |
| 14 | 51 | 40 | 70 | 4.7 | rectangular |
| 15 | 51 | 40 | 70 | 4.7 | rectangular |
| 16 | 52 | 40 | 70 | 4.8 | rectangular |
| 17 | 52 | 40 | 70 | 4.7 | rectangular |
| 18 | 51 | 40 | 70 | 4.7 | rectangular |
| 19 | 50 | 40 | 70 | 4.6 | rectangular |
| 20 | 51 | 40 | 70 | 4.7 | rectangular |
| 21 | 50 | 40 | 70 | 4.9 | rectangular |
| 22 | 51 | 40 | 70 | 4.8 | rectangular |
| 23 | 49 | 40 | 70 | 4.6 | rectangular |
| 24 | 50 | 40 | 70 | 4.6 | rectangular |
| 25 | 49 | 40 | 70 | 4.7 | rectangular |
| 26 | 50 | 40 | 70 | 4.7 | rectangular |
| 27 | 49 | 40 | 70 | 4.7 | rectangular |
| 28 | 50 | 40 | 70 | 4.7 | rectangular |
| 29 | 50 | 40 | 70 | 4.8 | rectangular |
| 30 | 49 | 40 | 70 | 4.7 | rectangular |
| 31 | 50 | 40 | 70 | 4.8 | rectangular |
| 32 | 51 | 40 | 70 | 4.7 | rectangular |
| 33 | 51 | 40 | 70 | 4.8 | rectangular |
| 34 | 52 | 40 | 70 | 4.8 | rectangular |
| 35 | 52 | 40 | 70 | 4.8 | rectangular |

TABLE 10

| | | Eop (μC/cm²) | Maximum resolution L/S (nm) | Maximum resolution dot (nm) | LER (nm) | Pattern profile |
|---|---|---|---|---|---|---|
| Example | 36 | 53 | 40 | 70 | 4.9 | rectangular |
| | 37 | 51 | 40 | 70 | 4.7 | rectangular |
| | 38 | 52 | 40 | 70 | 4.7 | rectangular |
| | 39 | 51 | 40 | 70 | 4.8 | rectangular |
| | 40 | 50 | 40 | 70 | 4.7 | rectangular |
| | 41 | 51 | 40 | 70 | 4.7 | rectangular |
| | 42 | 50 | 40 | 70 | 4.7 | rectangular |
| | 43 | 52 | 45 | 75 | 4.9 | rectangular |
| | 44 | 52 | 45 | 75 | 5.1 | rectangular |
| | 45 | 50 | 40 | 70 | 4.7 | rectangular |
| | 46 | 50 | 40 | 70 | 4.7 | rectangular |
| | 47 | 49 | 40 | 70 | 4.8 | rectangular |
| | 48 | 49 | 40 | 70 | 4.8 | rectangular |
| | 49 | 50 | 45 | 75 | 5.2 | rectangular |
| | 50 | 50 | 40 | 70 | 4.7 | rectangular |
| | 51 | 50 | 40 | 70 | 4.7 | rectangular |
| | 52 | 51 | 40 | 70 | 4.7 | rectangular |
| | 53 | 51 | 40 | 70 | 4.7 | rectangular |
| | 54 | 51 | 45 | 75 | 5.1 | rectangular |
| | 55 | 50 | 40 | 70 | 4.8 | rectangular |
| | 56 | 50 | 40 | 70 | 4.8 | rectangular |
| | 57 | 50 | 40 | 70 | 4.8 | rectangular |
| | 58 | 50 | 40 | 70 | 4.8 | rectangular |
| | 59 | 52 | 45 | 75 | 5.2 | rectangular |
| | 60 | 51 | 40 | 70 | 4.8 | rectangular |
| | 61 | 51 | 40 | 70 | 4.8 | rectangular |
| | 62 | 51 | 40 | 70 | 4.8 | rectangular |
| | 63 | 51 | 40 | 70 | 4.8 | rectangular |
| | 64 | 52 | 45 | 75 | 5.1 | rectangular |
| | 65 | 52 | 40 | 70 | 4.7 | rectangular |
| | 66 | 52 | 40 | 70 | 4.7 | rectangular |
| | 67 | 52 | 40 | 70 | 4.7 | rectangular |
| | 68 | 52 | 40 | 70 | 4.8 | rectangular |
| | 69 | 51 | 45 | 75 | 5.1 | rectangular |
| | 70 | 50 | 40 | 70 | 4.6 | rectangular |

TABLE 11

| | | Eop (μC/cm²) | Maximum resolution L/S (nm) | Maximum resolution dot (nm) | LER (nm) | Pattern profile |
|---|---|---|---|---|---|---|
| Example | 71 | 50 | 40 | 70 | 4.6 | rectangular |
| | 72 | 50 | 40 | 70 | 4.6 | rectangular |
| | 73 | 52 | 40 | 70 | 4.7 | rectangular |
| | 74 | 50 | 45 | 80 | 5.2 | rectangular |
| | 75 | 52 | 45 | 75 | 4.9 | rectangular |
| | 76 | 52 | 45 | 75 | 4.9 | rectangular |
| | 77 | 52 | 45 | 75 | 4.9 | rectangular |
| | 78 | 51 | 45 | 75 | 5.0 | rectangular |
| | 79 | 51 | 50 | 80 | 5.2 | rectangular |
| | 80 | 50 | 50 | 80 | 5.1 | rectangular |
| | 81 | 51 | 40 | 70 | 4.8 | rectangular |
| | 82 | 50 | 40 | 70 | 4.7 | rectangular |
| | 83 | 49 | 40 | 70 | 4.5 | rectangular |
| | 84 | 50 | 50 | 80 | 5.0 | rectangular |
| | 85 | 51 | 40 | 70 | 4.7 | rectangular |
| | 86 | 50 | 50 | 80 | 5.1 | rectangular |
| | 87 | 52 | 40 | 70 | 4.8 | rectangular |
| | 88 | 51 | 50 | 80 | 5.0 | rectangular |
| | 89 | 50 | 40 | 70 | 4.8 | rectangular |
| | 90 | 51 | 50 | 80 | 4.9 | rectangular |
| | 91 | 51 | 40 | 70 | 4.7 | rectangular |
| Comparative Example | 1 | 49 | 60 | 100 | 6.2 | undercut |
| | 2 | 50 | 55 | 95 | 5.8 | footing |
| | 3 | 51 | 60 | 100 | 6.5 | undercut |
| | 4 | 50 | 55 | 95 | 6.1 | footing |

All the resist compositions of Examples 1 to 91 comprising the inventive onium salts having formulae (1) and (2) show satisfactory results with respect to resolution, rectangular pattern profile, and LER. The resist compositions of Comparative Examples 1 to 4 are inferior in resolution and LER. This is because the acid generated upon EB writing diffuses to the unexposed region where negative working reaction takes place to some extent, leading to a decline of contrast. Since the resist compositions comprising the inventive onium salts have a higher basicity than the resist compositions of Comparative Examples 1, 2 comprising the comparative salt, they are less susceptible to the unwanted reaction than the resist compositions of Comparative Examples 1, 2. After image writing, the inventive onium salt converts to a carboxylic acid, losing the acid diffusion controlling ability. As a result, the reaction contrast between the exposed (imaged) region and the unexposed (unimaged) region is increased. In Comparative Examples 3 and 4, Base-1 maintains its acid diffusion controlling ability even after image writing, and as a result, the reaction contrast is low. Consequently, from the resist compositions comprising the inventive onium salts, patterns with satisfactory resolution and reduced roughness are formed.

(2) EB Writing Test after Anti-Charging Film Coating

Each of the negative resist compositions (Examples and Comparative Examples 1 to 4) was spin coated on a 6-inch silicon wafer and baked at 110° C. for 240 seconds to form a resist film of 80 nm thick. Using a system Mark 8 (Tokyo Electron Ltd.), an electroconductive polymer composition was spin coated over the resist film and baked on a hot plate at 90° C. for 90 seconds to form an anti-charging film of 60 nm thick. The electroconductive polymer composition used was a water dispersion of polystyrene-doped polyaniline as described in Proc. of SPIE Vol. 8522, 852200-1. Using a system HL-800D (Hitachi Hitechnologies Ltd.) at an accelerating voltage of 50 keV, the resist film was exposed to EB, baked (PEB) at 110° C. for 240 seconds, and developed in a 2.38 wt % TMAH aqueous solution, thereby yielding a negative pattern.

The resist pattern-bearing wafer was observed under a TDSEM. The optimum dose (Eop) was defined as the exposure dose ($\mu C/cm^2$) which provided a 1:1 resolution at the top and bottom of a 400-nm 1:1 line-and-space pattern. The LS resolution (or maximum resolution) was defined as the minimum line width of a L/S pattern that could be resolved at the optimum dose. The test results are shown in Table 12.

TABLE 12

|  |  | Eop ($\mu C/cm^2$) | Maximum resolution (nm) |
|---|---|---|---|
| Example | 1 | 58 | 70 |
|  | 2 | 59 | 65 |
|  | 4 | 59 | 65 |
|  | 5 | 60 | 60 |
|  | 6 | 58 | 60 |
|  | 7 | 57 | 60 |
|  | 14 | 58 | 65 |
|  | 15 | 58 | 60 |
|  | 28 | 57 | 65 |
|  | 29 | 56 | 60 |
|  | 33 | 58 | 65 |
|  | 34 | 56 | 60 |
|  | 77 | 57 | 55 |
|  | 79 | 57 | 70 |
|  | 80 | 56 | 65 |
|  | 82 | 56 | 65 |
|  | 83 | 55 | 60 |
| Comparative Example | 1 | 58 | 80 |
|  | 2 | 57 | 75 |
|  | 3 | 57 | 80 |
|  | 4 | 56 | 75 |

All the resist compositions of Examples comprising the inventive onium salts having formulae (1) and (2) show satisfactory results of resolution. The resist compositions of Comparative Examples 1 to 4 are inferior in resolution. This is because the acid migrates from the anti-charging film to the resist film to cause intermixing, whereby the unwanted negative working reaction takes place in the unexposed (unimaged) region to some extent. Since the resist compositions comprising the inventive onium salts have a high basicity as compared with the resist compositions of Comparative Examples 1, 2 comprising the comparative acid diffusion regulator, and is reduced in intermixing of acid between anti-charging film and resist film as compared with the resist compositions of Comparative Examples 3, 4, they are less susceptible to the unwanted reaction than the resist compositions of Comparative Examples. As a result, patterns with satisfactory resolution are formed. A comparison of Examples 1, 2 with Examples 4, 5 reveals an improvement in resolution by the polymer D exerting the effect of suppressing acid mixing.

(3) Dependence on PEB Temperature

The optimum dose in (1) evaluation of resolution is designated $E_{130}$. Exposure and development were carried out by the same procedure as in (1) evaluation of resolution except that the PEB temperature was changed from 130° C. to 150° C. and the dose was set equal to $E_{130}$. Provided that the design pattern had a line width of 400 nm, an actual size was measured and reported as $W_{150}$. The dependence of line width on PEB temperature was computed according to the following equation.

Dependence on PEB temperature=$(W_{150}-400)/20$

The value indicates how the pattern line width varies with a change of PEB temperature, with a smaller value indicating less dependence on PEB temperature. The results are shown in Table 13.

TABLE 13

|  |  | Dependence on PEB temperature |
|---|---|---|
| Example | 1 | 0.45 nm/° C. |
|  | 2 | 0.35 nm/° C. |
|  | 4 | 0.40 nm/° C. |
|  | 5 | 0.30 nm/° C. |
|  | 6 | 0.30 nm/° C. |
|  | 7 | 0.30 nm/° C. |
|  | 14 | 0.31 nm/° C. |
|  | 15 | 0.17 nm/° C. |
|  | 28 | 0.24 nm/° C. |
|  | 29 | 0.12 nm/° C. |
|  | 33 | 0.23 nm/° C. |
|  | 34 | 0.15 nm/° C. |
|  | 77 | 0.27 nm/° C. |
|  | 79 | 0.47 nm/° C. |
|  | 80 | 0.34 nm/° C. |
|  | 82 | 0.36 nm/° C. |
|  | 83 | 0.21 nm/° C. |
| Comparative Example | 3 | 2.10 nm/° C. |
|  | 4 | 1.80 nm/° C. |

The resist compositions of Examples comprising the inventive onium salts having formulae (1) and (2) show thermal stability. The resist compositions of Comparative Examples 3 and 4 are inferior in thermal stability.

(4) Evaluation of Chemical Flare Resistance

A resist film was formed under the same conditions as in (1) evaluation of resolution, exposed in a setup designed to form a space of 1 μm or 0.5 μm squares at the center of a negative pattern of 1 cm squares, and developed. The resist film was rated OK when a space of 1 μm or 0.5 μm squares was formed, and NG when not formed. The results are shown in Table 14.

TABLE 14

|  |  | Chemical flare resistance | |
|---|---|---|---|
|  |  | Formation of 1-μm square space at the center | Formation of 0.5-μm square space at the center |
| Example | 1 | OK | NG (not formed because of negative working) |
|  | 2 | OK | OK |
|  | 4 | OK | NG (not formed because of negative working) |
|  | 5 | OK | OK |
|  | 6 | OK | NG (not formed because of negative working) |
|  | 7 | OK | OK |
|  | 14 | OK | NG (not formed because of negative working) |
|  | 15 | OK | OK |
|  | 28 | OK | NG (not formed because of negative working) |

TABLE 14-continued

| | | Chemical flare resistance | |
|---|---|---|---|
| | | Formation of 1-μm square space at the center | Formation of 0.5-μm square space at the center |
| | 29 | OK | OK |
| | 33 | OK | NG (not formed because of negative working) |
| | 34 | OK | OK |
| | 79 | OK | NG (not formed because of negative working) |
| | 80 | OK | OK |
| | 82 | OK | NG (not formed because of negative working) |
| | 83 | OK | OK |
| Comparative Example | 3 | NG (not formed because of negative working) | NG (not formed because of negative working) |
| | 4 | NG (not formed because of negative working) | NG (not formed because of negative working) |

From the resist compositions of Examples comprising the inventive onium salts having formulae (1) and (2), patterns of satisfactory profile are formed. The resist composition containing additive polymer D is capable of forming a pattern of finer size than the composition free of additive polymer D. The resist compositions of Comparative Examples 3 and 4 show inferior results. The resist compositions of Examples show satisfactory results because the volatilization of components due to local heat by a high current density of imaging is avoided and the inventive onium salt can trap the acid generated by chemical flare.

(5) Evaluation of Development Residue

A resist film was formed under the same conditions as in (1) evaluation of resolution, directly (i.e., without exposure) baked at 120° C. for 600 seconds, and developed in a 2.38 wt % TMAH aqueous solution. Using a mask defect monitor M2351 (Lasertec Corp.), development residues were counted. The total count of defects after development is reported in Table 15.

TABLE 15

| | | Total count of defects after development |
|---|---|---|
| Example | 1 | 290 |
| | 2 | 100 |
| | 4 | 280 |
| | 5 | 110 |
| | 6 | 100 |
| | 7 | 100 |
| | 14 | 250 |
| | 15 | 110 |
| | 28 | 270 |
| | 29 | 100 |
| | 33 | 280 |
| | 34 | 110 |
| | 79 | 260 |
| | 80 | 110 |
| | 82 | 240 |
| | 83 | 100 |
| Comparative Example | 3 | 500 |
| | 4 | 480 |

It has been demonstrated that by using the inventive resist composition to form a resist film and exposing it patternwise to radiation, a pattern with a minimal LER are formed at high resolution. Even when an anti-charging film is coated on a resist film, the inventive resist composition ensures a high resolution. In addition, even when chemical flare or local heat is generated by a high current quantity of imaging, a pattern is formed without defects or development residues. The resist pattern forming process using the inventive resist composition is useful in the photolithography for the fabrication of microelectronic devices, especially processing of photomask blanks.

While the invention has been illustrated and described in typical embodiments, it is not intended to be limited to the details shown. Any modified embodiments having substantially the same features and achieving substantially the same results as the technical idea disclosed herein are within the spirit and scope of the invention.

Japanese Patent Application No. 2015-081879 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising
   (A) an onium salt having the formula (1) or (2),
   (B) a resin (U-1) comprising recurring units having the formula (3), and
   (C) a crosslinker,

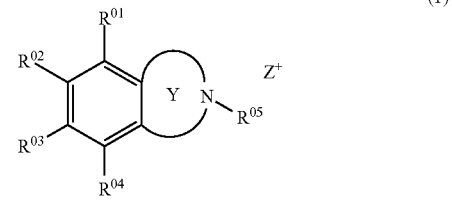

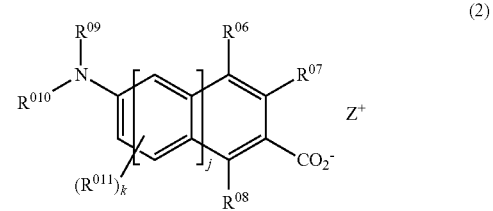

wherein $R^{01}$, $R^{02}$, $R^{03}$ and $R^{04}$ are each independently hydrogen, $-L-CO_2^-$, or a straight $C_1-C_{20}$, branched or cyclic $C_3-C_{20}$ monovalent hydrocarbon group which may be substituted with or separated by a heteroatom, or a pair of $R^{01}$ and $R^{02}$, $R^{02}$ and $R^{03}$, or $R^{03}$ and $R^{04}$ may bond together to form a ring with the carbon atoms to which they are attached, L is a single bond or a straight $C_1-C_{20}$, branched or cyclic $C_3-C_{20}$ divalent hydrocarbon group which may be substituted with or separated by a heteroatom, $R^{05}$ is hydrogen or a straight $C_1-C_{20}$, branched or cyclic $C_3-C_{20}$ monovalent hydrocarbon group which may be substituted with or separated by a heteroatom, $R^{06}$, $R^{07}$, $R^{08}$, $R^{09}$, $R^{010}$ and $R^{011}$ are each independently hydrogen or a straight $C_1-C_{20}$, branched or cyclic $C_3-C_{20}$ monovalent hydrocarbon group which may be substituted with or separated by a heteroatom, or a pair of $R^{06}$ and $R^{07}$ may bond together to form a ring with the carbon atoms to which they are attached, a pair of $R^{08}$ and $R^{011}$ may bond together to form a ring with the carbon atoms to which they are attached and any intervening carbon atoms, or a pair of $R^{09}$ and $R^{010}$ may bond together to form a ring with the nitrogen atom, j is 0 or 1, k is a number in the range: $0 \leq k \leq 1$ when $j=0$, or $0 \leq k \leq 3$ when $j=1$, and $Z^+$ is a sulfonium cation of the formula (a) or an iodonium cation of the formula (b):

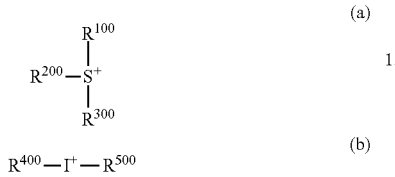

(a)

(b)

wherein $R^{100}$, $R^{200}$, and $R^{300}$ are each independently a straight $C_1$-$C_{20}$, branched or cyclic $C_3$-$C_{20}$ monovalent hydrocarbon group which may be substituted with or separated by a heteroatom, or any two or more of $R^{100}$, $R^{200}$, and $R^{300}$ may bond together to form a ring with the sulfur atom, $R^{400}$ and $R^{500}$ are each independently a straight $C_1$-$C_{20}$, branched or cyclic $C_3$-$C_{20}$ monovalent hydrocarbon group which may be substituted with or separated by a heteroatom, the partial structure represented by the formula:

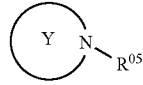

is a cyclic structure having the intervening nitrogen atom in which a hydrogen atom bonded to a cyclic structure-forming carbon atom may be replaced by a straight $C_1$-$C_{20}$, branched or cyclic $C_3$-$C_{20}$ monovalent hydrocarbon group or -L-$CO_2^-$, or in which a cyclic structure-forming carbon atom may be replaced by sulfur, oxygen or nitrogen, with the proviso that one substituent: -L-$CO_2^-$ is essentially included in formula (1),

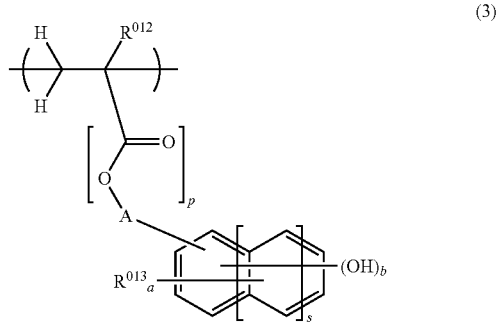

(3)

wherein A is a single bond or a $C_1$-$C_{10}$ alkylene group which may contain an ether bond at an intermediate of its chain, $R^{012}$ is hydrogen, fluorine, methyl or trifluoromethyl, $R^{013}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group, b is an integer of 1 to 5, s is an integer of 0 to 2, a is an integer equal to or less than (5+2s−b), and p is 0 or 1.

2. The resist composition of claim 1 wherein the resin (B) further comprises recurring units of at least one type selected from units having the formulae (5), (6), and (7):

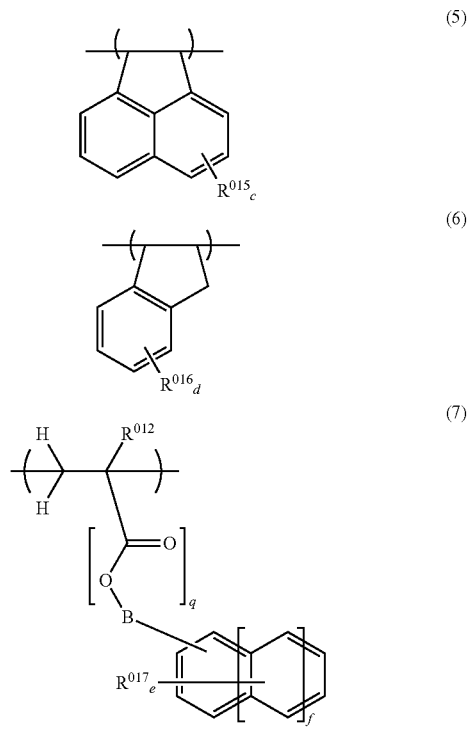

wherein B is a single bond or a $C_1$-$C_{10}$ alkylene group which may contain an ether bond at an intermediate of its chain, $R^{012}$ is hydrogen, fluorine, methyl or trifluoromethyl, $R^{015}$ and $R^{016}$ are each independently hydrogen, an optionally halo-substituted $C_1$-$C_6$ alkyl group or primary or secondary alkoxy group, or an optionally halo-substituted $C_2$-$C_7$ alkylcarbonyloxy group, $R^{017}$ is hydrogen, a straight, branched or cyclic $C_1$-$C_{20}$ alkyl, alkoxy or acyloxy group, $C_2$-$C_{20}$ alkoxyalkyl group, $C_2$-$C_{20}$ alkylthioalkyl group, halogen, nitro, cyano, sulfinyl, or sulfonyl group, c and d each are an integer of 0 to 4, e is an integer of 0 to 5, f is an integer of 0 to 2, and q is 0 or 1.

3. The resist composition of claim 1, further comprising an acid generator capable of generating an acid upon exposure to high-energy radiation.

4. The resist composition of claim 1, further comprising (D) a polymer comprising recurring units having the formula (8) and fluorine-containing recurring units of at least one type selected from the formulae (9), (10), (11) and (12):

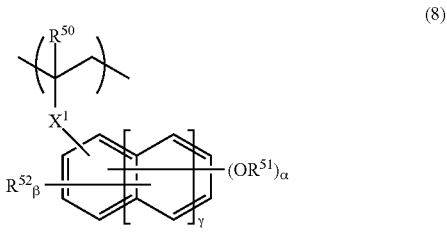

-continued

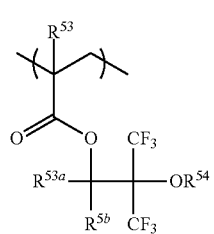
(9)

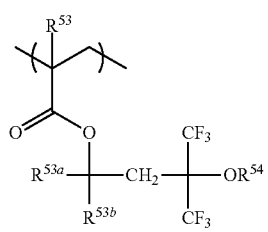
(10)

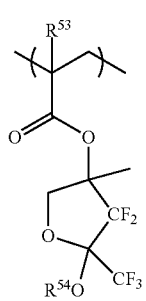
(11)

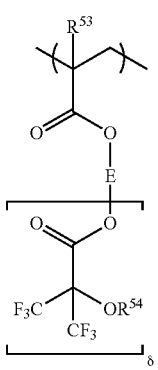
(12)

wherein $R^{50}$ is hydrogen or methyl, $R^{51}$ is hydrogen or a straight or branched $C_1$-$C_5$ monovalent hydrocarbon group which may be separated by a heteroatom, $R^{52}$ is a straight or branched $C_1$-$C_5$ monovalent hydrocarbon group which may be separated by a heteroatom, $R^{53}$ is hydrogen, fluorine, methyl or trifluoromethyl, $R^{53a}$ and $R^{53b}$ are each independently hydrogen or a straight, branched or cyclic $C_1$-$C_{10}$ alkyl group, $R^{54}$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^{54}$, an ether bond (—O—) or carbonyl moiety (—C(=O)—) may intervene in a carbon-carbon bond, $\alpha$ is an integer of 1 to 3, $\beta$ is an integer satisfying $0 \leq \beta \leq 5+2\gamma-\alpha$, $\gamma$ is 0 or 1, $\delta$ is an integer of 1 to 3, $X^1$ is a single bond, —C(=O)O— or —C(=O)NH—, E is a straight, branched or cyclic $C_1$-$C_{20}$ ($\delta$+1)-valent hydrocarbon or fluorinated hydrocarbon group.

5. A photomask blank coated with the chemically amplified negative resist composition of claim 1.

6. A pattern forming process comprising the steps of:
applying the chemically amplified negative resist composition of claim 1 onto a processable substrate to form a resist film thereon,
exposing the resist film patternwise to high-energy radiation, and
developing the resist film in an alkaline developer to form a resist pattern.

7. The process of claim 6 wherein the high-energy radiation is EUV or EB.

8. The process of claim 6 wherein the processable substrate is a photomask blank.

9. A chemically amplified negative resist composition comprising
(A) an onium salt having the formula (1) or (2), and
(B) a resin (U-2) adapted to turn alkali insoluble under the action of acid, the resin comprising recurring units having the formulae (3) and (4),

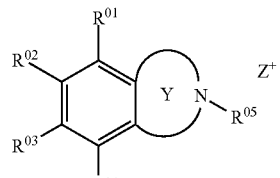
(1)

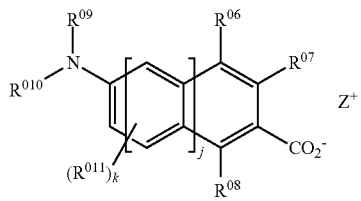
(2)

wherein $R^{01}$, $R^{02}$, $R^{03}$ and $R^{04}$ are each independently hydrogen, -L-$CO_2^-$, or a straight $C_1$-$C_{20}$, branched or cyclic $C_3$-$C_{20}$ monovalent hydrocarbon group which may be substituted with or separated by a heteroatom, or a pair of $R^{01}$ and $R^{02}$, $R^{02}$ and $R^{03}$, or $R^{03}$ and $R^{04}$ may bond together to form a ring with the carbon atoms to which they are attached, L is a single bond or a straight $C_1$-$C_{20}$, branched or cyclic $C_3$-$C_{20}$ divalent hydrocarbon group which may be substituted with or separated by a heteroatom, $R^{05}$ is hydrogen or a straight $C_1$-$C_{20}$, branched or cyclic $C_3$-$C_{20}$ monovalent hydrocarbon group which may be substituted with or separated by a heteroatom, $R^{06}$, $R^{07}$, $R^{08}$, $R^{09}$, $R^{001}$ and $R^{011}$ are each independently hydrogen or a straight $C_1$-$C_{20}$, branched or cyclic $C_3$-$C_{20}$ monovalent hydrocarbon group which may be substituted with or separated by a heteroatom, or a pair of $R^{06}$ and $R^{07}$ may bond together to form a ring with the carbon atoms to which they are attached, a pair of $R^{08}$ and $R^{011}$ may bond together to form a ring with the carbon atoms to which they are attached and any intervening carbon atoms, or a pair of $R^{09}$ and $R^{010}$ may bond together to form a ring with the nitrogen atom, j is 0 or 1, k is a number in the range: $0 \leq k \leq 1$ when j=0, or $0 \leq k \leq 3$ when j=1, and $Z^+$ is a sulfonium cation of the formula (a) or an iodonium cation of the formula (b):

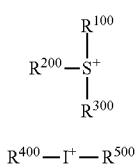

wherein $R^{100}$, $R^{200}$, and $R^{300}$ are each independently a straight $C_1$-$C_{20}$, branched or cyclic $C_3$-$C_{20}$ monovalent hydrocarbon group which may be substituted with or separated by a heteroatom, or any two or more of $R^{100}$, $R^{200}$, and $R^{300}$ may bond together to form a ring with the sulfur atom, $R^{400}$ and $R^{500}$ are each independently a straight $C_1$-$C_{20}$, branched or cyclic $C_3$-$C_{20}$ monovalent hydrocarbon group which may be substituted with or separated by a heteroatom, the partial structure represented by the formula:

is a cyclic structure having the intervening nitrogen atom in which a hydrogen atom bonded to a cyclic structure-forming carbon atom may be replaced by a straight $C_1$-$C_{20}$, branched or cyclic $C_3$-$C_{20}$ monovalent hydrocarbon group or -L-$CO_2^-$, or in which a cyclic structure-forming carbon atom may be replaced by sulfur, oxygen or nitrogen, with the proviso that one substituent: -L-$CO_2^-$ is essentially included in formula (1),

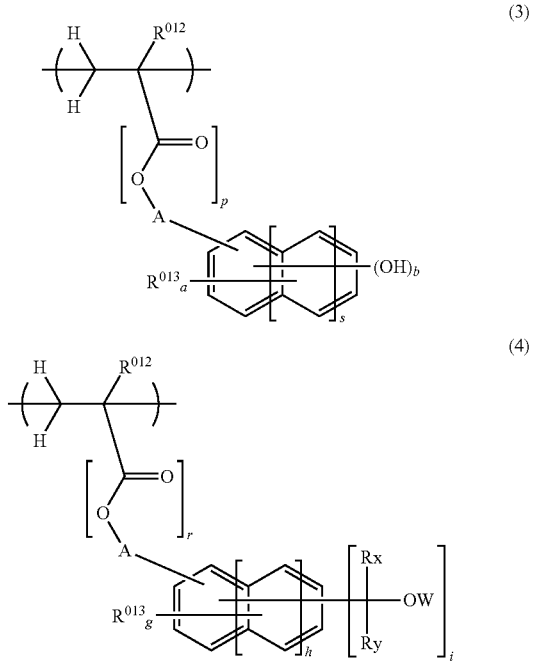

in formula (3), A is a single bond or a $C_1$-$C_{10}$ alkylene group which may contain an ether bond at an intermediate of its chain, $R^{012}$ is hydrogen, fluorine, methyl or trifluoromethyl, $R^{013}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group, b is an integer of 1 to 5, s is an integer of 0 to 2, a is an integer equal to or less than (5+2s−b), and p is 0 or 1, in formula (4), C is a single bond or a $C_1$-$C_{10}$ alkylene group which may contain an ethereal oxygen atom at an intermediate of its chain, $R^{012}$ is hydrogen, fluorine, methyl or trifluoromethyl, $R^{014}$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group, W is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group, Rx and Ry are each independently hydrogen, a $C_1$-$C_{15}$ alkyl group which may be substituted with hydroxy or alkoxy, or an optionally substituted monovalent aromatic group, Rx and Ry may bond together to form a ring with the carbon atom to which they are attached, excluding that Rx and Ry are hydrogen at the same time, i is an integer of 1 to 3, h is an integer of 0 to 2, g is an integer equal to or less than (5+2h−i), and r is 0 or 1.

10. The resist composition of claim 9 wherein the resin (B) further comprises recurring units of at least one type selected from units having the formulae (a1), (a2), and (a3):

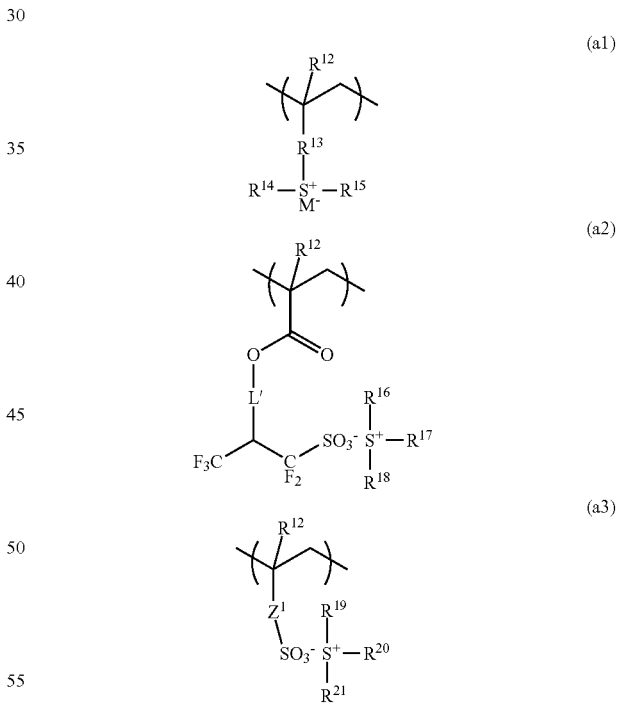

wherein $R^{12}$ is each independently hydrogen or methyl, $R^{13}$ is a single bond, phenylene group, —O—$R^{22}$—, or —C(=O)—$Z^2$—$R^{22}$—, $Z^2$ is oxygen or NH, $R^{22}$ is a straight, branched or cyclic $C_1$-$C_6$ alkylene, alkenylene or phenylene group which may contain a carbonyl (—CO—), ester (—COO—), ether (—O—) or hydroxyl moiety, L' is a single bond or —$Z^3$—C(=O)—O—, $Z^3$ is a straight, branched or cyclic $C_1$-$C_{20}$ divalent hydrocarbon group which may be substituted with a heteroatom, $Z^1$ is a single bond, methylene, ethylene, phenylene, fluorinated phenylene, —O—R$^{23}$—, or —C(=O)—Z$^4$—R$^{23}$—, Z$^4$ is oxygen or NH, R$^{23}$ is a straight, branched or cyclic C$_1$-C$_6$ alkylene, alkenylene or phenylene group which may contain a carbonyl, ester, ether or hydroxyl moiety, M$^-$ is a non-nucleophilic counter ion, R$^{14}$, R$^{15}$, R$^{16}$, R$^{17}$, R$^{18}$, R$^{19}$, R$^{20}$, and R$^{21}$ are each independently a straight C$_1$-C$_{20}$, branched or cyclic C$_3$-C$_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene, or R$^{14}$ and R$^{15}$ may bond together to form a ring with the sulfur atom, or any two or more of R$^{16}$, R$^{17}$ and R$^{18}$ or any two or more of R$^{19}$, R$^{20}$ and R$^{21}$ may bond together to form a ring with the sulfur atom.

11. The resist composition of claim 10, further comprising a polymer free of the recurring units having formulae (a1), (a2), and (a3).

12. The resist composition of claim 2 wherein the resin (B) comprises recurring units having the formulae (4-1), (3-1), and (a2):

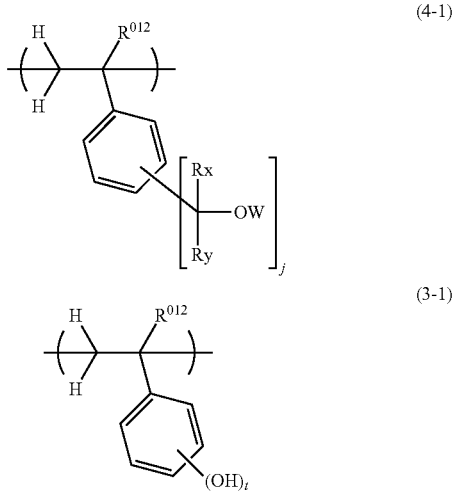

(4-1)

(3-1)

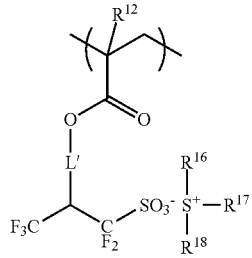

(a2)

wherein R$^{012}$ is hydrogen, fluorine, methyl or trifluoromethyl, W is hydrogen, a straight, branched or cyclic C$_1$-C$_{10}$ monovalent aliphatic hydrocarbon group which may contain an ethereal oxygen atom, carbonyl moiety or carbonyloxy moiety at an intermediate of its chain, or an optionally substituted monovalent aromatic group, Rx and Ry are each independently hydrogen or a C$_1$-C$_{15}$ alkyl group which may be substituted with hydroxy or alkoxy, Rx and Ry may bond together to form a ring with the carbon atom to which they are attached, excluding that Rx and Ry are hydrogen at the same time, R$^{12}$ is hydrogen or methyl, L' is a single bond or —Z$^3$—C(=O)—O—, Z$^3$ is a straight, branched or cyclic C$_1$-C$_{20}$ divalent hydrocarbon group which may be substituted with a heteroatom, R$^{16}$, R$^{17}$ and R$^{18}$ are each independently a straight C$_1$-C$_{20}$, branched or cyclic C$_3$-C$_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene, or any two or more of R$^{16}$, R$^{17}$ and R$^{18}$ may bond together to form a ring with the sulfur atom, j is an integer of 1 to 3, and t is an integer of 1 to 3.

13. The resist composition of claim 9, which is free of a crosslinker.

* * * * *